(12) United States Patent
Kumekawa

(10) Patent No.: US 7,083,706 B2
(45) Date of Patent: Aug. 1, 2006

(54) SUBSTRATE PROCESSING APPARATUS

(75) Inventor: Masayuki Kumekawa, Tokyo (JP)

(73) Assignee: Ebara Corporation, Tokyo (JP)

( * ) Notice: Subject to any disclaimer, the term of this patent is extended or adjusted under 35 U.S.C. 154(b) by 576 days.

(21) Appl. No.: 10/203,832

(22) PCT Filed: Jan. 16, 2002

(86) PCT No.: PCT/JP02/00235

§ 371 (c)(1),
(2), (4) Date: Oct. 11, 2002

(87) PCT Pub. No.: WO02/058114

PCT Pub. Date: Jul. 25, 2002

(65) Prior Publication Data
US 2003/0089608 A1    May 15, 2003

(30) Foreign Application Priority Data
Jan. 17, 2001  (JP) .............................. 2001-009537

(51) Int. Cl.
*C25D 17/00*   (2006.01)
(52) U.S. Cl. ........................................ 204/198; 204/267
(58) Field of Classification Search ................ 205/917, 205/705; 204/214, 232, 267, 269, 275.1, 204/198, 252, 253
See application file for complete search history.

(56) References Cited

U.S. PATENT DOCUMENTS

| | | | |
|---|---|---|---|
| 5,024,746 A | 6/1991 | Stierman et al. | |
| 5,092,975 A | 3/1992 | Yamamura et al. | |
| 5,370,741 A | 12/1994 | Bergman | |
| 6,077,412 A | 6/2000 | Ting et al. | |
| 6,258,220 B1 * | 7/2001 | Dordi et al. | 204/198 |
| 6,309,520 B1 | 10/2001 | Woodruff et al. | 204/242 |
| 6,391,166 B1 * | 5/2002 | Wang | 204/224 R |

FOREIGN PATENT DOCUMENTS

| | | |
|---|---|---|
| WO | 00/32835 | 6/2000 |
| WO | 01/45144 | 6/2001 |

\* cited by examiner

*Primary Examiner*—Nam Nguyen
*Assistant Examiner*—Luan V. Van
(74) *Attorney, Agent, or Firm*—Wenderoth, Lind & Ponack, L.L.P.

(57) ABSTRACT

A substrate processing apparatus comprises a plating section having a plating bath for holding a plating liquid therein, and a head assembly for holding a substrate and immersing the substrate in the plating liquid in the plating bath. A plated film is formed on a surface of the substrate in the plating liquid. The substrate processing apparatus further comprises a cleaning section for cleaning a peripheral edge of the plated substrate and a substrate contact portion held in contact with the substrate, and a drive mechanism for moving the head assembly between the plating section and the cleaning section.

20 Claims, 35 Drawing Sheets

F I G. 22
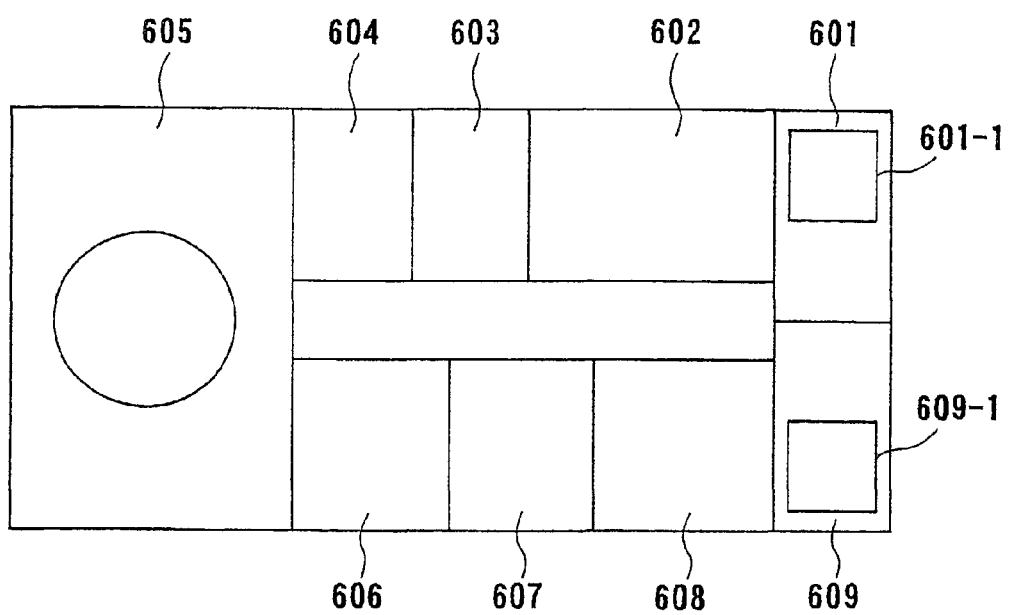

F I G. 34
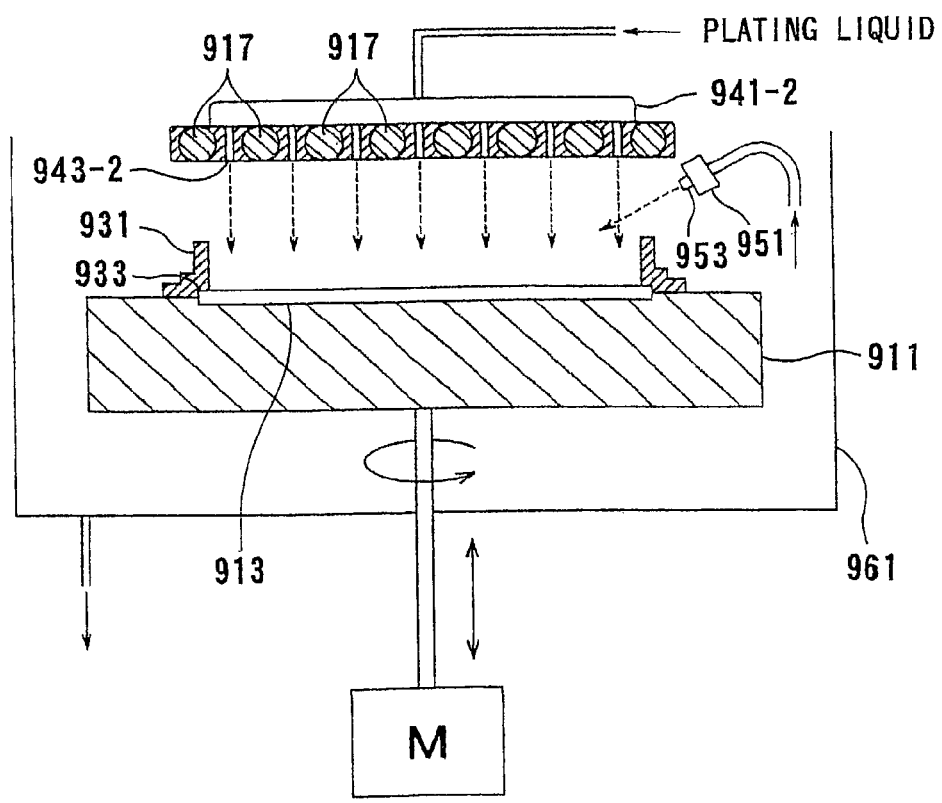

SUBSTRATE PROCESSING APPARATUS

TECHNICAL FIELD

The present invention relates to a substrate processing apparatus for processing a substrate, and more particularly to a substrate processing apparatus for filling a metal such as copper or the like in interconnection recesses defined in a semiconductor substrate.

BACKGROUND ART

Recently, in order to fill minute interconnection trenches or via holes defined in a surface of a substrate, it has been customary to use a substrate processing apparatus (plating apparatus) for plating a substrate such as a semiconductor substrate with a metal such as copper, which has a smaller electric specific resistance than aluminum or aluminum-based materials, to form embedded interconnections in the trenches or via holes.

FIG. 1 is a schematic view showing a conventional arrangement of a facedown plating apparatus. As shown in FIG. 1, the conventional facedown plating apparatus comprises an upwardly opened cylindrical plating bath 312 for holding a plating liquid 310 therein, and a head 314 for detachably holding a substrate W such as a semiconductor substrate thereon in such a state that a surface of the substrate W faces downwardly. The head 314 is positioned so as to cover an upper opened end of the plating bath 312. In the plating bath 312, a flat anode plate 316 is horizontally disposed and immersed in the plating liquid 310. The anode plate 316 serves as an anode electrode. The substrate W held by the head 314 has a peripheral edge connected to a cathode electrode via an electrode contact provided on the head 314. The anode plate 316 is made of a porous material or a mesh-like material.

A center of a bottom in the plating bath 312 is connected to a plating liquid ejection pipe 318 for forming an upward flow of the plating liquid in the plating bath 312. An upper portion of the plating bath 312 is surrounded by a plating liquid reservoir 320 for receiving plating liquid that has overflowed the plating bath 312. The plating liquid ejection pipe 318 is connected to a plating liquid supply pipe 328 extending from a plating liquid regulating tank 322. The plating liquid supply pipe 328 has a pump 324 and a filter 326 connected thereto. The plating liquid regulating tank 322 is connected to a plating liquid return pipe 330 extending from the plating liquid reservoir 320.

The conventional plating apparatus operates as follows: The substrate W is held by the head 314 in such a state that the surface of the substrate W faces downwardly, and introduced downwardly into the plating bath 312 to be immersed in the plating liquid 310 in the plating bath 312. While a certain voltage is being applied between the anode plate 316 (anode electrode) and the substrate W (cathode electrode), the plating liquid in the plating liquid regulating tank 322 is ejected upwardly from the bottom of the plating bath 312 via the plating liquid ejection pipe 318 and applied as a jet vertically to a lower surface (a surface to be plated) of the substrate W. In this manner, a plated film is formed on the lower surface of the substrate W while a current is flowing between the anode plate 316 and the substrate W. The plating liquid 310 that has overflowed the plating bath 312 at this time is recovered by the plating liquid reservoir 320 and returned to the plating liquid regulating tank 322 via the plating liquid return pipe 330.

As described above, the substrate is immersed in the plating liquid in the plating bath. In a case where a peripheral edge of the substrate is connected to a cathode electrode provided on the head in a dry state, it is desirable that an electrode contact connected to the peripheral edge of the substrate be completely sealed from the plating liquid. Therefore, the electrode contact is sealed from the plating liquid by a sealing member. However, when a plating process is continuously performed, a residue of the plating liquid tends to be deposited and crystallized on the sealing member. This crystallized residue of the plating liquid on the sealing member is liable to reduce a sealing capability of the sealing member, resulting in deteriorated electric conduction between the substrate and the cathode electrode. Furthermore, immediately after the substrate has been plated, an oxide film is likely to be formed on the surface of the substrate by remaining plating liquid thereon. Therefore, after the substrate has been plated, the substrate and the sealing member need to be immediately cleaned with pure water or the like to replace the remaining plating liquid with pure water or the like.

In a conventional jet plating apparatus, a substrate to be plated is held horizontally and lowered into a plating bath to bring a lower surface of the substrate into contact with a surface (overflow surface) of plating liquid, and then further lowered until an entire lower surface of the substrate is immersed in the plating liquid. Therefore, when the substrate is immersed in the plating liquid, air bubbles tend to remain on the lower surface of the substrate because of downwardly overhung portions of components including an electrode contact and a sealing member, i.e., a substrate contact portion. These remaining air bubbles prevent a plated film from normally being formed on the surface of the substrate, and tend to produce defects such as voids in the plated film.

SUMMARY OF THE INVENTION

The present invention has been made in view of the above drawbacks. It is therefore an object of the present invention to provide a substrate processing apparatus which can efficiently clean a substrate and a substrate contact portion held in contact with the substrate to remove a plating liquid therefrom, and can improve a tendency for the substrate to contact plating liquid to perform a high-quality process.

To achieve the above object, according to an aspect of the present invention, there is provided a substrate processing apparatus for processing a substrate, comprising: a head assembly for holding a substrate; and a plurality of substrate processing sections for performing respective processes on the substrate while held by the head assembly; wherein the head assembly is movable between the substrate processing sections while holding the substrate, and the respective processes on the substrate are successively performed in respective substrate processing sections.

Preferably, one of the substrate processing sections comprises a plating section for plating the substrate, and another one comprises a cleaning section for cleaning the substrate. Specifically, a substrate processing apparatus (plating apparatus) comprises: a plating section having a plating bath for holding a plating liquid therein; a head assembly for holding a substrate and immersing the substrate in the plating liquid in the plating bath to form a plated film on a surface of the substrate; a cleaning section for cleaning a peripheral edge of this plated substrate and a substrate contact portion held in contact with the substrate; and a drive mechanism for moving the head assembly between the plating section and the cleaning section.

With this arrangement, since it is possible to clean a lower surface of the substrate and the substrate contact portion in such a state that the substrate is held by the head assembly, plating liquid attached to the substrate and the substrate contact portion is effectively prevented from being crystallized. Therefore, durability of the substrate contact portion is increased, and a high-quality plating process can be performed while high electric conductivity is maintained.

The cleaning section may comprise an air blower for applying a clean gas, e.g., nitrogen, to dry a cleaned substrate. Alternatively, the cleaning section may rotate a substrate at a high speed to dry the substrate. With this arrangement, not only a cleaning process but also a drying process can be performed in one unit. Therefore, the substrate processing apparatus has a compact structure. Moreover, the substrate contact portion can be kept dry at all times.

The head assembly may comprise a tilting mechanism for tiltably supporting a substrate. With this arrangement, a surface, to be plated, of the substrate can be brought into contact with an overflow surface of the plating liquid in such a state that the substrate is tilted with respect to a horizontal plane. Therefore, a tendency for the substrate to contact the plating liquid can be improved, so that the plating liquid can smoothly be brought into contact with the substrate and air bubbles can be prevented from remaining on the surface, to be plated, of the substrate. Moreover, since the substrate can be tilted through a large angle while a rotational shaft of the head assembly is kept vertical, the substrate can easily be controlled for its tilting action and can be tilted under a reduced load.

The sections may be housed in a single cover. A mist tends to be produced around the plating bath, and a highly corrosive environment is developed around the plating bath. The cover is effective to prevent the mist from being scattered. If the drive mechanism is disposed outside of the cover, then particles produced by the drive mechanism are prevented from entering the plating section and other sections, and a mist produced during a plating process is prevented from adversely affecting the drive mechanism, so that durability of the drive mechanism is increased. Furthermore, if the plating section and the cleaning section are separated from each other, then a cleaning liquid is not mixed with the plating liquid in the plating bath. Therefore, a concentration of the plating liquid is not changed by a mixed cleaning liquid. Inasmuch as the plating section and the cleaning section can be incorporated with each other, an overall substrate processing apparatus has a compact structure.

The above and other objects, features, and advantages of the present invention will become apparent from the following description when taken in conjunction with the accompanying drawings which illustrate preferred embodiments of the present invention by way of example.

BRIEF DESCRIPTION OF DRAWINGS

FIG. 22 is a plan view of another example of a substrate plating apparatus;

FIG. 34 is a view showing a schematic constitution of another example of an electroless plating apparatus;

DETAILED DESCRIPTION OF THE PREFERRED EMBODIMENTS

Figure 1:
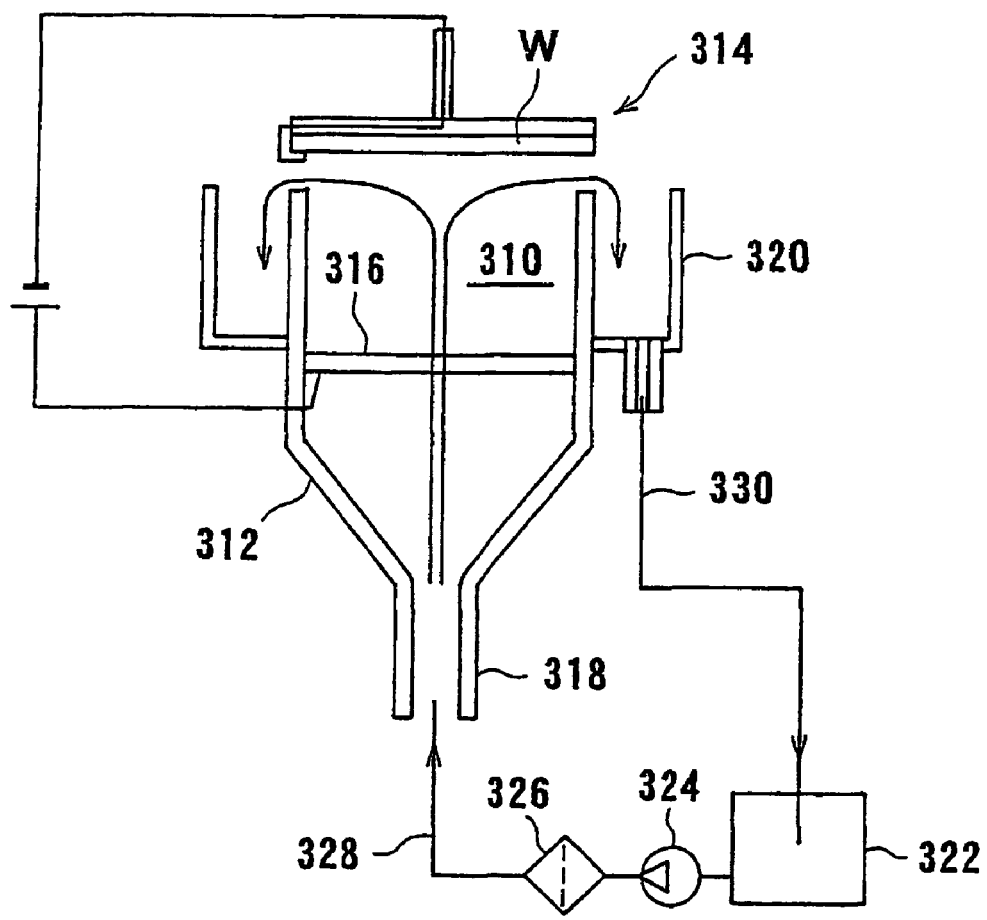
FIG. 1 is a vertical cross-sectional view showing a conventional plating apparatus.
Figure 2:
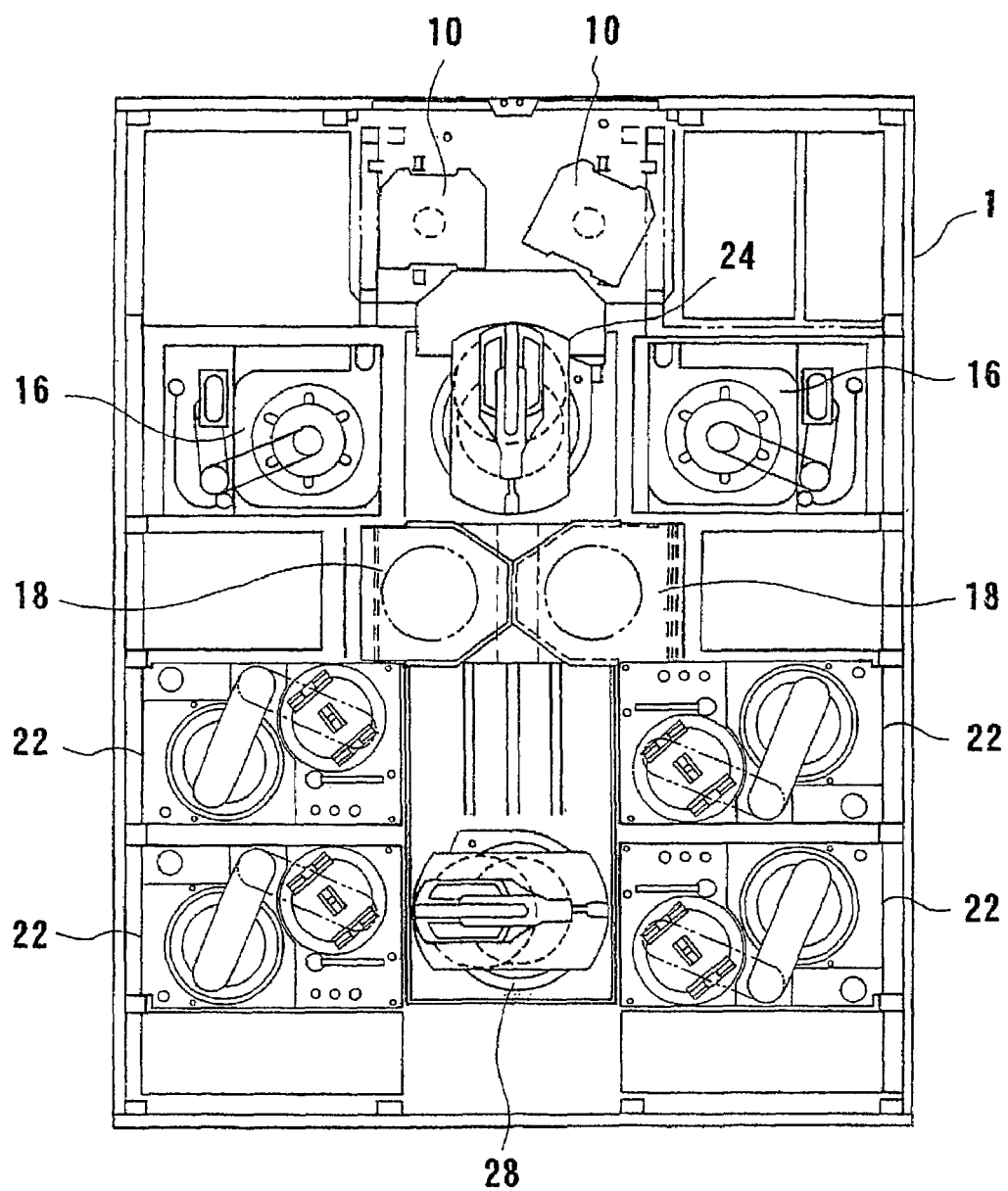
FIG. 2 is a plan view showing a substrate processing apparatus according to an embodiment of the present invention.

A substrate processing apparatus according to an embodiment of the present invention will be described below with reference to FIGS. 2 through 16. FIG. 2 is a plan view showing a substrate processing apparatus according to an embodiment of the present invention.

A substrate processing apparatus according to an embodiment of the present invention serves as a plating apparatus for plating a surface of a substrate with a metal such as copper or the like. As shown in FIG. 2, the substrate processing apparatus is placed in a rectangular housing 1, in which a plurality of substrates such as semiconductor substrates are successively plated. The substrate processing apparatus (plating apparatus) comprises a pair of loading/unloading units 10 each for storing a plurality of substrates, a pair of bevel etching/chemical cleaning/drying units 16 for cleaning a plated substrate with a chemical liquid, a pair of substrate stages 18 for holding a substrate thereon and inverting the substrate, and four plating units 22 for plating a substrate and cleaning this plated substrate. The housing 1 has therein a first transfer device 24 for transferring a substrate between the loading/unloading units 10, the bevel etching/chemical cleaning/drying units 16, and the substrate stages 18, and a second transfer device 28 for transferring a substrate between the substrate stages 18 and the plating units 22.

Substrates are accommodated within a cassette in such a state that a face side (a surface on which semiconductor devices are formed, or a surface to be processed) of each of the substrate faces upwardly. The cassette accommodating the substrates is placed on one of the loading/unloading units 10. The first transfer device 24 removes a substrate from the cassette, transfers it to one of the substrate stages 18, and places it on this substrate stage 18. On the substrate stage 18, the substrate is turned upside down, i.e., inverted so that its face side faces downwardly, by an inverter provided in the substrate stage 18. Then, this inverted substrate is transferred from the substrate stage 18 to the second transfer device 28. The second transfer device 28 transfers the substrate to a head assembly (described later on) of one of the plating units 22, in which a plating process of the substrate is performed.

Figure 3:
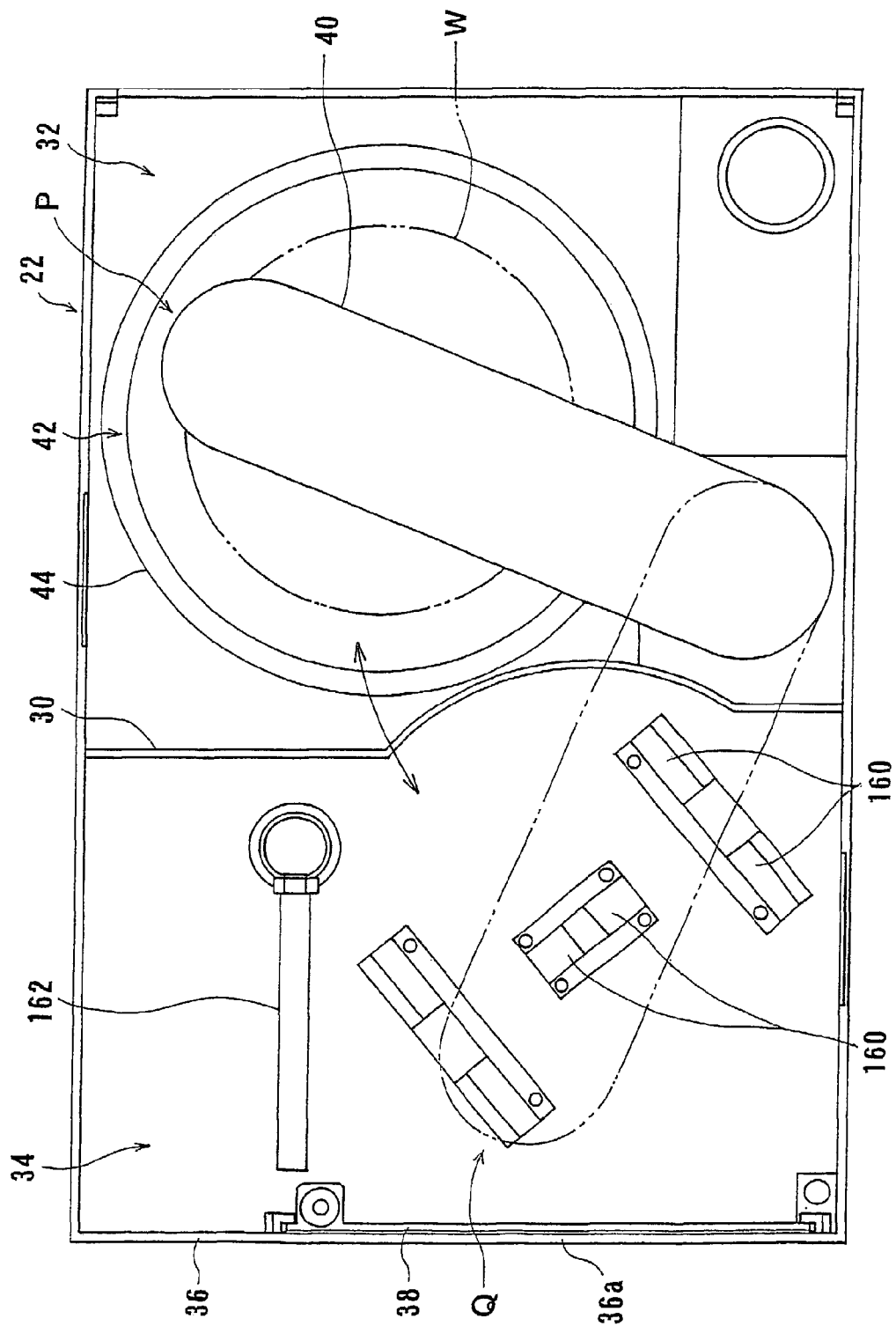
FIG. 3 is a plan view showing a plating unit in the substrate processing apparatus shown in FIG. 2.

The plating units 22 of the plating apparatus according to the present embodiment will be described below. Since all four plating units 22 are identical in structure, only one of them will be described in detail below. FIG. 3 is a plan view showing the plating unit 22 according to the present embodiment, FIG. 4 is a front view of the plating unit 22 shown in FIG. 3, and FIG. 5 is a side view of the plating unit 22 shown in FIG. 3.

Figure 4:
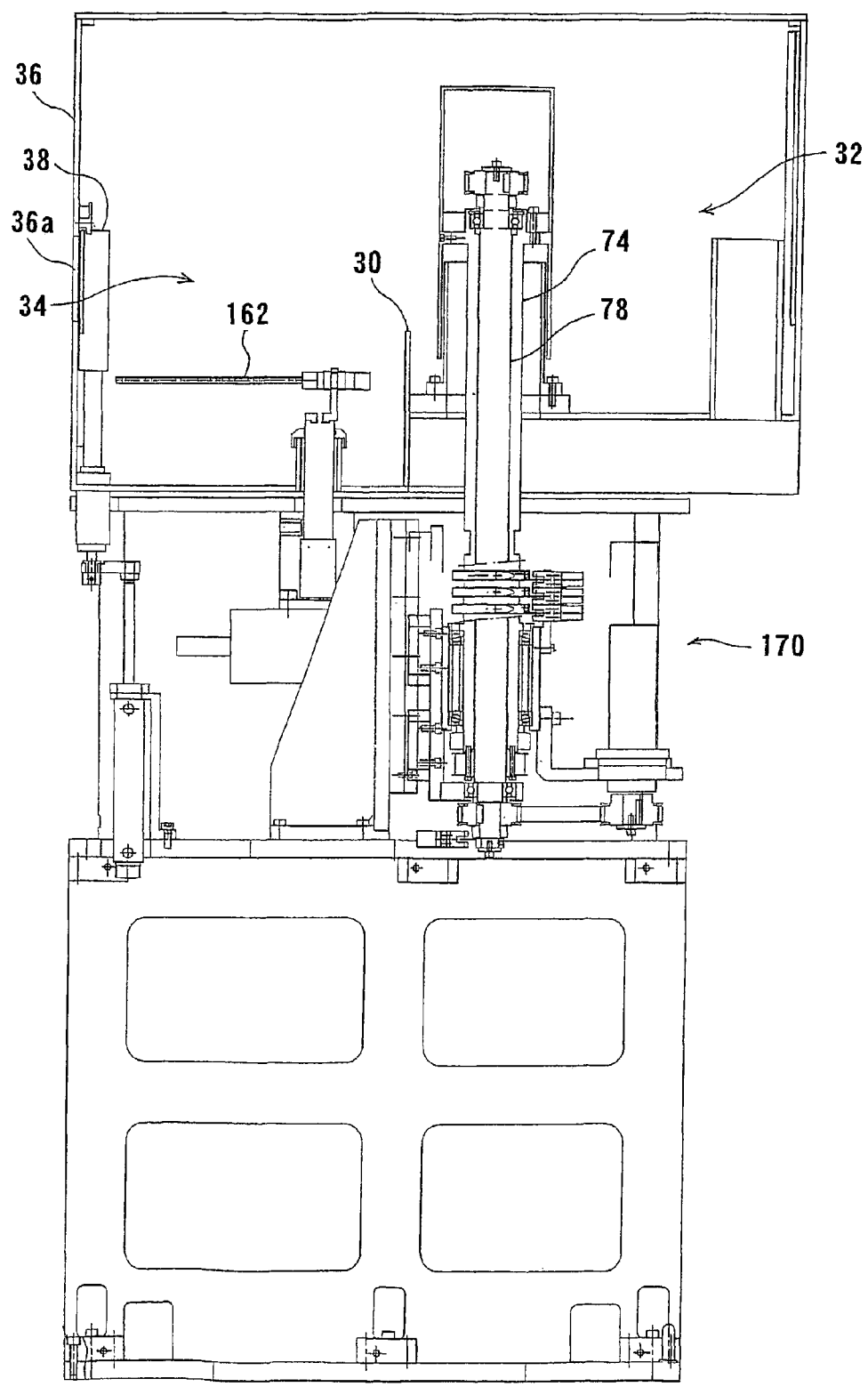
FIG. 4 is a front view of the plating unit shown in FIG. 3.
Figure 5:
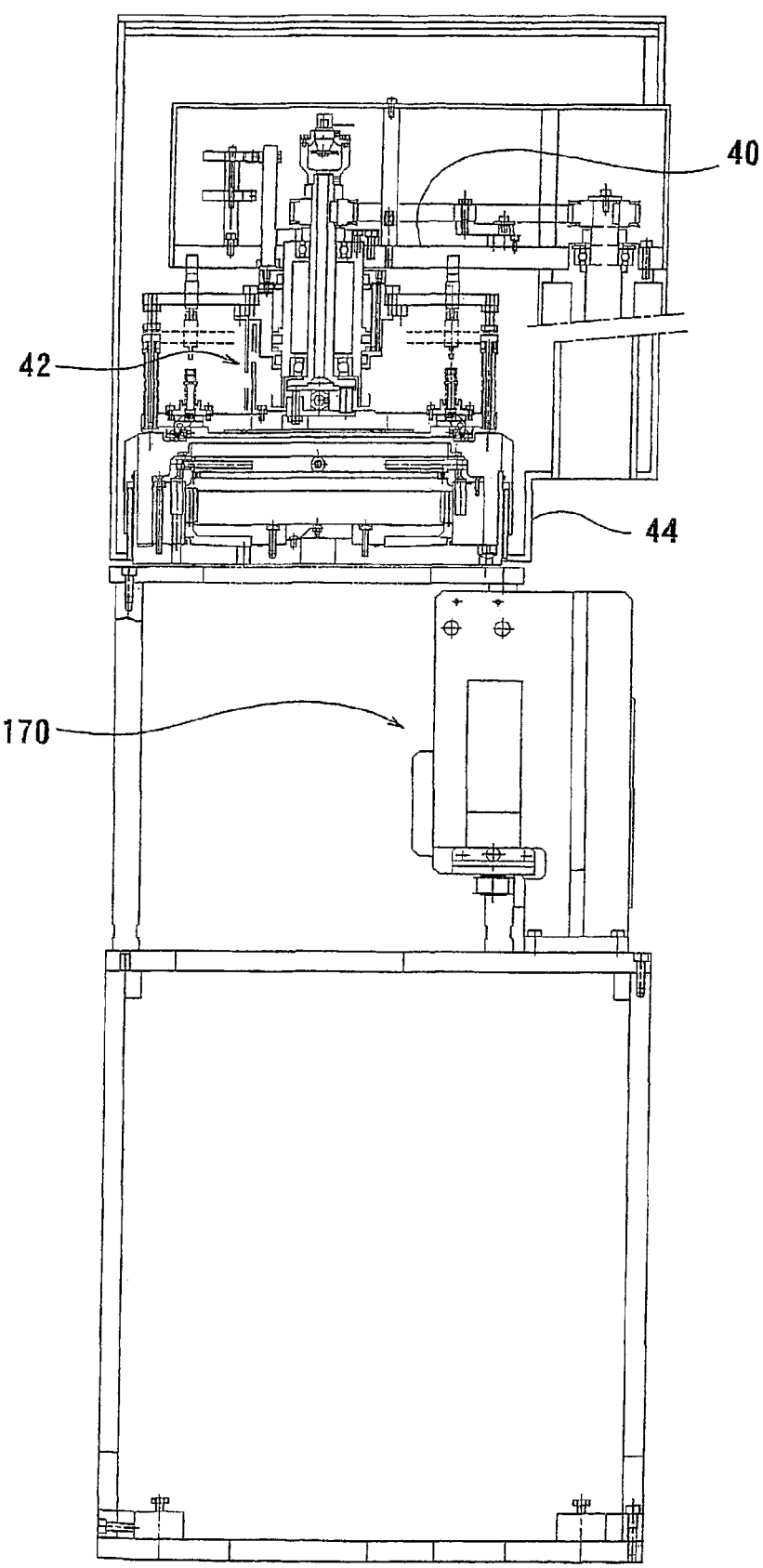
FIG. 5 is a side view of the plating unit shown in FIG. 3.

As shown in FIGS. 3 through 5, the plating unit 22 is divided by a partition wall 30 into two substrate processing sections, i.e., a plating section 32 for plating a substrate W and a cleaning section 34 for cleaning a plated substrate W. The cleaning section 34 has functions of receiving and transferring a substrate W, and pre-treating a substrate W, and cleaning and drying a plated substrate W.

The plating section 32 and the cleaning section 34 are covered with a cover 36. The cover 36 has an opening 36a defined in a side panel thereof near the cleaning section 34, and a shutter 38 capable of opening and closing the opening 36a is disposed in the opening 36a. When the shutter 38 closes the opening 36a to seal an interior of the plating unit 22, a mist generated in the plating unit 22 during a plating process is prevented from being scattered out of the plating unit 22.

The plating unit 22 has a swing arm 40 disposed therein for swinging movement about its pivoted end between the plating section 32 and the cleaning section 34. The swing arm 40 has a free end connected to a head assembly 42 suspended therefrom, which holds a substrate W. When the swing arm 40 is angularly moved about its pivoted end, the head assembly 42 is angularly moved between a plating position P in the plating section 32 and a cleaning position Q in the cleaning section 34.

The plating unit 22 may alternatively have a linearly movable mechanism, rather than the swing arm 40, for translating the head assembly 42 between the plating position P in the plating section 32 and the cleaning position Q in the cleaning section 34.

Figure 6:
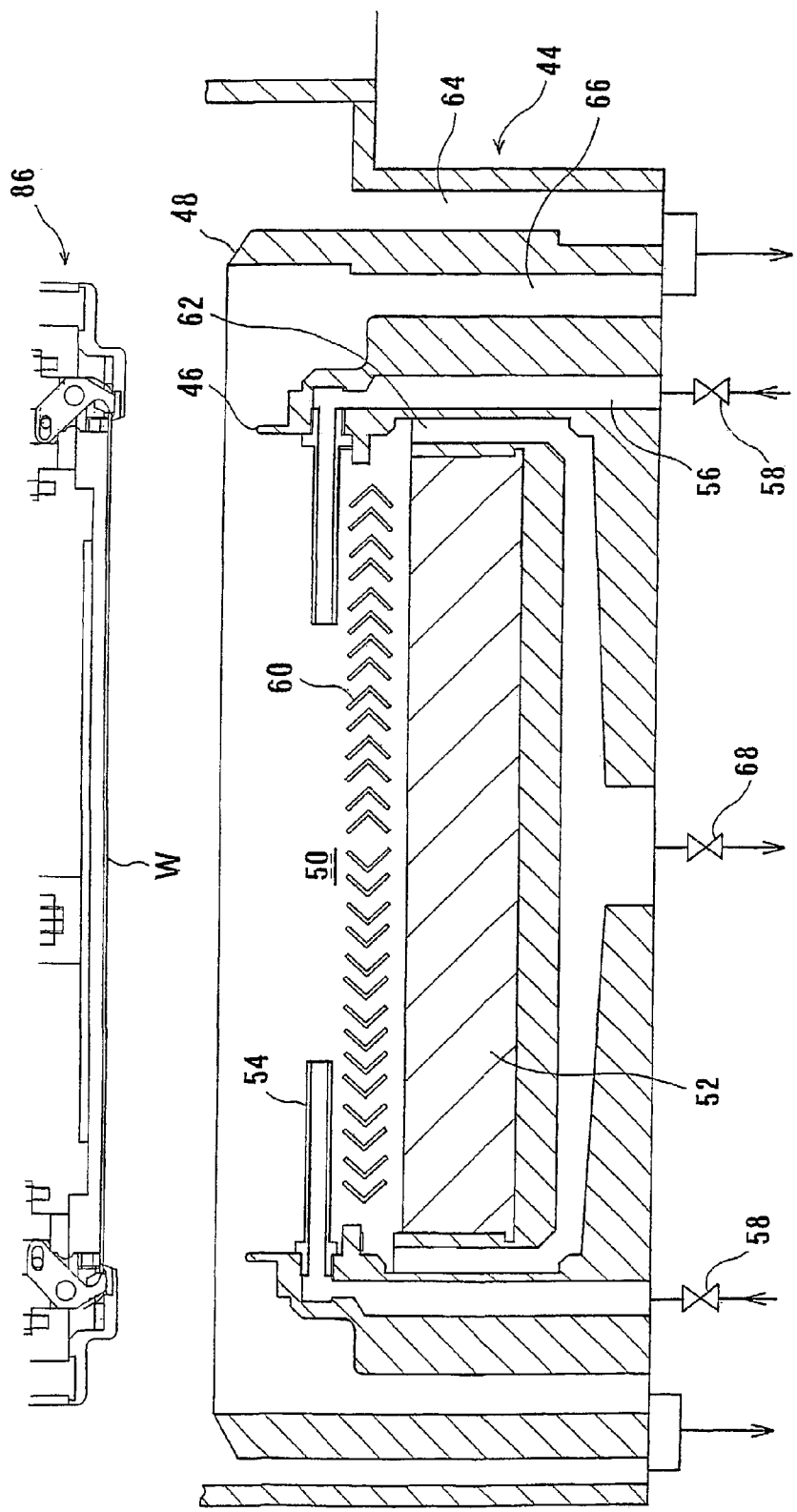
FIG. 6 is a vertical cross-sectional view showing a plating section in the plating unit shown in FIG. 3.

FIG. 6 is a vertical cross-sectional view showing a main part of the plating section 32 in the plating unit 22. As shown in FIG. 6, the plating section 32 has a plating bath 44 in a substantially cylindrical form for holding a plating liquid therein, and a cylindrical inner weir member 46 and a cylindrical outer weir member 48 which are disposed within the plating bath 44. The inner weir member 46 defines an upwardly opened plating chamber 50 in the plating bath 44, and an anode 52 is disposed at a bottom of the plating chamber 50.

A plurality of plating liquid ejection nozzles 54 horizontally projecting toward a center of the plating chamber 50 are provided on an inner circumferential wall of the inner weir member 46 at equal intervals along a circumferential direction. The plating liquid ejection nozzles 54 are communicated with plating liquid supply passages 56 extending vertically through an interior of the inner weir member 46. A plating liquid is supplied to the plating liquid ejection nozzles 54 from a plating liquid regulating tank (not shown) via the plating liquid supply passages 56. Control valves 58 for supplying the plating liquid at a constant rate are disposed between the plating liquid supply passages 56 and the plating liquid regulating tank.

First plating liquid discharge ports 62 for withdrawing plating liquid in the plating chamber 50 are defined in a peripheral portion of the bottom of the plating chamber 50. Second plating liquid discharge ports 64 for discharging plating liquid overflowing the outer weir member 48 are defined radially around the outer weir member 48. Third plating liquid discharge ports 66 for discharging plating liquid overflowing the inner weir member 46 are defined between the inner weir member 46 and the outer weir member 48.

Each of the first plating liquid discharge ports 62 is connected to a reservoir (not shown). A flow controller 68 is disposed between the first plating liquid discharge ports 62 and the reservoir. Each of the second plating liquid discharge ports 64 and each of the third plating liquid discharge ports 66 are connected directly to the reservoir. The plating liquid fed into the reservoir is supplied to the plating liquid regulating tank from the reservoir by a pump. The plating liquid regulating tank has a temperature controller (not shown) for controlling a temperature of the plating liquid in the plating liquid regulating tank, and a plating liquid analyzing device (not shown) for extracting and analyzing a sample from the plating liquid in the plating liquid regulating tank.

In the present embodiment, baffle plates (stream regulating plates) 60 are disposed above the anode 52 in the plating chamber 50. The baffle plates 60 produce a downflow of plating liquid directed toward the anode 52, and this downflow of plating liquid is discharged from the first plating liquid discharge ports 62. The baffle plates 60 serve to prevent a jet of the plating liquid ejected from the plating liquid ejection nozzles 54 from directly flowing over a surface of the anode 52, for thereby preventing a black film formed on the surface of the anode 52 from being peeled away from the anode 52 by the jet of the plating liquid.

Figure 7:
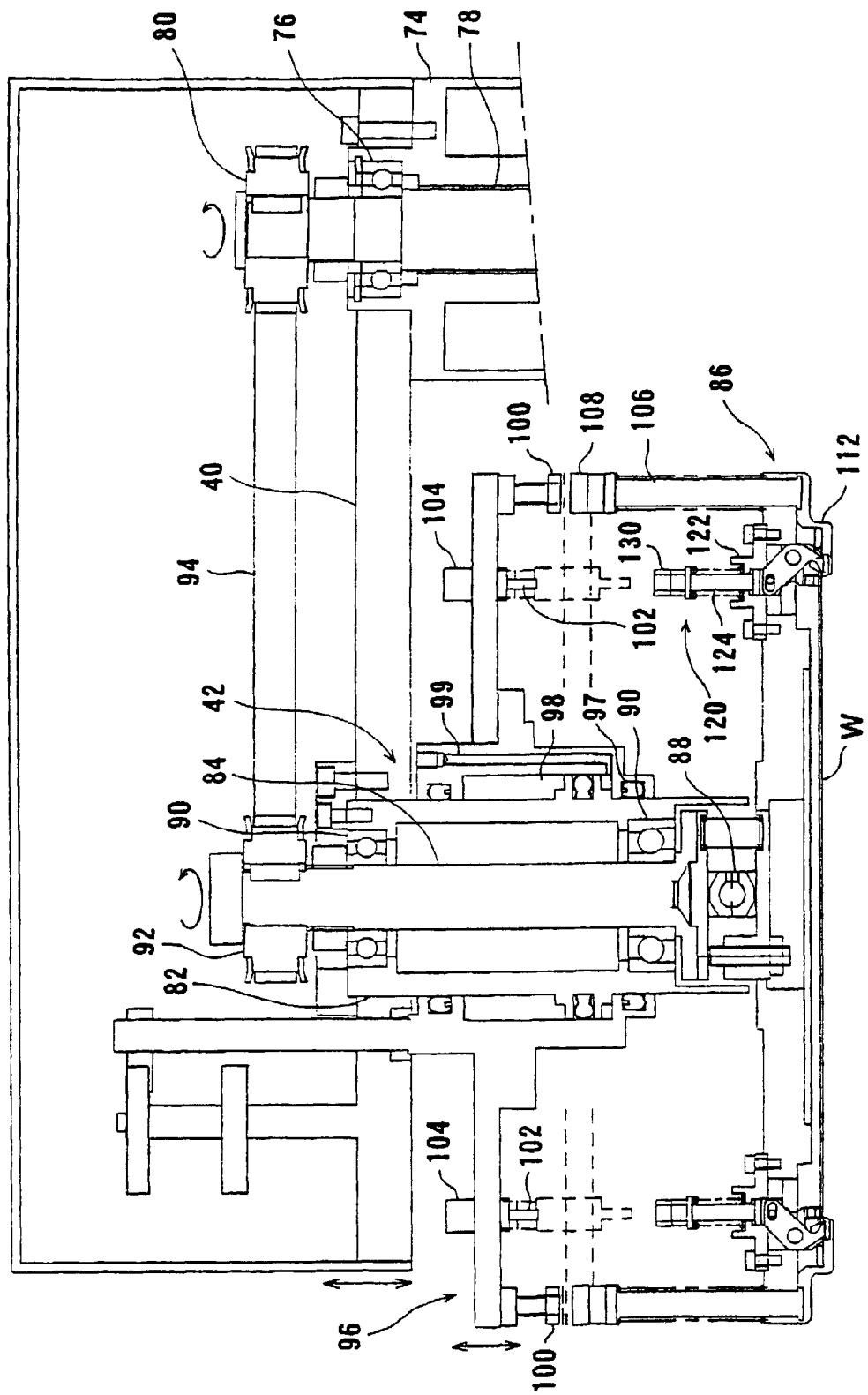
FIG. 7 is a vertical cross-sectional view showing a swing arm and a head assembly of the plating unit shown in FIG. 3.

FIG. 7 is a vertical cross-sectional view showing a main part of the swing arm 40 and the head assembly 42. As shown in FIG. 7, the swing arm 40 is fixed to an upper end of a rotatable hollow support post 74 so as to be horizontally moved upon rotation of the support post 74. A rotational shaft 78 rotatably supported by a bearing 76 is inserted through the support post 74 so as to be rotated relative to the support post 74. An upper rotational shaft pulley 80 is fixed to an upper end of the rotational shaft 78.

The head assembly 42 is fixedly mounted on the swing arm 40. As shown in FIG. 7, the head assembly 42 comprises an outer tube 82 fixed to the swing arm 40, a rotational shaft 84 extending vertically through the outer tube 82, a substrate holding arm assembly 86 for holding a substrate W on its lower surface, and a movable member 96 vertically movable relatively to the outer tube 82. The substrate holding arm assembly 86 is connected to a lower end of the rotational shaft 84 by a pin 88.

The rotational shaft 84 is rotatably supported on the outer tube 82 by bearings 90 so as to be rotated relative to the outer tube 82. A head assembly pulley 92 is fixed to an upper end of the rotational shaft 84. The head assembly pulley 92 is operatively connected to the upper rotational shaft pulley 80 via a timing belt 94. Therefore, when the rotational shaft 78 in the support post 74 is rotated about its own axis, the rotational shaft 84 is rotated together with the substrate holding arm assembly 86.

A hermetically sealed space 98 is defined between the movable member 96 and the outer tube 82 by a sealing member 97, and communicates with an air supply passage 99. When air is selectively supplied to and discharged from the hermetically sealed space 98 through the air supply passage 99, the movable member 96 is vertically moved relatively to the outer tube 82. The movable member 96 has a plurality of downwardly extending pressing rods 100 mounted on an outer peripheral edge thereof, and a plurality of air cylinders 104 for vertically moving respective pushers 102.

Figure 8:
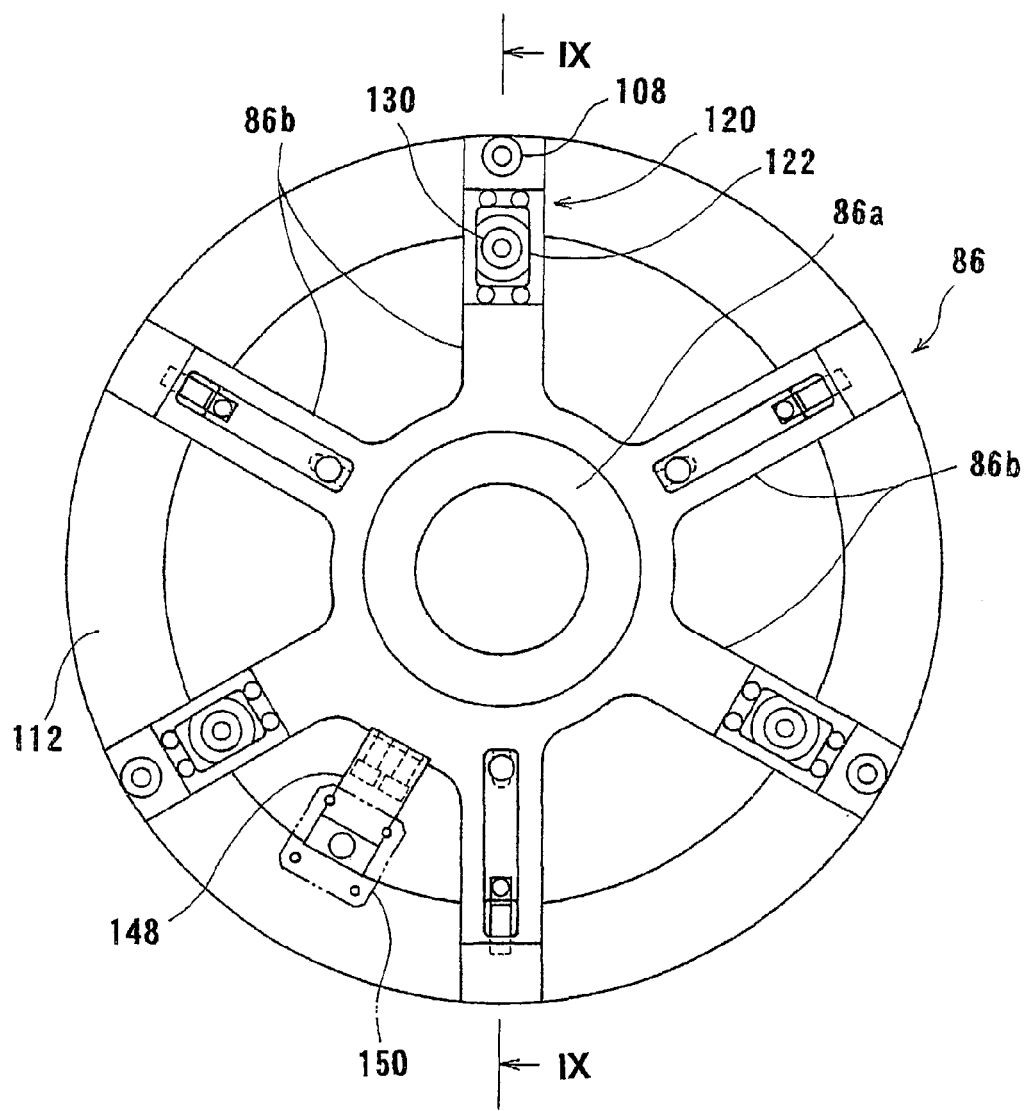
FIG. 8 is a plan view showing a substrate holding arm assembly of the plating unit shown in FIG. 3.
Figure 9:
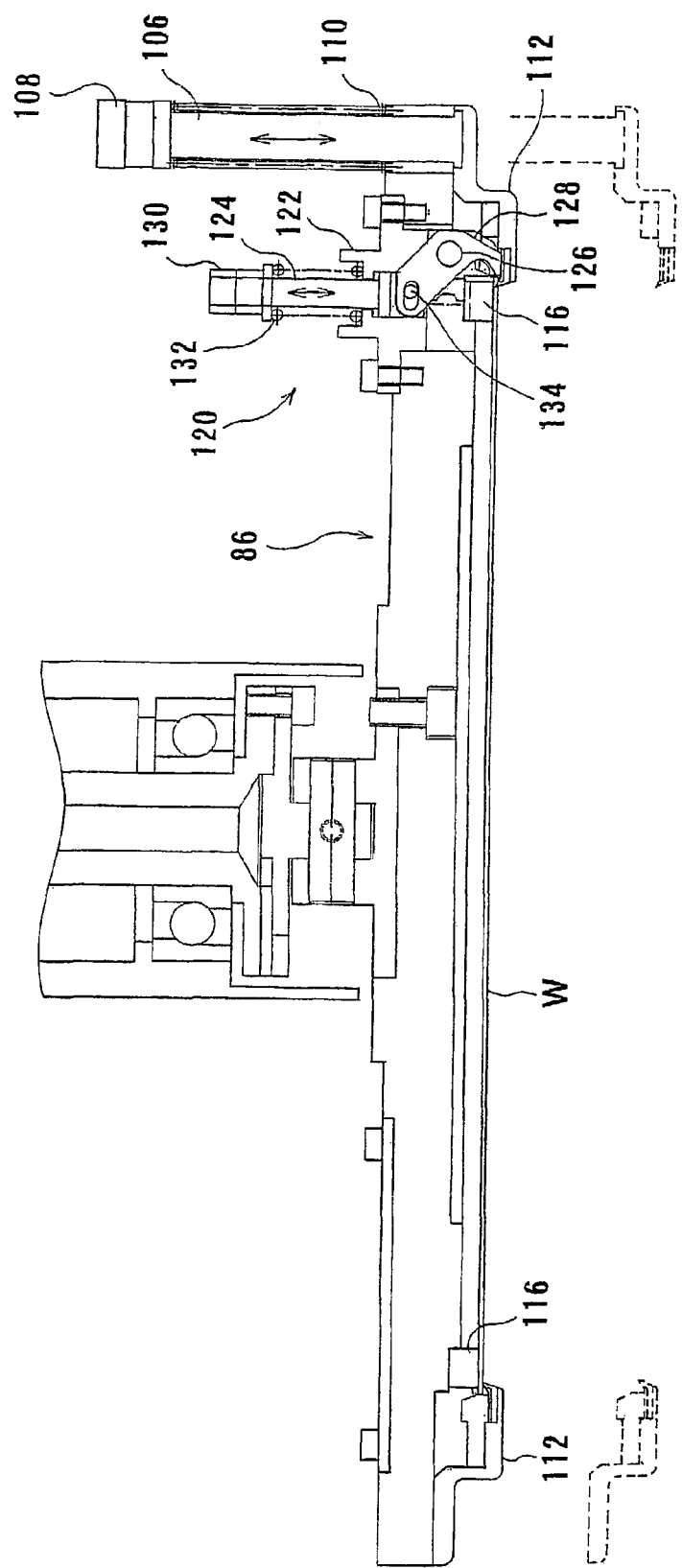
FIG. 9 is a cross-sectional view taken along line IX—IX in FIG. 8.

FIG. 8 is a plan view showing the substrate holding arm assembly 86, and FIG. 9 is a cross-sectional view taken along line IX—IX shown in FIG. 8. As shown in FIG. 8, the substrate holding arm assembly 86 comprises a centrally positioned base 86a and six arms 86b extending radially outwardly from the base 86a. Of the six arms 86b, three alternate arms support on their radially outer ends respective vertically movable rods 106 (see FIG. 9) extending vertically through an outer peripheral edge of the arms 86b. Nuts 108 are mounted respectively on upper ends of the vertically movable rods 106 in such a state that helical compression springs 110 are interposed between the nuts 108 and the arms 86b, respectively. A ring-shaped substrate contact portion 112 projecting radially inwardly is fixed to lower ends of the vertically movable rods 106. When the pressing rods 100 on the movable member 96 are brought into abutment with the nuts 108 on the upper ends of the vertically movable rods 106 and then lowered to move the vertically movable rods 106 downwardly against a bias of the helical compression springs 110, the substrate contact portion 112 is downwardly moved from the substrate holding arm assembly 86 as indicated by dotted lines in FIG. 9.

Figure 10:
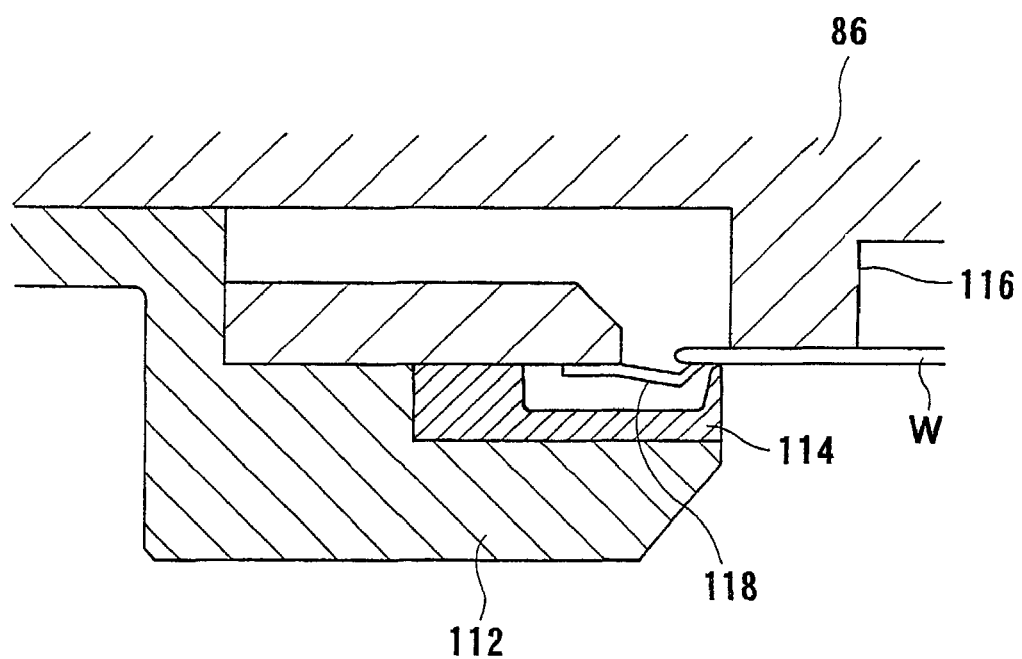
FIG. 10 is an enlarged cross-sectional view showing a substrate contact portion shown in FIG. 9.

FIG. 10 is an enlarged cross-sectional view showing the substrate contact portion 112. As shown in FIG. 10, a ring-shaped sealing member 114 is mounted on the substrate contact portion 112. The ring-shaped sealing member 114 extends radially inwardly and has an upwardly projecting tip on its radially inner end. The substrate holding arm assembly 86 has a presser 116 projecting downwardly near the upwardly projecting tip of the ring-shaped sealing member 114. The helical compression springs 110 are selected to have such spring properties that when the substrate contact portion 112 is lifted relatively to a substrate W which is held by chucking mechanisms, the sealing member 114 is pressed against a peripheral edge of the substrate W to reliably seal this pressed peripheral edge of the substrate W. A cathode electrode contact 118 connected to an electrode is disposed above the sealing member 114. The cathode electrode contact 118 is brought into electric contact with the substrate W when the sealing member 114 is pressed against the peripheral edge of the substrate W.

The three alternate arms 86b also have respective chucking mechanisms 120 spaced at equal angular intervals. As shown in FIG. 9, each of the chucking mechanisms 120 comprises a base 122 mounted on an upper surface of the arm 86b, a rod 124 vertically movably mounted on the base 122, and a claw 128 angularly movable about a pivot shaft 126. A nut 130 is mounted on an upper end of the rod 124, and a helical compression spring 132 is interposed between the nut 130 and the base 122.

As shown in FIG. 9, the claw 128 is connected to the rod 124 by a horizontally movable pin 134. Accordingly, when the rod 124 moves upwardly, the claw 128 is angularly moved radially inwardly about the pivot shaft 126, and when the rod 124 moves downwardly, the claw 128 is angularly moved radially outwardly about the pivot shaft 126. When the air cylinders 104 on the movable member 96 are actuated to press the pushers 102 against the nuts 130 for pushing the rods 124 downwardly, the rods 124 are moved downwardly against a bias of the helical compression springs 132 for thereby angularly moving the claws 128 radially outwardly about the pivot shafts 126. When actuation of the air cylinders 104 is stopped, the rods 124 are lifted under the bias of the helical compression springs 132 to angularly move the claws 128 radially inwardly about the pivot shafts 126. Thus, the peripheral edge of the substrate W can be gripped by the chucking mechanisms 120. Specifically, the peripheral edge of the substrate W is positioned and gripped by the three chucking mechanisms 120 (claws 128), so that the substrate W is held on a lower surface of the substrate holding arm assembly 86.

Figure 11:
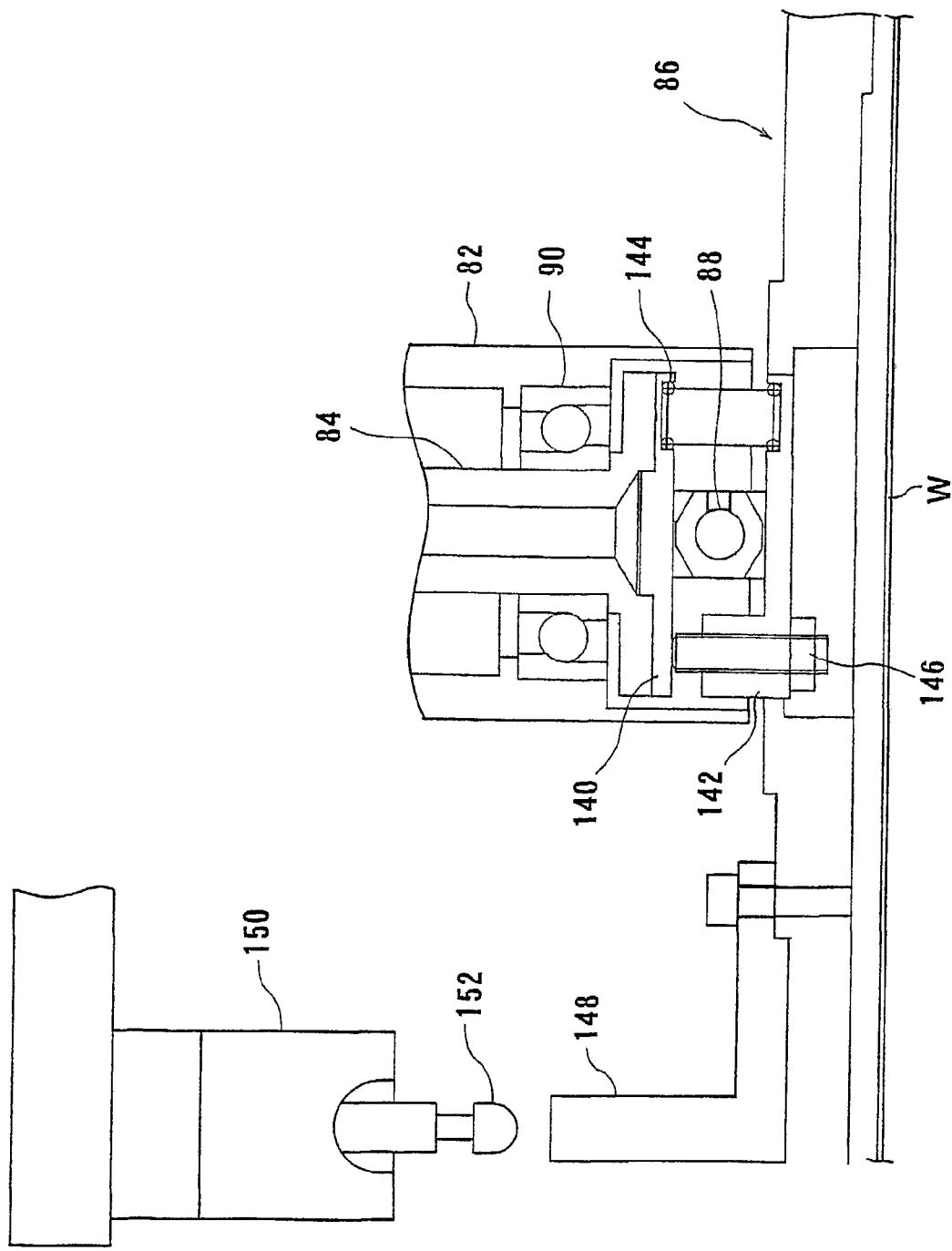
FIG. 11 is an enlarged cross-sectional view showing a region where a rotational shaft of the head assembly and the substrate holding arm assembly shown in FIG. 7 are connected to each other.

FIG. 11 is an enlarged cross-sectional view showing a region where the rotational shaft 84 of the head assembly 42 and the substrate holding arm assembly 86 shown in FIG. 7 are connected to each other. As shown in FIG. 11, a disk-shaped upper member 140 is attached to a lower end of the rotational shaft-84 of the head assembly 42, and a disk-shaped lower member 142 is attached to an upper surface of the substrate holding arm assembly 86. The upper and lower members 140, 142 are coupled to each other by a horizontal pin 88 to constitute a tilting mechanism for tiltably supporting the substrate holding arm assembly 86 by tilting the lower member 142 and the substrate holding arm assembly 86 about the pin 88. A helical compression spring 144 is interposed between peripheral sides of the upper and lower members 140, 142 for normally biasing the peripheral sides apart from each other, and a stopper bolt 146 is fixed to a peripheral side of the lower member 142 at a position diametrically opposite to the helical compression spring 144. The stopper bolt 146 has an upper end which is brought into abutment against a lower surface of the upper member 140. When the upper end of the stopper bolt 146 is brought into abutment against the lower surface of the upper member 140, the substrate holding arm assembly 86 is horizontally positioned. An L-shaped hook 148 is mounted on the substrate holding arm assembly 86.

As shown in FIGS. 8 and 11, an air cylinder 150 is mounted on the outer tube 82 of the head assembly 42, and a pusher 152 is connected to the air cylinder 150 so as to be vertically moved upon actuation of the air cylinder 150. When the air cylinder 150 is actuated, the pusher 152 is lowered into abutment against an upper end of the hook 148 to thus lower the hook 148. Accordingly, the hook 148 and the substrate holding arm assembly 86 are tilted downwardly about the pin 88 against a bias of the helical compression spring 144. When actuation of the air cylinder 150 is stopped, the hook 148 and the substrate holding arm assembly 86 are tilted back under the bias of the helical compression spring 144, and finally the upper end of the stopper bolt 146 is brought into abutment with the lower surface of the upper member 140 so that the substrate holding arm assembly 86 is horizontally positioned.

Figure 12:
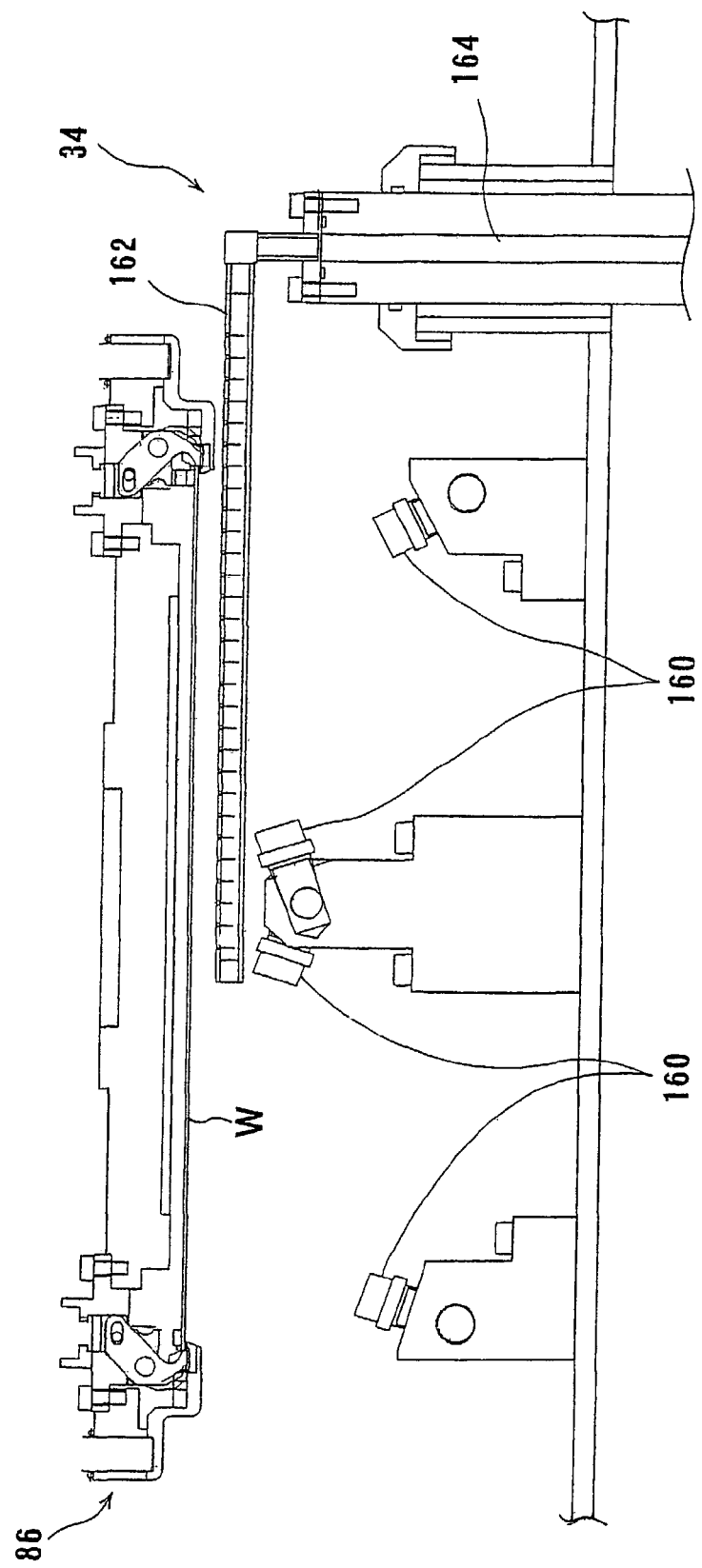
FIG. 12 is a front view showing a cleaning section in the plating unit shown in FIG. 3.

Next, the cleaning section 34 of the plating unit 22 will be described below. FIG. 12 is a front view showing the cleaning section 34 shown in FIG. 3.

As shown in FIGS. 3 and 12, the cleaning section 34 has six cleaning nozzles 160 for cleaning a substrate W which has been plated, particularly, a peripheral portion of a plated substrate W and the substrate contact portion 112. The cleaning nozzles 160 are connected to a cleaning liquid supply (not shown), and a cleaning liquid, e.g., pure water, is ejected toward a lower surface of the substrate W from the cleaning nozzles 160. The cleaning section 34 also has an arm-shaped air blower 162 for drying the substrate W which has been cleaned. The air blower 162 is connected to an air supply (not shown) via an air supply passage 164, and a dry gas such as dry air or nitrogen is ejected toward the lower surface of the substrate W from the air blower 162. The air blower 162 is rotatable about one end thereof which is connected to an upper end of the air supply passage 164.

Figure 13:
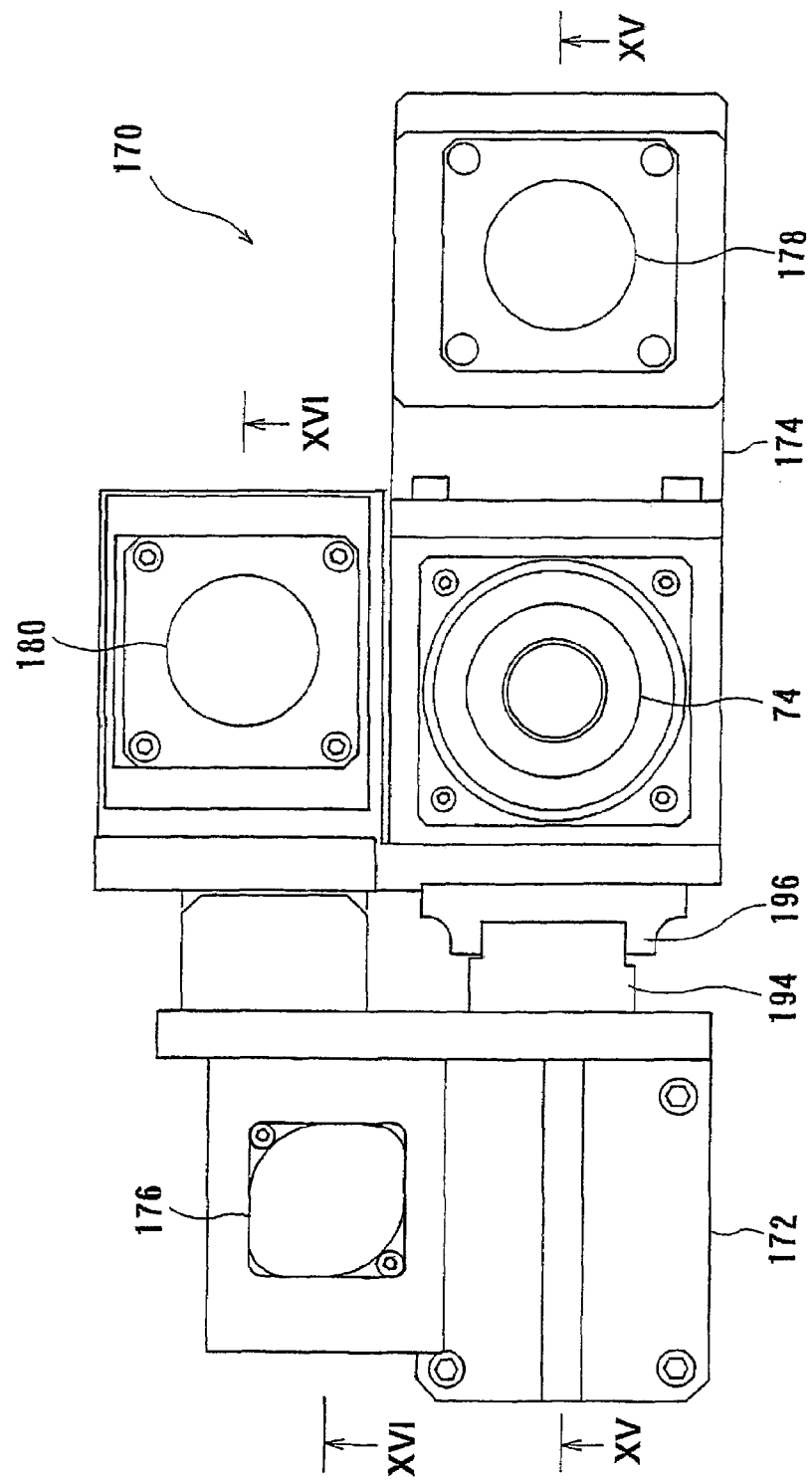
FIG. 13 is a plan view showing a drive mechanism in the plating unit shown in FIG. 3.
Figure 14:
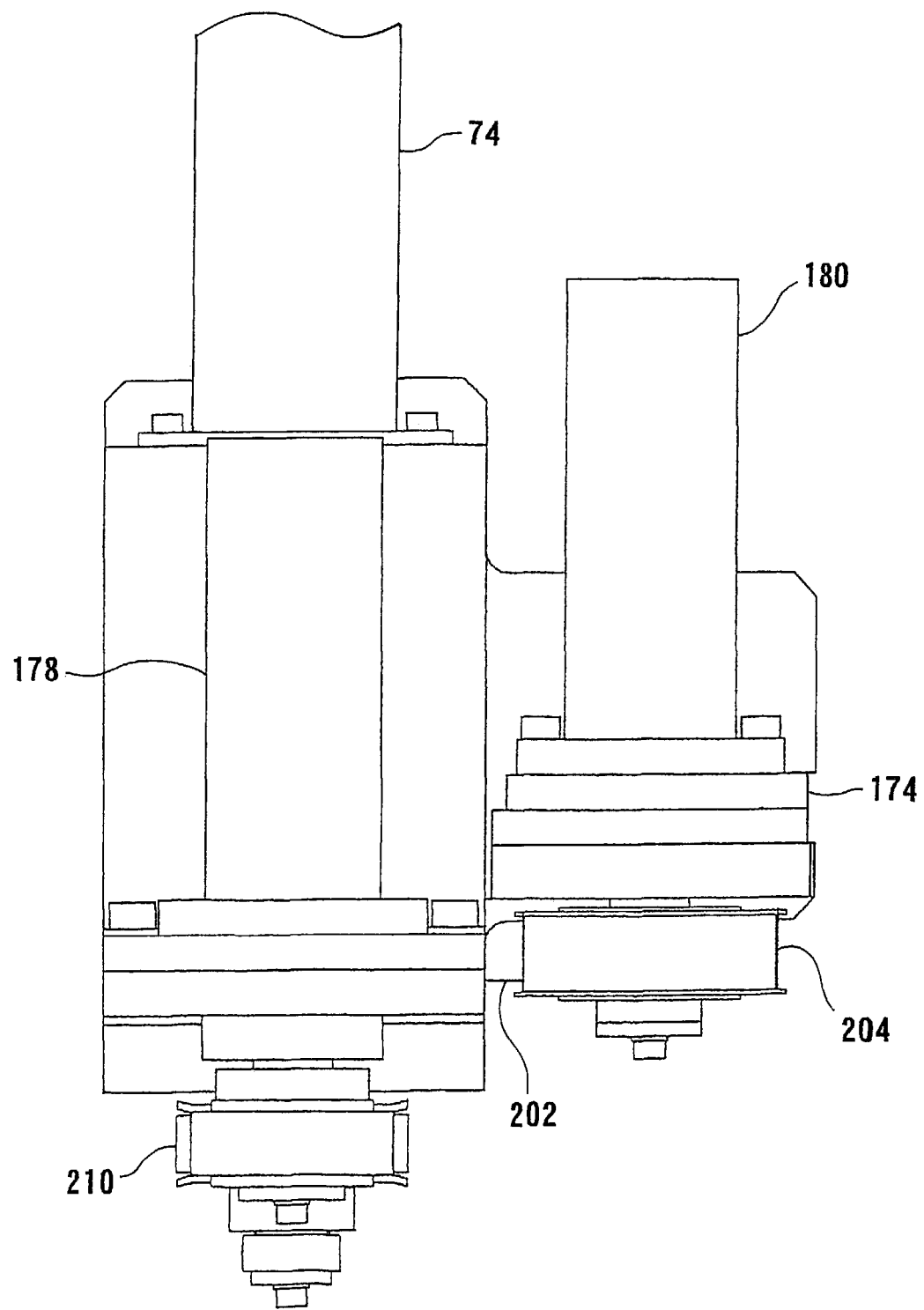
FIG. 14 is a side view of the drive mechanism shown in FIG. 13.
Figure 15:
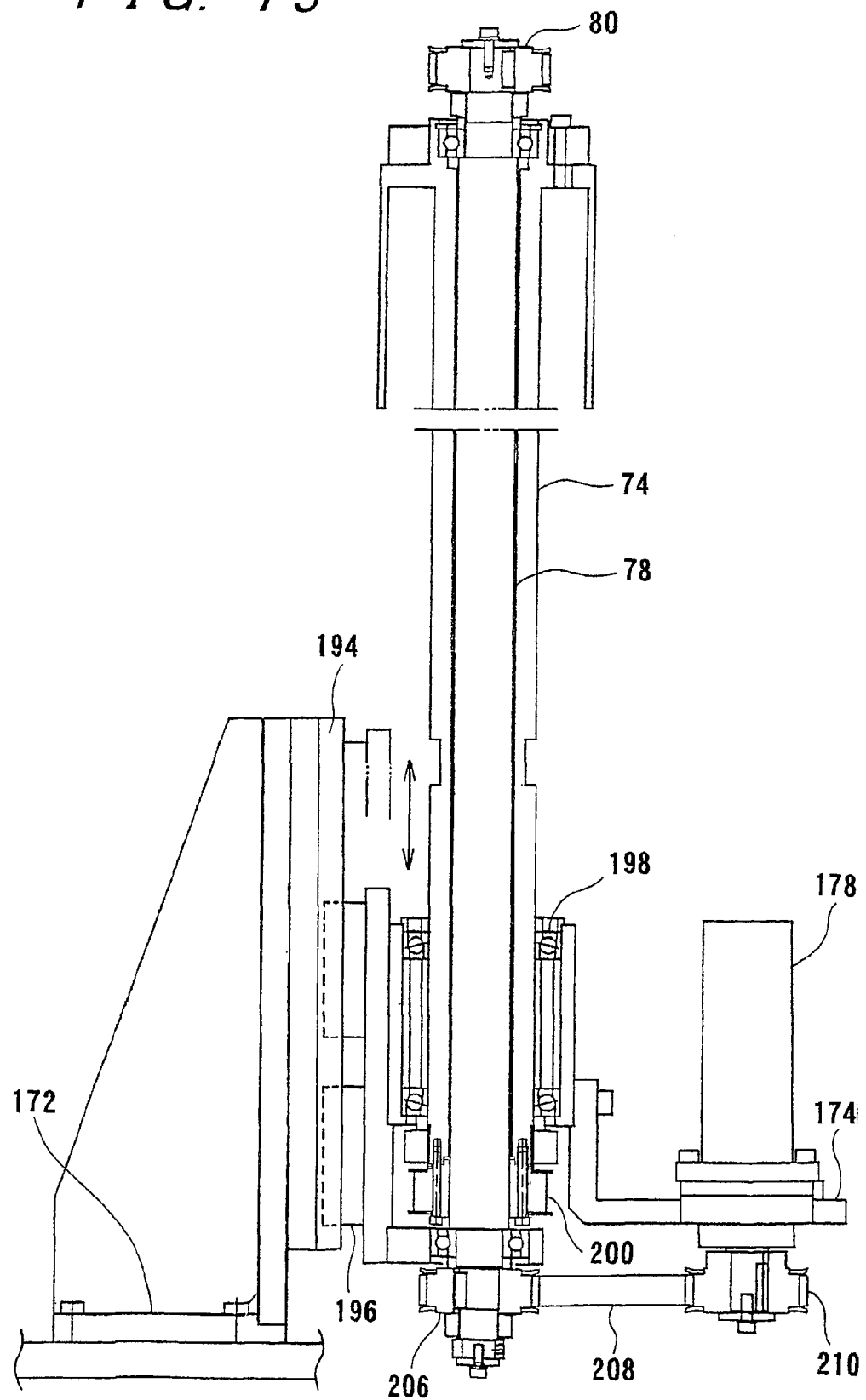
FIG. 15 is a cross-sectional view taken along line XV—XV in FIG. 13.
Figure 16:
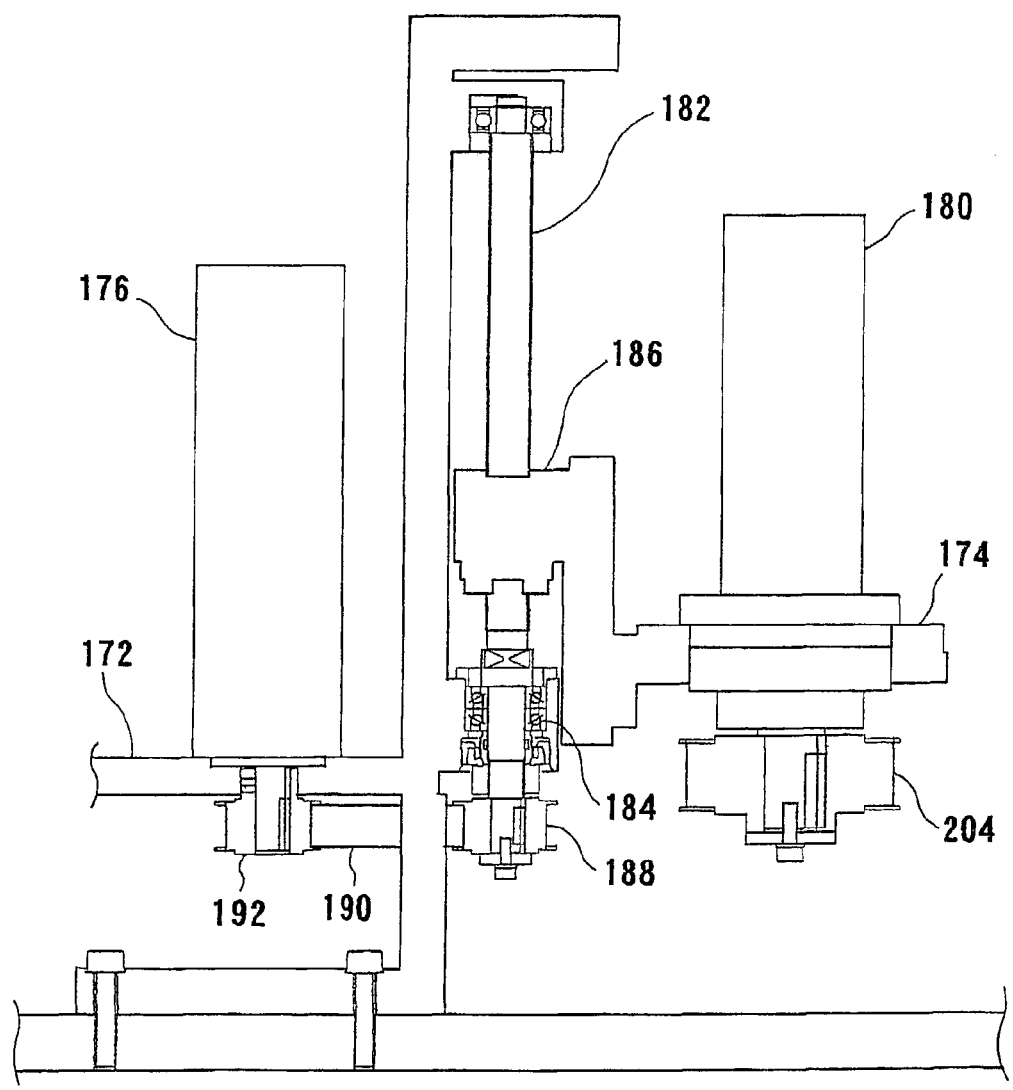
FIG. 16 is a cross-sectional view taken along line XVI—XVI in FIG. 13.

As described above, the support post 74 is vertically movable and rotatable about its own axis, and the rotational shaft 78 disposed in the support post 74 is rotatable with respect to the support post 74. Next, a drive mechanism for vertically moving and rotating the support post 74, and also rotating the rotational shaft 78, will be described below with reference to FIGS. 13 through 16. FIG. 13 is a plan view showing the drive mechanism, FIG. 14 is a side view of the drive mechanism, FIG. 15 is a cross-sectional view taken along line XV—XV in FIG. 13, and FIG. 16 is a cross-sectional view taken along line XVI—XVI in FIG. 13. As shown in FIGS. 4 and 5, the drive mechanism 170 is disposed outside of the cover 36. Therefore, particles produced by the drive mechanism 170 are prevented from entering the plating section 32 and other sections, and a mist produced during a plating process is prevented from adversely affecting the drive mechanism 170, so that durability of the drive mechanism 170 is increased.

As shown in FIGS. 13 through 16, the drive mechanism 170 basically comprises a fixed base 172 fixedly mounted on a frame of the plating unit 22, and a vertically movable base 174 vertically movably mounted on the fixed base 172. The fixed base 172 supports a lifting/lowering motor 176 thereon, and the vertically movable base 174 supports a rotational motor 178 and a swinging motor 180 thereon.

As shown in FIG. 16, a vertically extending screw shaft 182 is rotatably mounted on the fixed base 172 by bearings 184. A nut 186 mounted on the vertically movable base 174 is held in engagement with the screw shaft 182. A screw shaft pulley 188 is mounted on a lower end of the screw shaft 182, and operatively connected via a timing belt 190 to a lifting/lowering motor pulley 192 mounted on a shaft of the lifting/lowering motor 176. The vertically movable base 174 has a slider 196 (see FIG. 15) which is vertically guided by a slider support 194 mounted on the fixed base 172. When the lifting/lowering motor 176 is energized, the screw shaft 182 is rotated about its own axis to vertically move the nut 186 and the vertically movable base 174 while the slider 196 is being guided by the slider support 194 mounted on the fixed base 172.

The support post 74 is supported on the vertically movable base 174 by bearings 198, and a support post pulley 200 is fixed to a lower end of the support post 74. The support post pulley 200 is operatively connected via a timing belt 202 to a swinging motor pulley 204 mounted on a shaft of the swinging motor 180 (see FIG. 14). When the swinging motor 180 is energized, the support post 74 is rotated about its own axis to angularly move the swing arm 40 fixed to the support post 74.

As shown in FIG. 15, a lower rotational shaft pulley 206 is mounted on a lower end of the rotational shaft 78 inserted in the support post 74. The lower rotational shaft pulley 206 is operatively connected via a timing belt 208 to a rotational motor pulley 210 mounted on a shaft of the rotational motor 178. When the rotational motor 178 is energized, the rotational shaft 78 is rotated about its own axis to rotate the head assembly pulley 92 connected to the upper rotational shaft pulley 80, for thereby rotating the rotational shaft 84 of the head assembly 42.

A plating process for plating a substrate, such as a semiconductor substrate, with the substrate processing apparatus (plating apparatus) according to the present embodiment will be described below.

Substrates are accommodated within a cassette in such a state that the face side (the surface on which semiconductor devices are formed, or the surface to be processed) of each of the substrate faces upwardly. The cassette accommodating the substrates is placed on one of the loading/unloading units 10. The first transfer device 24 removes a substrate from the cassette, transfers it to one of the substrate stages 18, and places it on the substrate stage 18. On the substrate stage 18, the substrate is turned upside down, i.e., inverted so that its face side faces downwardly, by the inverter provided in the substrate stage 18. Then, this inverted substrate is transferred from the substrate stage 18 to the second transfer device 28. The shutter 38 of one of the plating units 22 is opened, and the second transfer device 28 transfers the substrate into the plating unit 22 through the opening 36a in the cover 36.

For transferring the substrate to the plating unit 22, the swinging motor 180 of the drive mechanism 170 is energized to turn the support post 74 through a certain angle about its own axis, for thereby moving the head assembly 42 to the cleaning position Q. Then, the movable member 96 is lowered to bring the pressing rods 100 into abutment against the nuts 108 on the upper ends of the vertically movable rods 106 and to push down the vertically movable rods 106 against the bias of the helical compression springs 110. Accordingly, the substrate contact portion 112 is downwardly moved from the substrate holding arm assembly 86.

Then, the air cylinders 104 on the movable member 96 are actuated to bring the pushers 102 into abutment against the nuts 130 of the chucking mechanisms 120. Consequently, the rods 124 are lowered against the helical compression springs 132 to angularly move the claws 128 radially outwardly.

A hand of the second transfer device 28, which has been inserted into the plating unit 22, is lifted to bring an upper surface (reverse side) of the substrate W into abutment against the presser 116 of the substrate holding arm assembly 86. In this state, actuation of the air cylinders 104 is stopped for releasing the pushers 102 to thus move the claws 128 of the chucking mechanisms 120 radially inwardly. Thus, the substrate W is positioned and gripped by the claws 128. Then, the hand of the second transfer device 28 is withdrawn from the plating unit 22, and the shutter 38 is closed.

When the above transfer of the substrate W is completed, the movable member 96 is upwardly moved to lift the substrate contact portion 112. When the substrate contact portion 122 is thus lifted, a peripheral edge of the substrate W is brought into electric contact with the cathode electrode contact 118, and sealed by the sealing member 114 for protection against immersion in the plating liquid. Thereafter, the substrate W may be pre-treated (pre-coated) by a chemical liquid which is ejected from the cleaning nozzles 160 in the cleaning section 34 toward a lower surface of the substrate W.

Then, the swinging motor 180 of the drive mechanism 170 is energized to turn the support post 74 through a given angle for thereby moving the head assembly 42 which holds the substrate W into the plating position P. The air cylinder 150 of the head assembly 42 is actuated to bring the pusher 152 into engagement with the hook 148 of the substrate holding arm assembly 86, and to lower the hook 148 for thereby tilting the substrate holding arm assembly 86 through an angle ranging from 1° to 3°. With the substrate holding arm assembly 86 being thus tilted, the lifting/lowering motor 176 of the drive mechanism 170 is energized to lower the support post 74 by a predetermined distance until the substrate W held on the lower surface of the substrate holding arm assembly 86 is immersed in plating liquid in the plating bath 44.

When the substrate W is thus tilted and immersed in the plating liquid, the surface of the substrate W is progressively brought into contact with an overflow surface of the plating liquid as the substrate W is lowered. A contact area of the surface of the substrate W with the plating liquid is thus progressively spread while removing air bubbles from the surface of the substrate W. Therefore, a tendency for the substrate W to contact the plating liquid can be improved. Since only the substrate holding arm assembly 86 can be tilted while the rotational shaft 84 of the head assembly 42 is kept vertical, the head assembly 42 and the swing arm 40 do not need to be tilted. Therefore, the substrate W can be tilted through a large angle, and hence the substrate W can easily be controlled for its tilting action and can be tilted under a reduced load. The substrate holding arm assembly 86 may be lowered in terms of its horizontal attitude without being tilted.

After the substrate W is immersed in the plating liquid, actuation of the air cylinder 150 is stopped for returning the substrate holding arm assembly 86 to its horizontal position. Thereafter, the rotational motor 178 of the drive mechanism 170 is energized to rotate to the rotational shaft 84 of the head assembly 42 via the rotational shaft 78 in the support post 74, for thereby rotating the substrate W at an intermediate rotational speed of about several tens revolutions per minute. A current is supplied between the anode 52 and the substrate W to form a plated film on the surface of the substrate W.

After this plating process is completed, rotation of the substrate W is stopped. The air cylinder 150 is actuated to bring the pusher 152 into engagement with the hook 148 and to lower the hook 148 for tilting the substrate holding arm assembly 86 through an angle ranging from 1° to 3°. Therefore, a residue of the plating liquid attached to the lower surface of the substrate W can easily drop off the substrate W by gravity. With the substrate holding arm assembly 86 being thus tilted, the lifting/lowering motor 176 is energized to lift the support post 74 and the head assembly 42 by a predetermined distance. Thereafter, actuation of the air cylinder 150 is stopped for returning the substrate holding arm assembly 86 to its horizontal position.

Then, the swinging motor 180 of the drive mechanism 170 is energized to turn the support post 74 about its own axis through a given angle, for thereby moving the head assembly 42 which holds the substrate W to the cleaning position Q. The lifting/lowering motor 176 is energized to lower the support post 74 by a predetermined distance. Then, the rotational motor 178 is energized to rotate the substrate holding arm assembly 86 at a rotational speed of 100 rpm, for example, and at the same time a cleaning liquid, e.g., pure water, is ejected from the cleaning nozzles 160 toward the lower surface of the substrate W to clean plated substrate W and the substrate contact portion 112. Since it is possible to clean the lower surface of the substrate W and the substrate contact portion 112 of the head assembly 42 in such a state that the substrate W is held by the substrate holding arm assembly 86, no plating liquid will be left on a tip of the sealing member 114 of the substrate contact portion 112 when the substrate W is released. Therefore, according to the present invention, a sealing capability and electric conductivity can be prevented from being deteriorated by crystallization of a remaining plating liquid.

Thereafter, the rotational speed of the substrate holding arm assembly 86 is increased to 300 rpm, for example, to spin off cleaning liquid. At the same time, air is applied from the air blower 162 to the substrate W to dry the substrate W. If a spin drying process were employed, the substrate would usually need to be rotated at 2000 rpm while being dried. According to the present invention, since air is applied to the substrate W from the air blower 162, the substrate W is not required to be rotated at such a high speed.

After the cleaning liquid is removed from the substrate W and the substrate W is dried, the movable member 96 is lowered to bring the pressing rods 100 into abutment against the nuts 108 on the upper ends of the vertically movable rods 106, and to lower the vertically movable rods 106 against the bias of the helical compression springs 110, for thereby downwardly moving the substrate contact portion 112 relatively to the substrate W.

Subsequently, the shutter 38 of the plating unit 22 is opened, and the hand of the second transfer device 28 is inserted through the opening 36a in the cover 36 into the plating unit 22. Then, the hand of the second transfer device 28 is lifted to a position capable of receiving the substrate W. Then, the air cylinders 104 on the movable member 96 are actuated to bring the pushers 102 into abutment with the nuts 130 of the chucking mechanisms 120 and to lower the rods 124 against the bias of the helical compression springs 132, for thereby angularly moving the claws 128 radially outwardly. The substrate W is released and placed onto the hand of the second transfer device 28. Thereafter, the hand of the second transfer device 28, with the substrate W placed thereon, is withdrawn from the plating unit 22, and the shutter 38 is closed.

The second transfer device 28 which has received the substrate W transfers the substrate W to one of the bevel etching/chemical cleaning/drying units 16. In the bevel etching/chemical cleaning/drying unit 16, the plated substrate W is cleaned with a chemical liquid, a thin copper film formed on a bevel portion of the substrate W is etched away, and the substrate W is cleaned with water and dried. After the substrate W is thus processed in the bevel etching/chemical cleaning/drying unit 16, the substrate W is returned to the cassette in the loading/unloading unit 10 by the first transfer device 10. A series of plating processes is thus performed.

While the present invention has been described in detail with reference to the preferred embodiment thereof, it would be apparent to those skilled in the art that many modifications and variations may be made therein without departing from the spirit and scope of the present invention. Next, some possible variations of the embodiment will be described below.

A tank for immersing a substrate W in a processing liquid may be installed in the cleaning section 34. In this case, the substrate W can be pre-treated, e.g., pre-dipped or pre-plated, in the plating unit 22. A pre-dipping process is a process of coating a uniform film of a pre-treatment liquid (pre-dipping liquid), which includes a constituent of the plating liquid, on a surface of the substrate on which a barrier layer and a seed layer have successively been deposited, for improving adhesive properties of plating liquid relative to the substrate. A pre-plating process is a process of pre-plating a surface of the substrate on which a barrier layer and a seed layer have successively been deposited, for reinforcing an incomplete seed layer.

Figure 17:
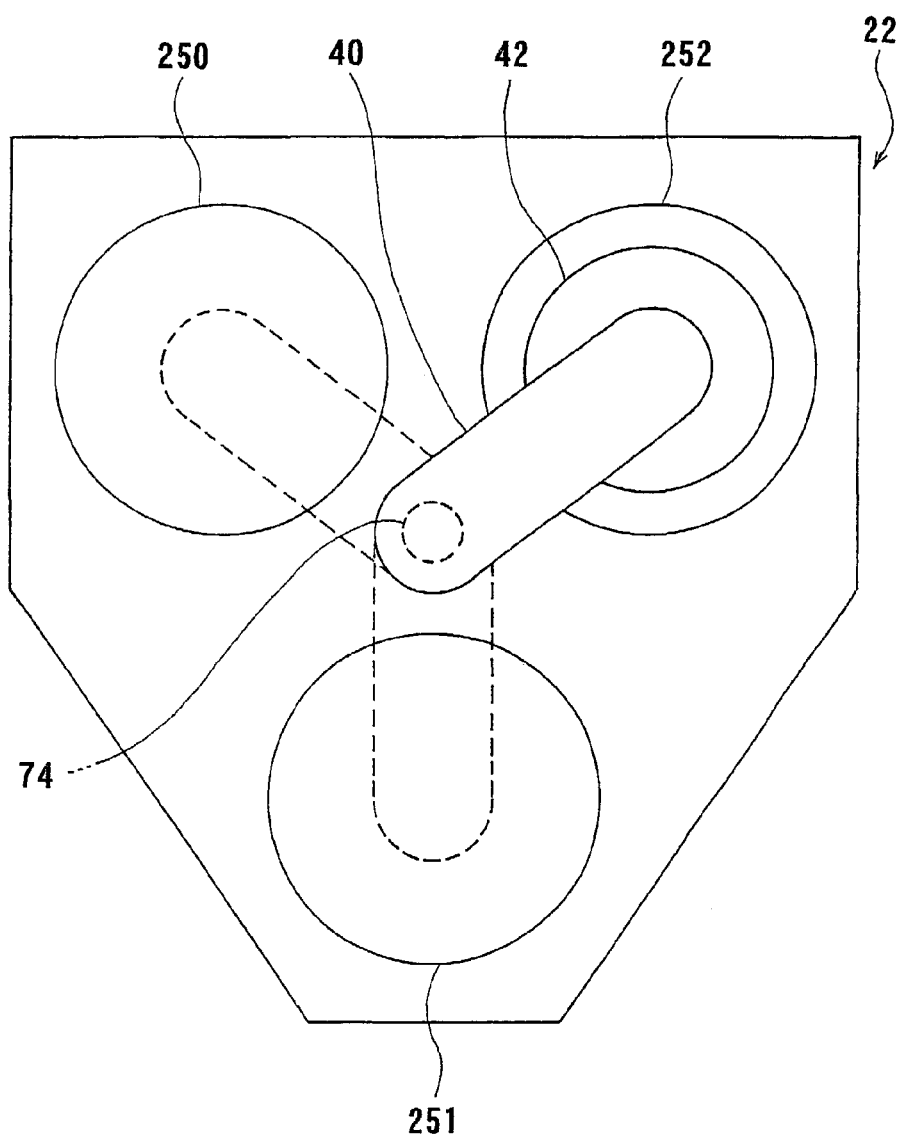
FIG. 17 is a plan view showing a plating unit according to another embodiment of the present invention.

FIG. 17 is a plan view showing a plating unit according to another embodiment of the present invention. As shown FIG. 17, the plating unit has a plurality of substrate processing sections including a pre-plating section 250, a pre-treatment/post-treatment/cleaning section 251, and a secondary plating section 252, disposed around support post 74 to which swing arm 40 is fixed. Thus, with a plurality of substrate processing sections, different processes on a substrate can be performed in single plating unit 22.

As described above, according to the present invention, since it is possible to clean the lower surface of the substrate and the substrate contact portion in such a state that the substrate is held by the head assembly, plating liquid which may have remained on and been attached to the substrate contact portion is effectively prevented from being crystallized. Therefore, durability of the substrate contact portion is increased, and a high-quality plating process can be performed while high electric conductivity is maintained.

Furthermore, since the plating section and the cleaning section are separated from each other, the cleaning liquid is not mixed with the plating liquid in the plating bath. Therefore, concentration of the plating liquid is not changed by a mixed cleaning liquid.

Since the substrate processing sections are covered by one cover, a mist produced in the cover is prevented from being scattered out of the cover. Further, since the drive mechanism is disposed outside of the cover, particles produced by the drive mechanism are prevented from entering the plating section and other sections. A mist produced during a plating process is prevented from adversely affecting the drive mechanism, so that durability of the drive mechanism is increased. Inasmuch as various components can be incorporated with each other, an overall substrate processing apparatus has a compact structure.

Furthermore, according to the present invention, a surface, to be plated, of a substrate can be brought into contact with an overflow surface of plating liquid in such a state that the substrate is tilted with respect to a horizontal plane. Therefore, a tendency for the substrate to contact the plating liquid can be improved, so that the plating liquid can smoothly be brought into contact with the substrate and air bubbles can be prevented from remaining on the surface, to be plated, of the substrate. Moreover, since the substrate can be tilted through a large angle while the rotational shaft of the head assembly is kept vertical, the substrate can easily be controlled for its tilting action and can be tilted under a reduced load.

Figure 18:
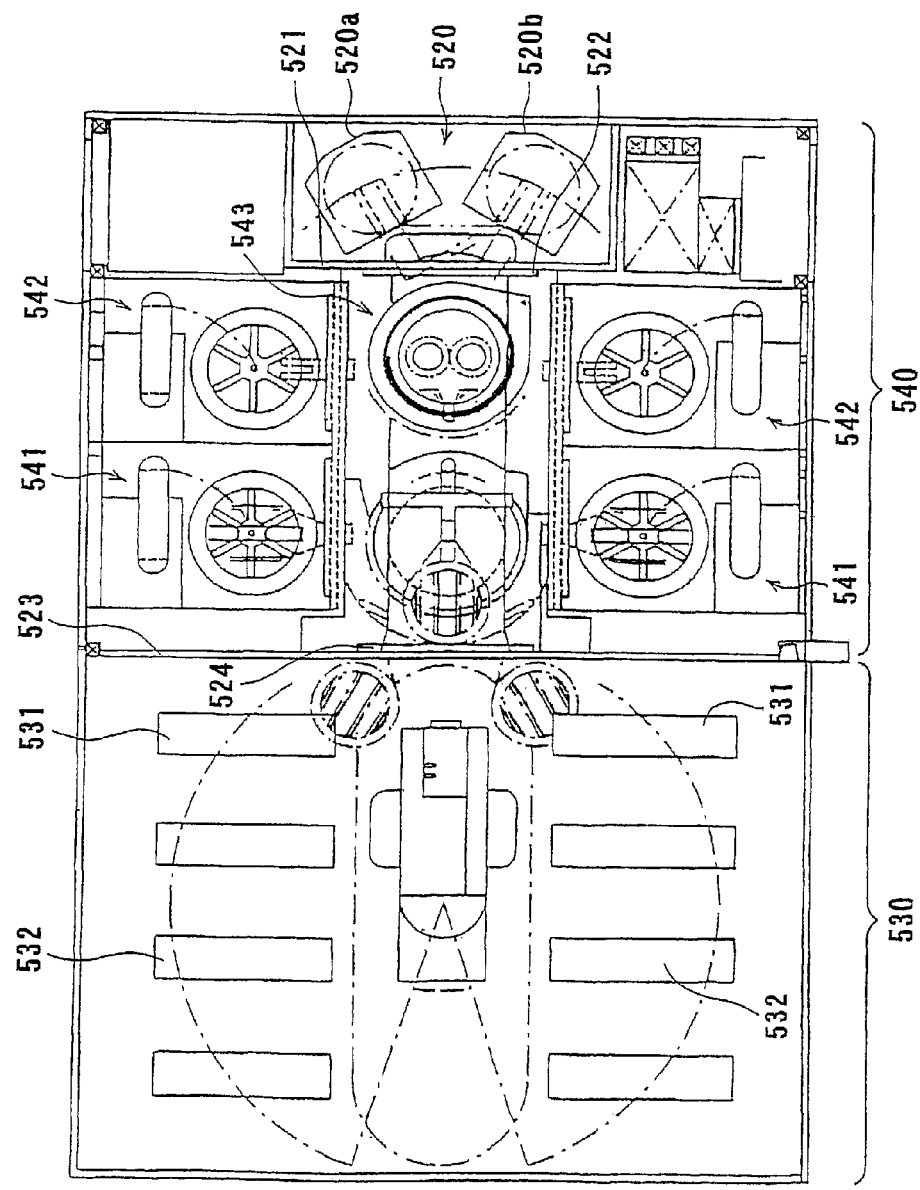
FIG. 18 is a plan view of an example of a substrate plating apparatus.

FIG. 18 is a plan view of an example of a substrate plating apparatus. The substrate plating apparatus shown in FIG. 18 comprises a loading/unloading area 520 for housing substrate cassettes which accommodate semiconductor substrates, a processing area 530 for processing semiconductor substrates, and a cleaning and drying area 540 for cleaning and drying plated semiconductor substrates. The cleaning and drying area 540 is positioned between the loading/unloading area 520, and the processing area 530. A partition 521 is disposed between the loading/unloading area 520, and the cleaning and drying area 540. And a partition 523 is disposed between the cleaning and drying area 540, and the processing area 530.

The partition 521 has a passage (not shown) defined therein for transferring semiconductor substrates therethrough between the loading/unloading area 520, and the cleaning and drying area 540, and supports a shutter 522 for opening and closing the passage. The partition 523 has a passage (not shown) defined therein for transferring semiconductor substrates therethrough between the cleaning and drying area 540, and the processing area 530, and supports a shutter 524 for opening and closing the passage. The cleaning and drying area 540 and the processing area 530 can independently be supplied with and discharge air.

The substrate plating apparatus shown in FIG. 18 is placed in a clean room, which accommodates semiconductor fabrication facilities. Pressures in the loading/unloading area 520, the processing area 530, and the cleaning and drying area 540 are selected as follows:

The pressure in the loading/unloading area 520>the pressure in the cleaning and drying area 540>the pressure in the processing area 530.

The pressure in the loading/unloading area 520 is lower than the pressure in the clean room. Therefore, air does not flow from the processing area 530 into the cleaning and drying area 540, and air does not flow from the cleaning and drying area 540 into the loading/unloading area 520. Furthermore, air does not flow from the loading/unloading area 520 into the clean room.

The loading/unloading area 520 houses a loading unit 520a and an unloading unit 520b, each accommodating a substrate cassette for storing semiconductor substrates. The cleaning and drying area 540 houses two water cleaning units 541 for cleaning plated semiconductor substrates with water, and two drying units 542 for drying plated semiconductor substrates. Each of the water cleaning units 541 may comprise a pencil-shaped cleaner with a sponge layer mounted on a front end thereof, or a roller with a sponge layer mounted on an outer circumferential surface thereof. Each of the drying units 542 may comprise a drier for spinning a semiconductor substrate at a high speed to dehydrate and dry the substrate. The cleaning and drying area 540 also has a transfer unit (transfer robot) 543 for transferring semiconductor substrates.

The processing area 530 houses a plurality of pretreatment chambers 531 for pretreating semiconductor substrates prior to being plated, and a plurality of plating chambers 532 for plating semiconductor substrates with copper. The processing area 530 also has a transfer unit (transfer robot) 543 for transferring semiconductor substrates.

Figure 19:
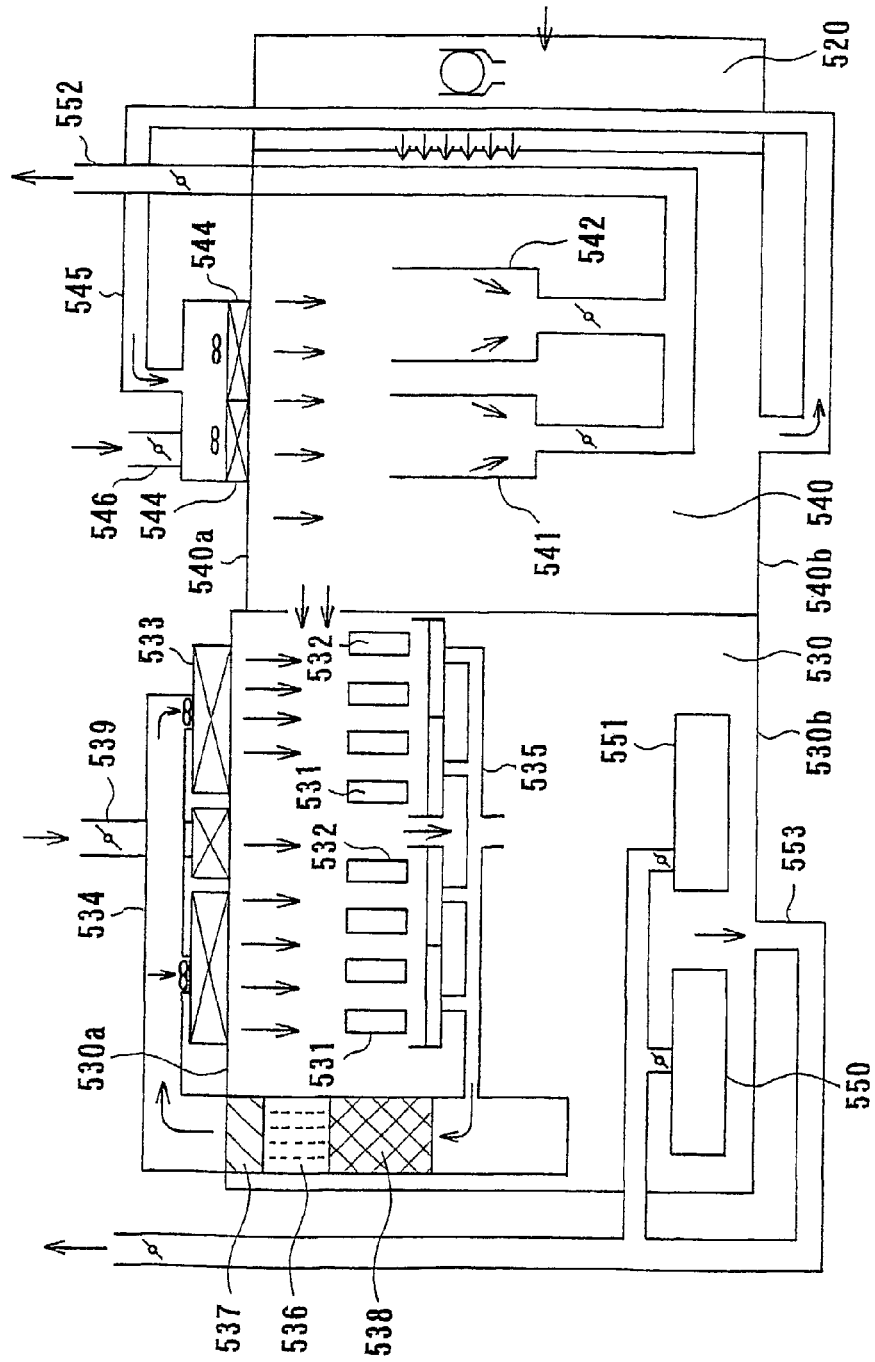
FIG. 19 is a schematic view showing airflow in the substrate plating apparatus shown in FIG. 18.

FIG. 19 shows in side elevation air flows in the substrate plating apparatus. As shown in FIG. 19, fresh air is introduced from an exterior through a duct 546 and forced through high-performance filters 544 by fans from a ceiling 540*a* into the cleaning and drying area 540 as downward clean air flows around the water cleaning units 541 and the drying units 542. Most of this supplied clean air is returned from a floor 540*b* through a circulation duct 545 to the ceiling 540*a*, from which clean air is forced again through the filters 544 by the fans into the cleaning and drying area 540. Part of the clean air is discharged from the substrate cleaning units 541 and the drying units 542 through a duct 552 out of the cleaning and drying area 540.

In the processing area 530 which accommodates the pretreatment chambers 531 and the plating chambers 532, particles are not allowed to be applied to surfaces of semiconductor substrates even though the processing area 530 is a wet zone. To prevent particles from being applied to semiconductor substrates, downward clean air flows around the pretreatment chambers 531 and the plating chambers 532. Fresh air is introduced from the exterior through a duct 539 and forced through high-performance filters 533 by fans from a ceiling 530*a* into the processing area 530.

If an entire amount of clean air as downward clean air flows introduced into the processing area 530 were always supplied from the exterior, then a large amount of air would be required to be introduced into and discharged from the processing area 530 at all times. According to this embodiment, air is discharged from the processing area 530 through a duct 553 at a rate sufficient to keep the pressure in the processing area 530 lower than the pressure in the cleaning and drying area 540, and most of the downward clean air introduced into the processing area 530 is circulated through circulation ducts (pipes) 534, 535. The circulation duct 534 extends from the cleaning and drying area 540 and is connected to the filters 533 over the ceiling 530*a*. The circulation duct 535 is disposed in the cleaning and drying area 540 and connected to the pipe 534 in the cleaning and drying area 540.

Circulating air that has passed through the processing area 530 contains a chemical mist and gases from solutionbaths. The chemical mist and gases are removed from the circulating air by a scrubber 536 and mist separators 537, 538 which are disposed in the pipe 534 that is connected to the pipe 535. The air which circulates from the cleaning and drying area 540 through the scrubber 536 and the mist separators 537, 538 back into the circulation duct 534 over the ceiling 530*a* is free of any chemical mist and gases. This clean air is then forced through the filters 533 by the fans to circulate back into the processing area 530.

Part of this air is discharged from the processing area 530 through the duct 53 connected to a floor 530*b* of the processing area 530. Air containing a chemical mist and gases is also discharged from the processing area 530, through the duct 553. An amount of fresh air which is commensurate with an amount of air discharged through the duct 553 is supplied from the duct 539 into the plating chamber 530 under=negative pressure developed therein with respect to the pressure in the clean room.

Figure 20:
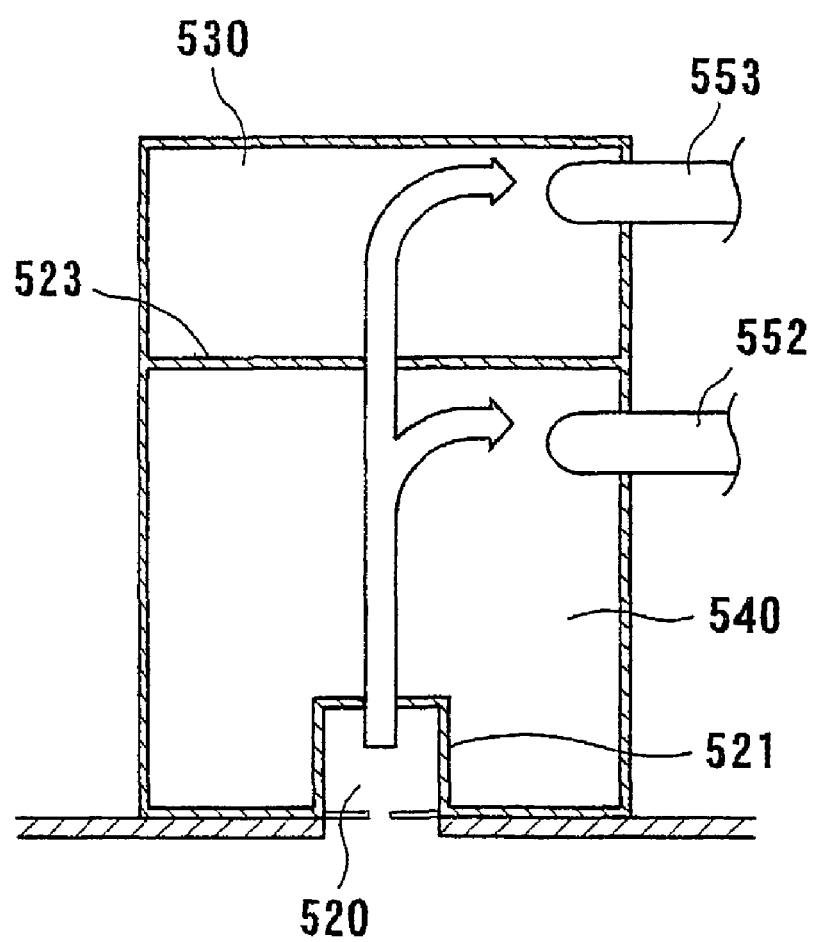
FIG. 20 is a cross-sectional view showing airflows among areas in the substrate plating apparatus shown in FIG. 18.

As described above, the pressure in the loading/unloading area 520 is higher than the pressure in the cleaning and drying area 540 which is higher than the pressure in the processing area 530. When the shutters 522, 524 (see FIG. 18) are opened, therefore, air flows successively through the loading/unloading area 520, the cleaning and drying area 540, and the processing area 530, as shown in FIG. 20. Air discharged from the cleaning and drying area 540 and the processing area 530 flows through the ducts 552, 553 into a common duct 554 (see FIG. 21) which extends out of the clean room.

Figure 21:
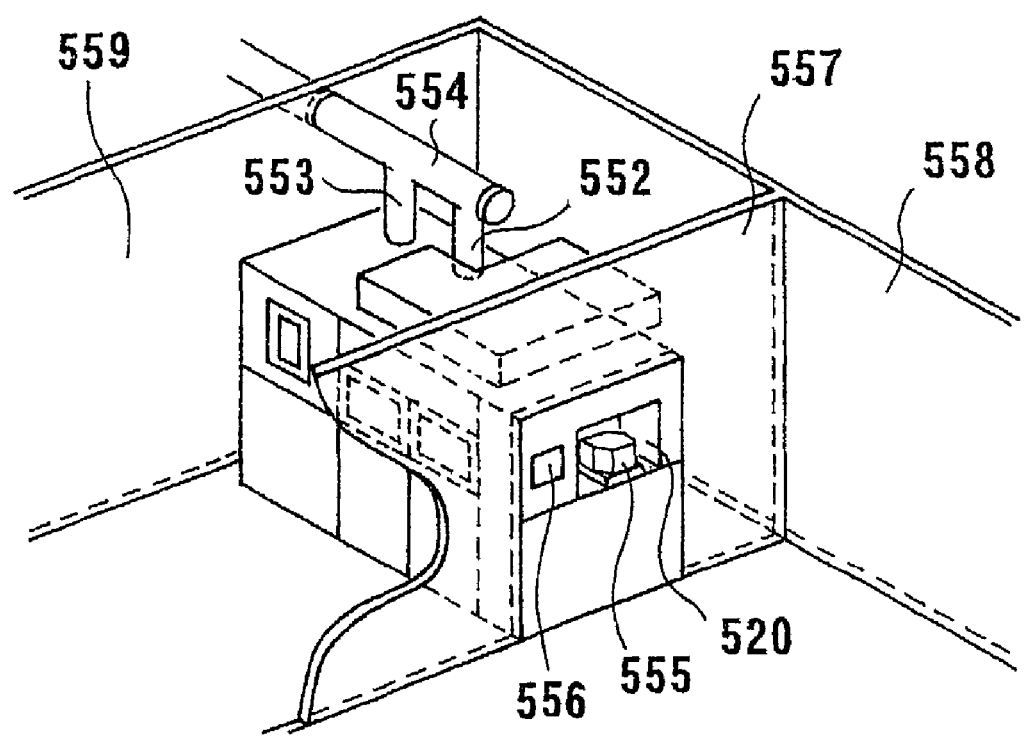
FIG. 21 is a perspective view of the substrate plating apparatus shown in FIG. 18, which is placed in a clean room.

FIG. 21 shows in perspective the substrate plating apparatus shown in FIG. 18, which is placed in the clean room. The loading/unloading area 520 includes a side wall which has a cassette transfer port 555 defined therein and a control panel 556, and which is exposed to a working zone 558 that is compartmented in the clean room by a partition wall 557. The partition wall 557 also compartments a utility zone 559 in the clean room in which the substrate plating apparatus is installed. Other sidewalls of the substrate plating apparatus are exposed to the utility zone 559 whose air cleanliness is lower than air cleanliness in the working zone 558.

As described above, the cleaning and drying area 540 is disposed between the loading/unloading area 520 and the processing area 530. The partition 521 is disposed between the loading/unloading area 520 and the cleaning and drying area 540. The partition 523 is disposed between the cleaning and drying area 540 and the processing area 530. A dry semiconductor substrate is loaded from the working zone 558 through the cassette transfer port 555 into the substrate plating apparatus, and then plated in the substrate plating apparatus. This plated semiconductor substrate is cleaned and dried, and then unloaded from the substrate plating apparatus through the cassette transfer port 555 into the working zone 558. Consequently, no particles and mist are applied to a surface of the semiconductor substrate, and the working zone 558 which has higher air cleanliness than the utility zone 557 is prevented from being contaminated by particles, chemical mists, and cleaning solution mists.

In the embodiment shown in FIGS. 18 and 19, the substrate plating apparatus has the loading/unloading area 520, the cleaning and drying area 540, and the processing area 530. However, an area accommodating a chemical mechanical polishing unit may be disposed in or adjacent to the processing area 530, and the cleaning and drying area 540 may be disposed in the processing area 530 or between the area accommodating the chemical mechanical polishing unit and the loading/unloading area 520. Any of various other suitable area and unit layouts may be employed insofar as a dry semiconductor substrate can be loaded into the substrate plating apparatus, and a plated semiconductor substrate can be cleaned and dried, and thereafter unloaded from the substrate plating apparatus.

In the embodiment described above, the present invention is applied to a substrate plating apparatus for plating a semiconductor substrate. However, principles of the present invention are also applicable to a substrate plating apparatus for plating a substrate other than a semiconductor substrate. Furthermore, a region on a substrate plated by the substrate plating apparatus is not limited to an interconnection region on the substrate. The substrate plating apparatus may be used to plate substrates with a metal other than copper.

FIG. 22 is a plan view of another example of a substrate plating apparatus. The substrate plating apparatus shown in FIG. 22 comprises a loading unit 601 for loading a semiconductor substrate, a copper plating chamber 602 for plating a semiconductor substrate with copper, a pair of water cleaning chambers 603, 604 for cleaning a semiconductor substrate with water, a chemical mechanical polishing unit 605 for chemically and mechanically polishing a semiconductor substrate, a pair of water cleaning chambers 606, 607 for cleaning a semiconductor substrate with water, a drying chamber 608 for drying a semiconductor substrate, and an unloading unit 609 for unloading a semiconductor substrate with an interconnection film thereon. The substrate plating apparatus also has a substrate transfer mechanism (not shown) for transferring semiconductor substrates to the chambers 602, 603, 604, the chemical mechanical polishing unit 605, the chambers 606, 607, 608, and the unloading unit 609. The loading unit 601, the chambers 602, 603, 604, the chemical mechanical polishing unit 605, the chambers 606, 607, 608, and the unloading unit 609 are combined into a single unitary arrangement as an apparatus.

The substrate plating apparatus operates as follows: The substrate transfer mechanism transfers a semiconductor substrate W, on which an interconnection film has not yet been formed, from a substrate cassette 601-1 placed in the loading unit 601 to the copper plating chamber 602. In the copper plating chamber 602, a plated copper film is formed on a surface of the semiconductor substrate W having an interconnection region composed of an interconnection trench and an interconnection hole (contact hole).

After the plated copper film is formed on the semiconductor substrate W in the copper plating chamber 602, the semiconductor substrate W is transferred to one of the water cleaning chambers 603, 604 by the substrate transfer mechanism and cleaned by water in one of the water cleaning chambers 603, 604. This cleaned semiconductor substrate W is transferred to the chemical mechanical polishing unit 605 by the substrate transfer mechanism. The chemical mechanical polishing unit 605 removes unwanted plated copper film from a surface of the semiconductor substrate W, thereby leaving a portion of the plated copper film in the interconnection trench and the interconnection hole. A barrier layer made of TiN or the like is formed on the surface of the semiconductor substrate W, including inner surfaces of the interconnection trench and the interconnection hole, before the plated copper film is deposited.

Then, the semiconductor substrate W with this remaining plated copper film is transferred to one of the water cleaning chambers 606, 607 by the substrate transfer mechanism, and cleaned by water in one of the water cleaning chambers 607, 608. This cleaned semiconductor substrate W is then dried in the drying chamber 608, after which this dried semiconductor substrate W with the remaining plated copper film serving as an interconnection film is placed into a substrate cassette 609-1 in the unloading unit 609.

Figure 23:
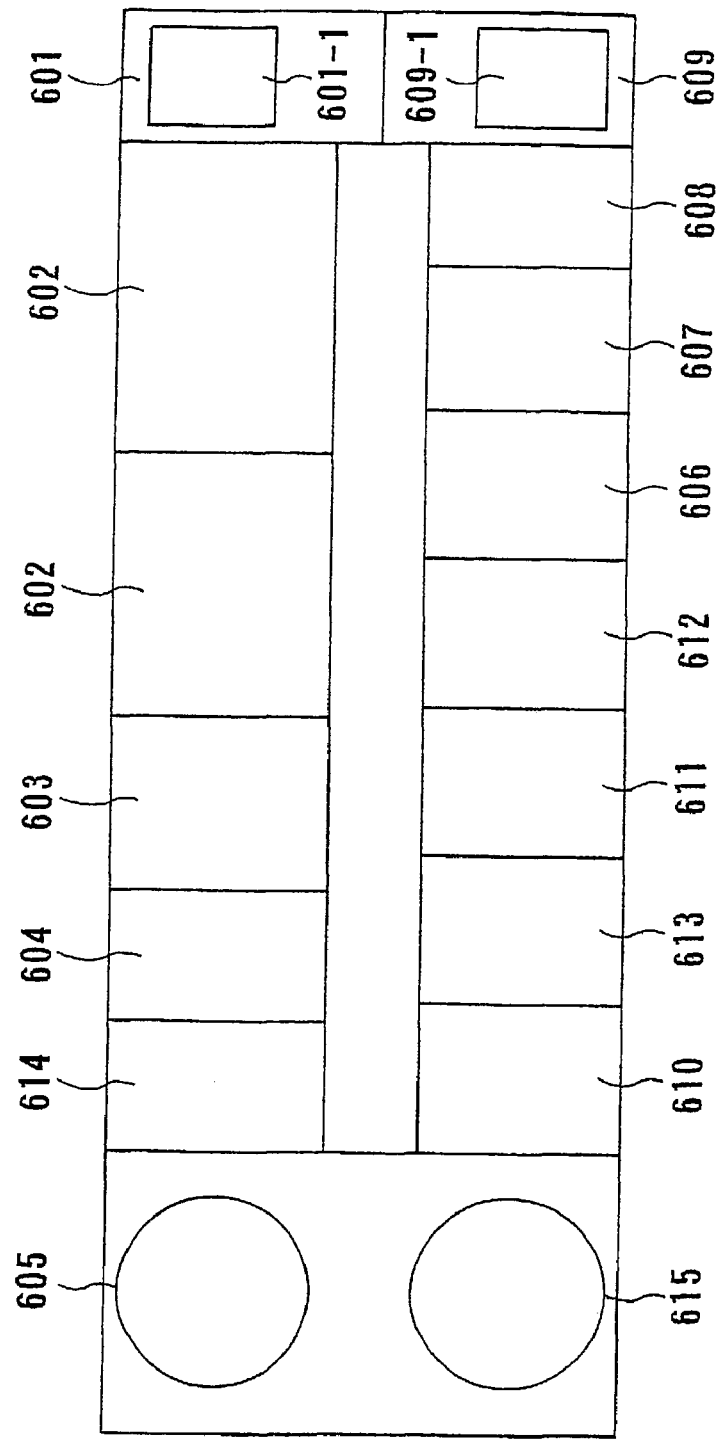
FIG. 23 is a plan view of still another example of a substrate plating apparatus.

FIG. 23 shows a plan view of still another example of a substrate plating apparatus. The substrate plating apparatus shown in FIG. 23 differs from the substrate plating apparatus shown in FIG. 22 in that it additionally includes a copper plating chamber 602, a water cleaning chamber 610, a pretreatment chamber 611, a protective layer plating chamber 612 for forming a protective plated layer on a plated copper film on a semiconductor substrate, water cleaning chambers 613, 614, and a chemical mechanical polishing unit 615. Loading unit 601, chambers 602, 602, 603, 604, 614, chemical mechanical polishing units 605, 615, chambers 606, 607, 608, 610, 611, 612, 613, and unloading unit 609 are combined into a single unitary arrangement as an apparatus.

The substrate plating apparatus shown in FIG. 23 operates as follows: A semiconductor substrate W is supplied from the substrate cassette 601-1, placed in the loading unit 601 successively, to one of the copper plating chambers 602, 602. In the one of the copper plating chamber 602, 602, a plated copper film is formed on a surface of the semiconductor substrate W, having an interconnection region composed of an interconnection trench and an interconnection hole (contact hole). The two copper plating chambers 602, 602 are employed to allow the semiconductor substrate W to be plated with a copper film for a long period of time. Specifically, the semiconductor substrate W may be plated with a primary copper film according to electroless plating in one of the copper plating chambers 602, and then plated with a secondary copper film according to electroplating in the other copper plating chamber 602. The substrate plating apparatus may have more than two copper plating chambers.

The semiconductor substrate W with the plated copper film formed thereon is cleaned by water in one of the water cleaning chambers 603, 604. Then, the chemical mechanical polishing unit 605 removes an unwanted portion of the plated copper film from the surface of the semiconductor substrate W, thereby leaving a portion of the plated copper film in the interconnection trench and the interconnection hole.

Thereafter, the semiconductor substrate W with this remaining plated copper film is transferred to the water cleaning chamber 610, in which the semiconductor substrate W is cleaned with water. Then, the semiconductor substrate W is transferred to the pretreatment chamber 611, and pretreated therein for deposition of a protective plated layer. This pretreated semiconductor substrate W is transferred to the protective layer-plating chamber 612. In the protective layer plating chamber 612, a protective plated layer is formed on the plated copper film in the interconnection region on the semiconductor substrate W. For example, the protective plated layer is formed with an alloy of nickel (Ni) and boron (B) by performing electroless plating.

After the semiconductor substrate is cleaned in one of the water cleaning chamber 613, 614, an upper portion of the protective plated layer deposited on the plated copper film is polished off to planarize the protective plated layer, in the chemical mechanical polishing unit 615.

After the protective plated layer is polished, the semiconductor substrate W is cleaned by water in one of the water cleaning chambers 606, 607, dried in the drying chamber 608, and then transferred to the substrate cassette 609-1 in the unloading unit 609.

Figure 24:
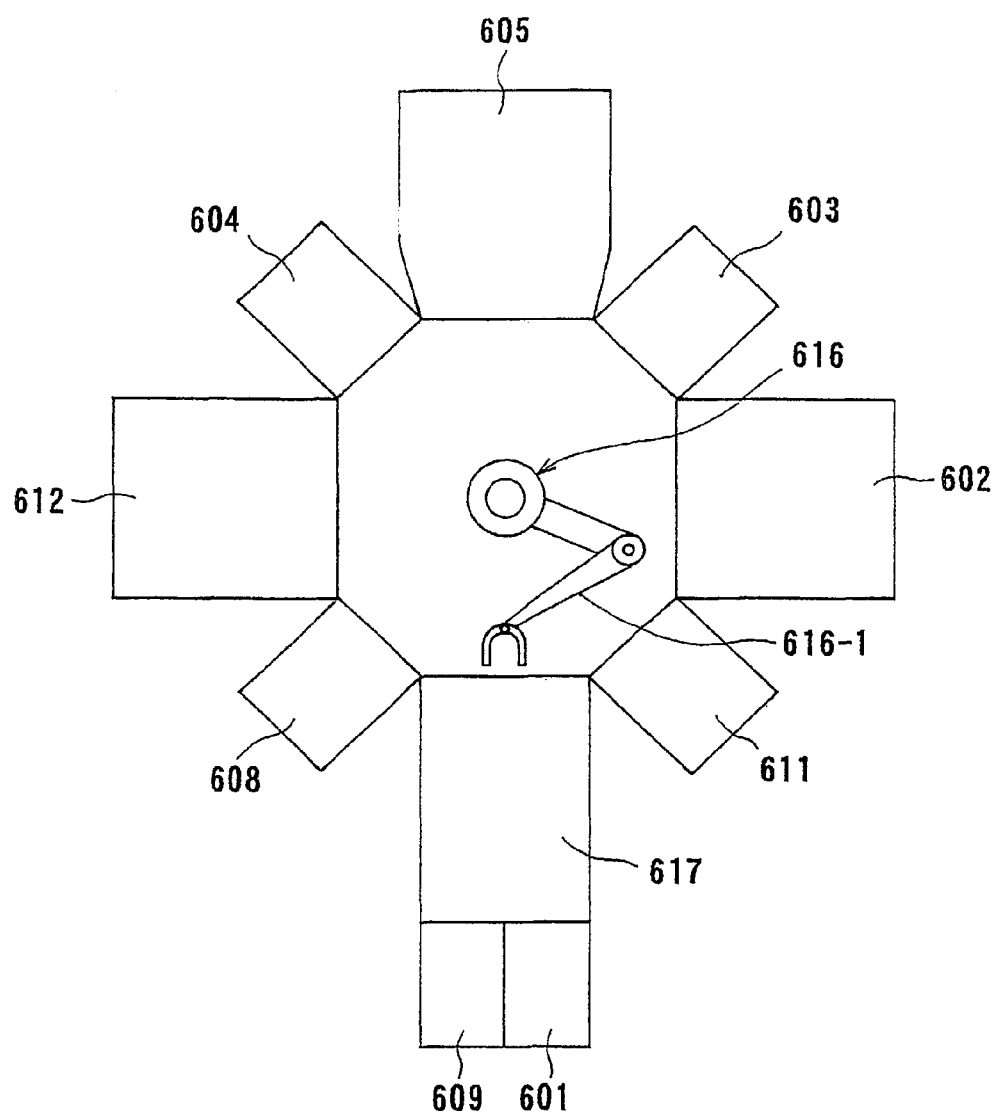
FIG. 24 is a plan view of still another example of a substrate plating apparatus.

FIG. 24 is a plan view of still another example of a substrate plating apparatus. As shown in FIG. 24, the substrate plating apparatus includes a robot 616 at its center which has a robot arm 616-1, and also has a copper plating chamber 602, a pair of water cleaning chambers 603, 604, a chemical mechanical polishing unit 605, a pretreatment chamber 611, a protective layer plating chamber 612, a drying chamber 608, and a loading/unloading station 617 which are disposed around the robot 616 and positioned within reach of the robot arm 616-1. A loading unit 601 for loading semiconductor substrates, and an unloading unit 609 for unloading semiconductor substrates, are disposed adjacent to the loading/unloading station 617. The robot 616, the chambers 602, 603, 604, the chemical mechanical polishing unit 605, the chambers 608, 611, 612, the loading/unloading station 617, the loading unit 601, and the unloading unit 609 are combined into a single unitary arrangement as an apparatus.

The substrate plating apparatus shown in FIG. 24 operates as follows:

A semiconductor substrate to be plated is transferred from the loading unit 601 to the loading/unloading station 617, from which the semiconductor substrate is received by the robot arm 616-1 and transferred thereby to the copper plating chamber 602. In the copper plating chamber 602, a plated copper film is formed on a surface of the semiconductor substrate which has an interconnection region composed of an interconnection trench and an interconnection hole. The semiconductor substrate with the plated copper film formed thereon is transferred by the robot arm 616-1 to the chemical mechanical polishing unit 605. In the chemical mechanical polishing unit 605, the plated copper film is removed from the surface of the semiconductor substrate W, thereby leaving a portion of the plated copper film in the interconnection trench and the interconnection hole.

The semiconductor substrate is then transferred by the robot arm 616-1 to the water-cleaning chamber 604, in which the semiconductor substrate is cleaned by water. Thereafter, the semiconductor substrate is transferred by the robot arm 616-1 to the pretreatment chamber 611, in which the semiconductor substrate is pretreated therein for deposition of a protective plated layer. This pretreated semiconductor substrate is transferred by the robot arm 616-1 to the protective layer plating chamber 612. In the protective layer plating chamber 612, a protective plated layer is formed on the plated copper film in the interconnection region on the semiconductor substrate. The semiconductor substrate with the protective plated layer formed thereon is transferred by the robot arm 616-1 to the water cleaning chamber 604, in which the semiconductor substrate is cleaned by water. This cleaned semiconductor substrate is transferred by the robot arm 616-1 to the drying chamber 608, in which the semiconductor substrate is dried. This dried semiconductor substrate is transferred by the robot arm 616-1 to the loading/unloading station 617, from which this plated semiconductor substrate is transferred to the unloading unit 609.

Figure 25:
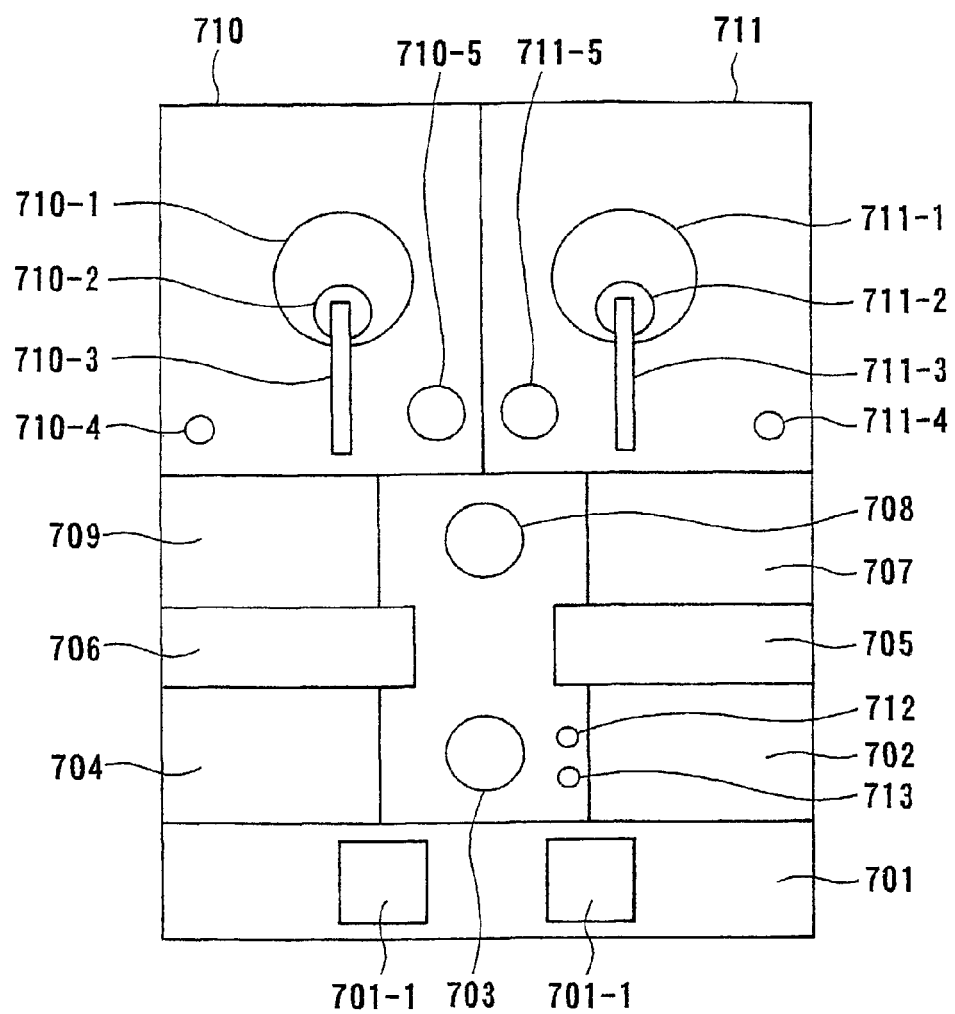
FIG. 25 is a view showing a plan constitution example of a semiconductor substrate processing apparatus.

FIG. 25 is a view showing a plan constitution of another example of a semiconductor substrate processing apparatus. This semiconductor substrate processing apparatus is of a constitution in which there are provided a loading/unloading section 701, a plated Cu film forming unit 702, a first robot 703, a third cleaning machine 704, a reversing machine 705, a reversing machine 706, a second cleaning machine 707, a second robot 708, a first cleaning machine 709, a first polishing apparatus 710, and a second polishing apparatus 711. A before-plating and after-plating film thickness measuring instrument 712 for measuring film thicknesses before and after plating, and a dry state film thickness measuring instrument 713 for measuring a film thickness of a semiconductor substrate W in a dry state after polishing are placed near the first robot 703.

The first polishing apparatus (polishing unit) 710 has a polishing table 710-1, a top ring 710-2, a top ring head 710-3, a film thickness measuring instrument 710-4, and a pusher 710-5. The second polishing apparatus (polishing unit) 711 has a polishing table 711-1, a top ring 711-2, a top ring head 711-3, a film thickness measuring instrument 711-4, and a pusher 711-5.

A cassette 701-1 accommodating semiconductor substrates W, in which a via hole and a trench for interconnect are formed, and on which a seed layer is formed, is placed on a loading port of the loading/unloading section 701. The first robot 703 removes the semiconductor substrate W from the cassette 701-1, and carries the semiconductor substrate W into the plated Cu film forming unit 702 where a plated Cu film is formed. At this time, a film thickness of the seed layer is measured with the before-plating and after-plating film thickness measuring instrument 712. The plated Cu film is formed by performing hydrophilic treatment of a face of the semiconductor substrate W, and then Cu plating. After formation of the plated Cu film, rinsing or cleaning of the semiconductor substrate W is performed in the plated Cu film forming unit 702.

When the semiconductor substrate W is removed from the plated Cu film forming unit 702 by the first robot 703, a film thickness of the plated Cu film is measured with the before-plating and after-plating film thickness measuring instrument 712. Results of this measurement are recorded into a recording device (not shown) as record data on the semiconductor substrate, and are used for judgment of an abnormality of the plated Cu film forming unit 702. After measurement of this film thickness, the first robot 703 transfers the semiconductor substrate W to the reversing machine 705, and the reversing machine 705 reverses the semiconductor substrate W (the surface on which the plated Cu film has been formed faces downward). The first polishing apparatus 710 and the second polishing apparatus 711 perform polishing in a serial mode and a parallel mode. Next, polishing in the serial mode will be described.

In serial mode polishing, a primary polishing is performed by the polishing apparatus 710, and a secondary polishing is performed by the polishing apparatus 711. The second robot 708 picks up semiconductor substrate W on the reversing machine 705, and places the semiconductor substrate W on the pusher 710-5 of the polishing apparatus 710. The top ring 710-2 attracts the semiconductor substrate W on the pusher 710-5 by suction, and brings a surface of a plated Cu film of the semiconductor substrate W into contact with a polishing surface of the polishing table 710-1 under pressure to perform the primary polishing. With the primary polishing, the plated Cu film is basically polished. The polishing surface of the polishing table 710-1 is composed of foamed polyurethane such as IC1000, or a material having abrasive grains fixed thereto or impregnated therein. Upon relative movements of the polishing surface and the semiconductor substrate W, the plated Cu film is polished.

After completion of polishing of the plated Cu film, the semiconductor substrate W is returned onto the pusher 710-5 by the top ring 710-2. The second robot 708 picks up the semiconductor substrate W, and introduces it into the first cleaning machine 709. At this time, a chemical liquid may be ejected toward a face and backside of the semiconductor substrate W on the pusher 710-5 to remove particles therefrom or cause particles to be difficult to adhere thereto.

After completion of cleaning in the first cleaning machine 709, the second robot 708 picks up the semiconductor substrate W, and places the semiconductor substrate W on the pusher 711-5 of the second polishing apparatus 711. The top ring 711-2 attracts the semiconductor substrate W on the pusher 711-5 by suction, and brings a surface of the semiconductor substrate W, which has a barrier layer formed thereon, into contact with a polishing surface of the polishing table 711-1 under pressure to perform the secondary polishing. A constitution of the polishing table is the same as the polishing table 710-1. With this secondary polishing, the barrier layer is polished. However, there may be a case in which a Cu film and an oxide film, remaining after the primary polishing, are also polished.

A polishing surface of the polishing table 711-1 is composed of foamed polyurethane such as IC1000, or a material having abrasive grains fixed thereto or impregnated therein. Upon relative movements of the polishing surface and the semiconductor substrate W, polishing is performed. At this time, silica, alumina, ceria, or the like is used as abrasive grains or a slurry. A chemical liquid is adjusted depending on a type of film to be polished.

Detection of an end point of the secondary polishing is performed by measuring a film thickness of the barrier layer mainly with use of an optical film thickness measuring instrument, and detecting a film thickness which has become zero, or a surface of an insulating film comprising $SiO_2$ is exposed. Furthermore, a film thickness measuring instrument with an image processing function is used as the film thickness measuring instrument 711-4 provided near the polishing table 711-1. By use of this measuring instrument, measurement of an oxide film is made, and results are stored as processing records of the semiconductor substrate W, and used for judging whether or not the semiconductor substrate W for which secondary polishing has been finished can be transferred to a subsequent step. If the end point of the secondary polishing is not reached, repolishing is performed. If over-polishing has been performed beyond a prescribed value due to any abnormality, then the semiconductor substrate processing apparatus is stopped to avoid next polishing so that defective products will not increase.

After completion of the secondary polishing, the semiconductor substrate W is moved to the pusher 711-5 by the top ring 711-2. The second robot 708 picks up the semiconductor substrate W on the pusher 711-5. At this time, a chemical liquid may be ejected toward the face and backside of the semiconductor substrate W on the pusher 711-5 to remove particles therefrom or cause particles to be difficult to adhere thereto.

The second robot 708 carries the semiconductor substrate W into the second cleaning machine 707 where cleaning of the semiconductor substrate W is performed. A constitution of the second cleaning machine 707 is also the same as the constitution of the first cleaning machine 709. The face of the semiconductor substrate W is scrubbed with PVA sponge rolls using a cleaning liquid comprising pure water to which a surface active agent, a chelating agent, or a pH regulating agent is added. A strong chemical liquid such as DHF is ejected from a nozzle toward the backside of the semiconductor substrate W to perform etching of diffused Cu thereon. If there is no problem of diffusion, scrubbing cleaning is performed with the PVA sponge rolls using the same chemical liquid as that used for the face.

After completion of the above cleaning, the second robot 708 picks up the semiconductor substrate W and transfers it to the reversing machine 706, and the reversing machine 706 reverses the semiconductor substrate W. The semiconductor substrate W which has been reversed is picked up by the first robot 703, and transferred to the third cleaning machine 704. In the third cleaning machine 704, megasonic water excited by ultrasonic vibrations is ejected toward the face of the semiconductor substrate W to clean the semiconductor substrate W. At this time, the face of the semiconductor substrate W may be cleaned with a known pencil type sponge using a cleaning liquid comprising pure water to which a surface active agent, a chelating agent, or a pH regulating agent is added. Thereafter, the semiconductor substrate W is dried by performing spin-drying.

As described above, if the film thickness has been measured with the film thickness measuring instrument 711-4 provided near the polishing table 711-1, then the semiconductor substrate W is not subjected to further processing and is accommodated into the cassette placed on the unloading port of the loading/unloading section 701.

Figure 26:
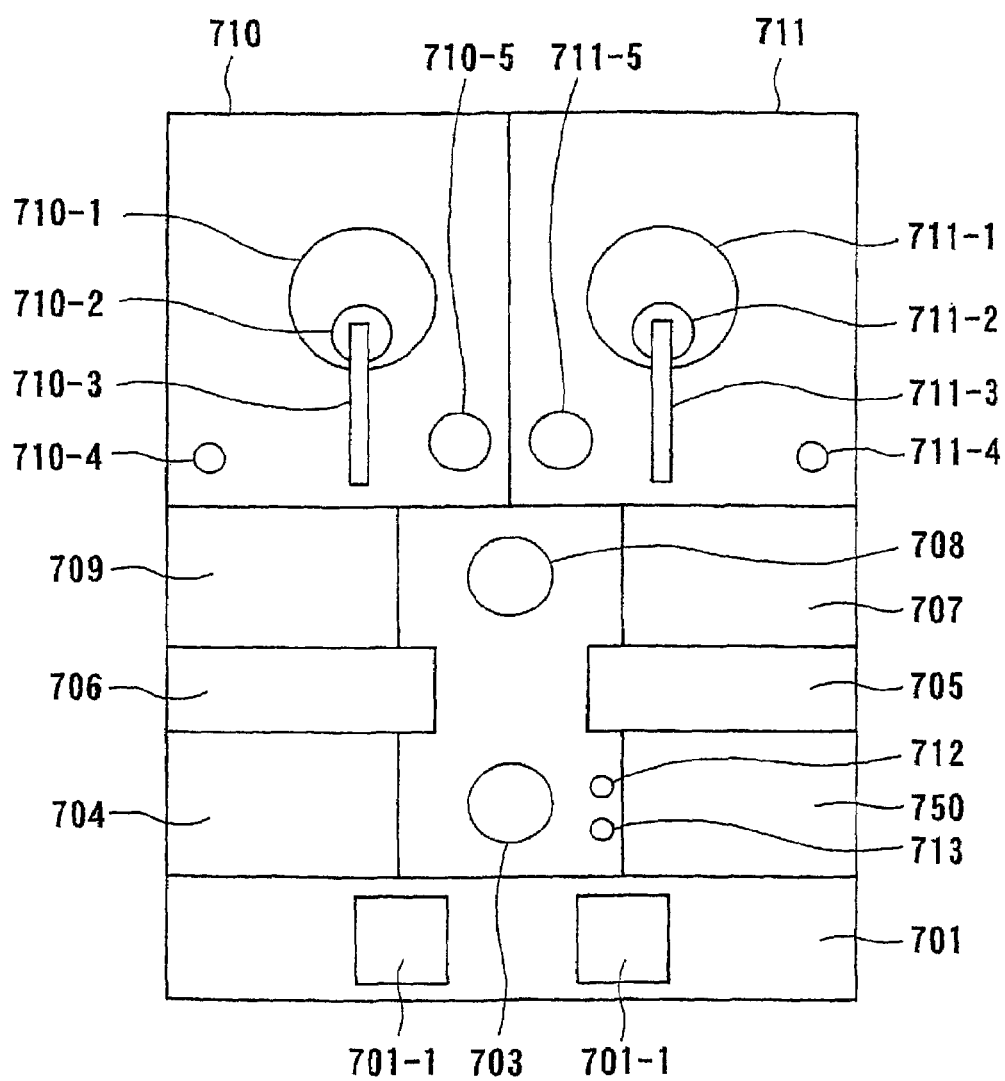
FIG. 26 is a view showing another plan constitution example of the semiconductor substrate processing apparatus.

FIG. 26 is a view showing a plan constitution of another example of a semiconductor substrate processing apparatus. This substrate processing apparatus differs from the substrate processing apparatus shown in FIG. 25 in that a cap plating unit 750 is provided instead of the plated Cu film forming unit 702 in FIG. 25.

A cassette 701-1 accommodating semiconductor substrates W each formed with a plated Cu film is placed on a load port of a loading/unloading section 701. A semiconductor substrate W removed from the cassette 701-1 is transferred to first polishing apparatus 710 or second polishing apparatus 711 in which a surface of the plated Cu film is polished. After completion of polishing of the plated Cu film, the semiconductor substrate W is cleaned in first cleaning machine 709.

After completion of cleaning in the first cleaning machine 709, the semiconductor substrate W is transferred to the cap plating unit 750 where cap plating is applied onto a surface of the plated Cu film with an aim of preventing oxidation of the plated Cu film due to an atmosphere. The semiconductor substrate to which cap plating has been applied is carried by the second robot 708 from the cap plating unit 750 to second cleaning unit 707 where it is cleaned with pure water or deionized water. The semiconductor substrate after completion of this cleaning is returned into the cassette 701-1 placed on the loading/unloading section 701.

Figure 27:
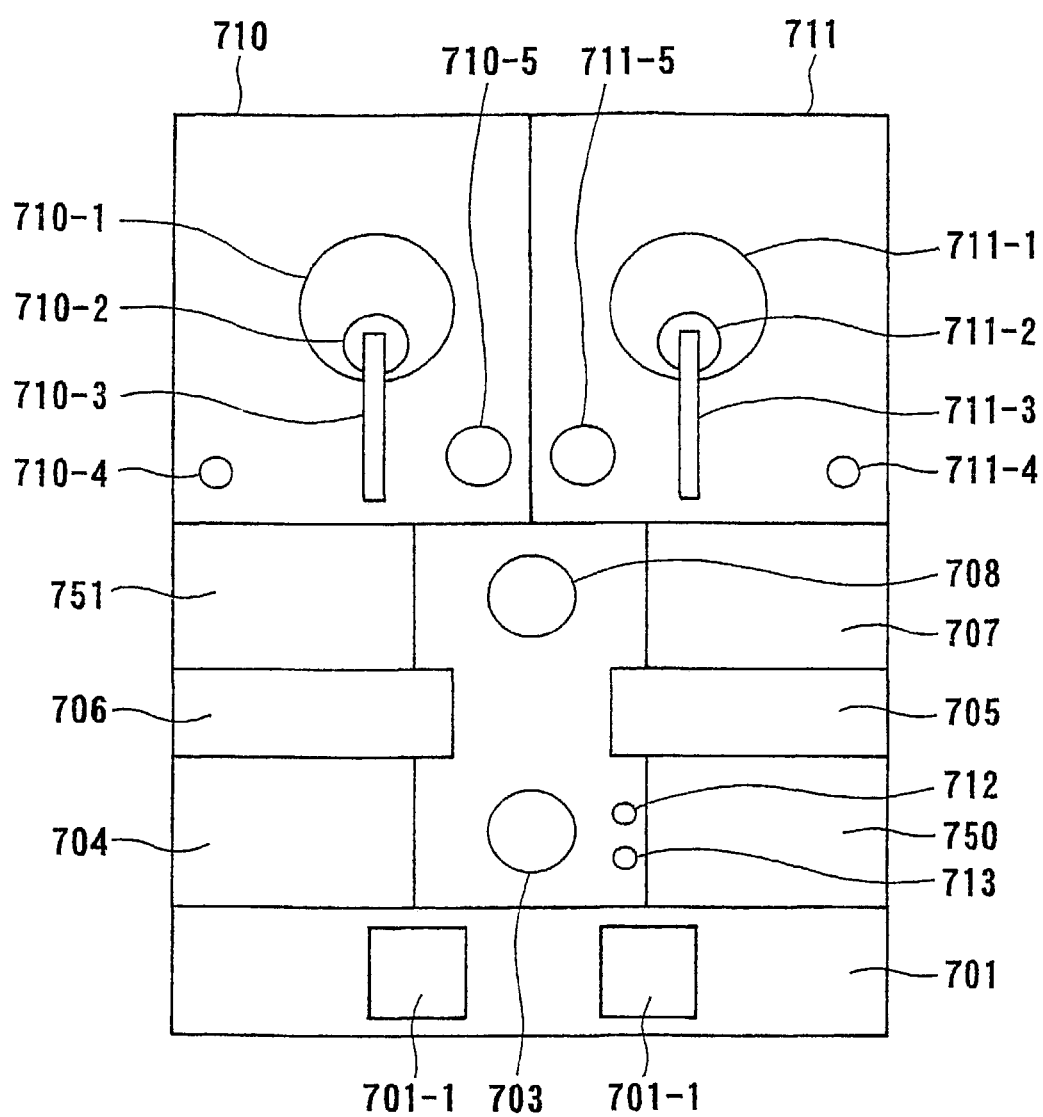
FIG. 27 is a view showing still another plan constitution example of the semiconductor substrate processing apparatus.

FIG. 27 is a view showing a plan constitution of still another example of a semiconductor substrate processing apparatus. This substrate processing apparatus differs from the substrate processing apparatus shown in FIG. 26 in that an annealing unit 751 is provided instead of the third cleaning machine 709 in FIG. 26.

The semiconductor substrate W, which is polished in the polishing unit 710 or 711, and cleaned in the first cleaning machine 709 described above, is transferred to the cap plating unit 750 where a cap plating is applied onto the surface of the plated Cu film. The semiconductor substrate to which the cap plating has been applied is carried by the second robot 732 from the cap plating unit 750 to the first cleaning unit 707 where it is cleaned.

After completion of cleaning in the first cleaning unit 707, the semiconductor substrate W is transferred to the annealing unit 751 in which the substrate is annealed, whereby the plated Cu film is alloyed so as to increase an electromigration resistance of the plated Cu film. The semiconductor substrate W to which an annealing treatment has been applied is carried from the annealing unit 751 to the second cleaning unit 707 where it is cleaned with pure water or deionized water. The semiconductor substrate W after completion of cleaning is returned into the cassette 701-1 placed on the loading/unloading section 701.

Figure 28:
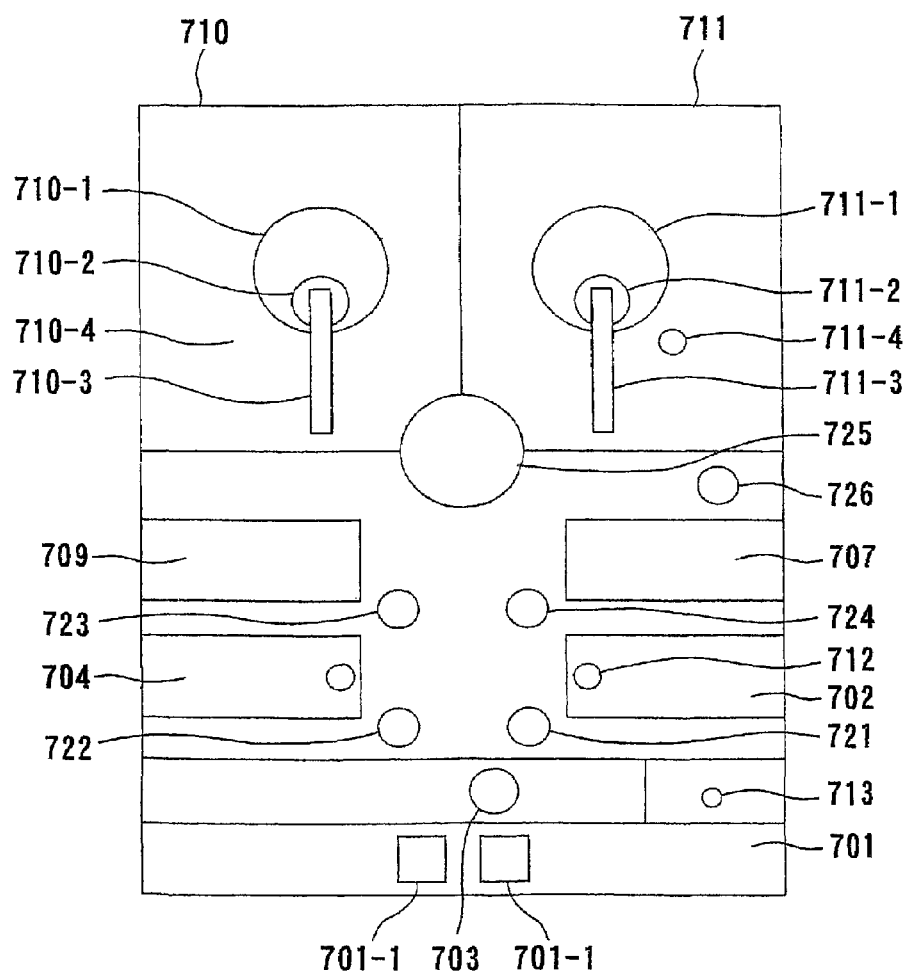
FIG. 28 is a view showing still another plan constitution example of the semiconductor substrate processing apparatus.

FIG. 28 is a view showing a plan layout constitution of another example of the substrate processing apparatus. In FIG. 28, portions denoted by the same reference numerals as those in FIG. 25 show the same or corresponding portions. In this substrate processing apparatus, a pusher indexer 725 is disposed close to a first polishing apparatus 710 and a second polishing apparatus 711. Substrate placement tables 721, 722 are disposed close to a third cleaning machine 704 and a plated Cu film forming unit 702, respectively. A robot 723 is disposed close to a first cleaning machine 709 and the third cleaning machine 704. Further, a robot 724 is disposed close to a second cleaning machine 707 and plated Cu film forming unit 702, and a dry state film thickness measuring instrument 713 is disposed close to a loading/unloading section 701 and a first robot 703.

In the substrate processing apparatus of the above constitution, the first robot 703 removes a semiconductor substrate W from a cassette 701-1 placed on a load port of loading/unloading section 701. After film thicknesses of a barrier layer and a seed layer are measured with the dry state film thickness measuring instrument 713, the first robot 703 places the semiconductor substrate W on the substrate placement table 721. In a case where the dry state film thickness measuring instrument 713 is provided on a hand of the first robot 703, the film thicknesses are measured thereon, and the substrate is placed on the substrate placement table 721. The second robot 723 transfers the semiconductor substrate W on the substrate placement table 721 to the plated Cu film forming unit 702 in which a plated Cu film is formed. After formation of the plated Cu film, a film thickness of the plated Cu film is measured with a before-plating and after-plating film thickness measuring instrument 712. Then, the second robot 723 transfers the semiconductor substrate W to the pusher indexer 725 and loads it thereon.

[Serial Mode]

In a serial mode, a top ring head 710-2 holds semiconductor substrate W on the pusher indexer 725 by suction, transfers it to a polishing table 710-1, and presses the semiconductor substrate W against a polishing surface on the polishing table 710-1 to perform polishing. Detection of an end point of polishing is performed by the same method as described above. The semiconductor substrate W after completion of polishing is transferred to the pusher indexer 725 by the top ring head 710-2, and loaded thereon. The second robot 723 removes the semiconductor substrate W, and carries it into the first cleaning machine 709 for cleaning. Then, the semiconductor substrate W is transferred to the pusher indexer 725, and loaded thereon.

A top ring head 711-2 holds the semiconductor substrate W on the pusher indexer 725 by suction, transfers it to a polishing table 711-1, and presses the semiconductor substrate W against a polishing surface on the polishing table 711-1 to perform polishing. Detection of an end point of polishing is performed by the same method as described above. The semiconductor substrate W after completion of polishing is transferred to the pusher indexer 725 by the top ring head 711-2, and loaded thereon. The third robot 724 picks up the semiconductor substrate W, and its film thickness is measured with a film thickness measuring instrument 726. Then, the semiconductor substrate W is carried into the second cleaning machine 707 for cleaning. Thereafter, the semiconductor substrate W is carried into the third cleaning machine 704, where it is cleaned and then dried by performing spin-drying. Then, the semiconductor substrate W is picked up by the third robot 724, and placed on the substrate placement table 722.

[Parallel Mode]

In a parallel mode, the top ring head 710-2 or 711-2 holds semiconductor substrate W on the pusher indexer 725 by suction, transfers it to the polishing table 710-1 or 711-1, and presses the semiconductor substrate W against the polishing surface on the polishing table 710-1 or 711-1 to perform polishing. After measurement of a film thickness, the third robot 724 picks up the semiconductor substrate W, and places it on the substrate placement table 722.

The first robot 703 transfers the semiconductor substrate W on the substrate placement table 722 to the dry state film thickness measuring instrument 713. After a film thickness is measured, the semiconductor substrate W is returned to the cassette 701-1 of the loading/unloading section 701.

Figure 29:
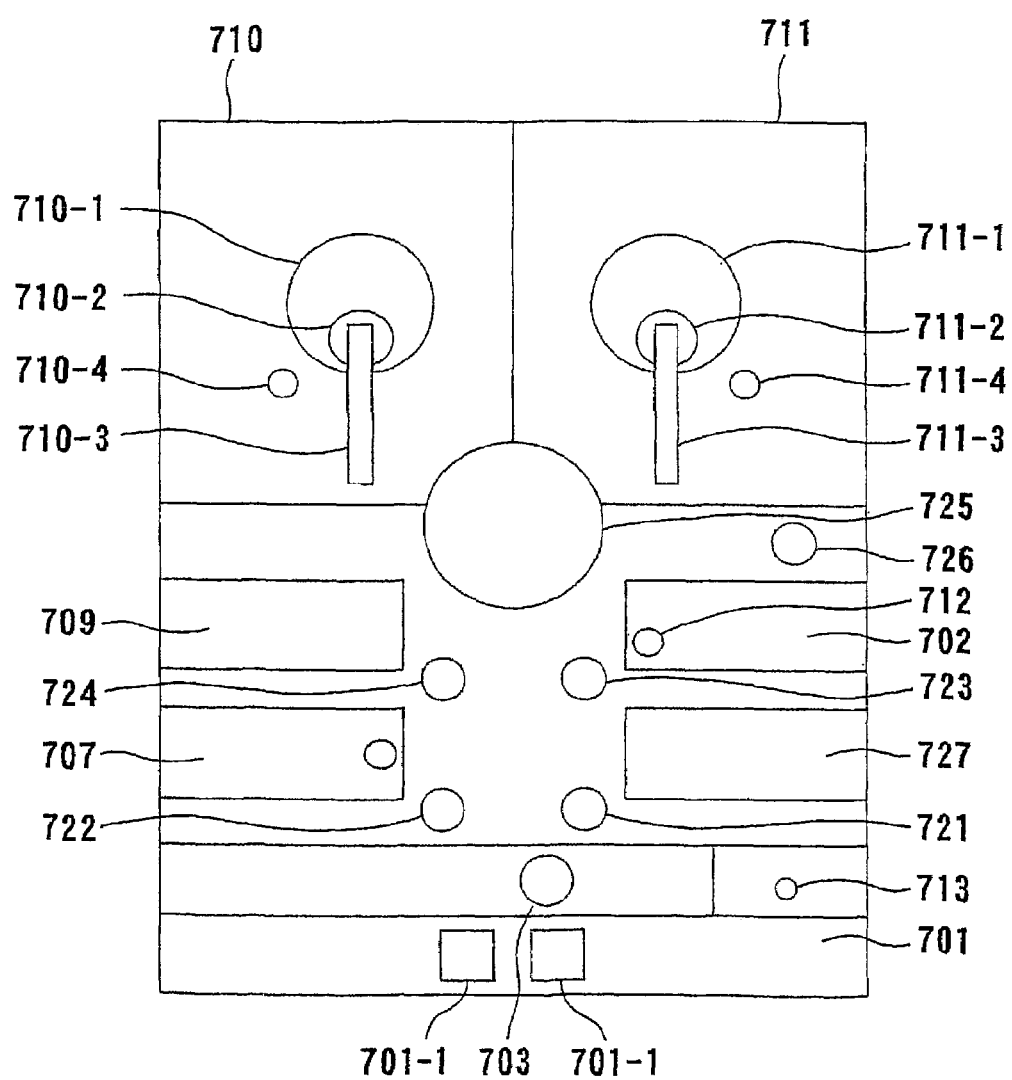
FIG. 29 is a view showing still another plan constitution example of the semiconductor substrate processing apparatus.

FIG. 29 is a view showing another plan layout constitution of the substrate processing apparatus. This substrate processing apparatus is such a substrate processing apparatus which forms a seed layer and a plated Cu film on a semiconductor substrate W having no seed layer formed thereon, and polishes these films to form interconnects.

In the substrate polishing apparatus, a pusher indexer 725 is disposed close to a first polishing apparatus 710 and a second polishing apparatus 711, substrate placement tables 721, 722 are disposed close to a second cleaning machine 707 and a seed layer forming unit 727, respectively, and a robot 723 is disposed close to the seed layer forming unit 727 and a plated Cu film forming unit 702. Further, a robot 724 is disposed close to a first cleaning machine 709 and the second cleaning machine 707, and a dry state film thickness measuring instrument 713 is disposed close to a loading/unloading section 701 and a first robot 703.

The first robot 703 removes a semiconductor substrate W having a barrier layer thereon from a cassette 701-1 placed on a load port of the loading/unloading section 701, and places it on the substrate placement table 721. Then, the second robot 723 transports the semiconductor substrate W to the seed layer forming unit 727 where a seed layer is formed. The seed layer is formed by performing electroless plating. The second robot 723 enables the semiconductor substrate having the seed layer formed thereon to be measured in terms of thickness of the seed layer by before-plating and after-plating film thickness measuring instrument 712. After measurement of this film thickness, the semiconductor substrate is carried into the plated Cu film forming unit 702 where a plated Cu film is formed.

After formation of the plated Cu film, its film thickness is measured, and the semiconductor substrate is transferred to the pusher indexer 725. A top ring 710-2 or 711-2 holds the semiconductor substrate W on the pusher indexer 725 by suction, and transfers it to a polishing table 710-1 or 711-1 to perform polishing. After polishing, the top ring 710-2 or 711-2 transfers the semiconductor substrate W to a film thickness measuring instrument 710-4 or 711-4 to measure a film thickness. Then, the top ring 710-2 or 711-2 transfers the semiconductor substrate W to the pusher indexer 725, and places it thereon.

Then, the third robot 724 picks up the semiconductor substrate W from the pusher indexer 725, and carries it into the first cleaning machine 709. The third robot 724 picks up a cleaned semiconductor substrate W from the first cleaning machine 709, carries it into the second cleaning machine 707, and places a cleaned and dried semiconductor substrate on the substrate placement table 722. Then, the first robot 703 picks up the semiconductor substrate W, and transfers it to the dry state film thickness measuring instrument 713 in which a film thickness is measured, and the first robot 703 carries the substrate into the cassette 701-1 placed on an unload port of the loading/unloading section 701.

In the substrate processing apparatus shown in FIG. 29, interconnects are formed by forming a barrier layer, a seed layer and a plated Cu film on a semiconductor substrate W having a via hole or a trench of a circuit pattern formed therein, and polishing these layers.

The cassette 701-1 accommodating semiconductor substrates W before formation of the barrier layer is placed on the load port of the loading/unloading section 701. The first robot 703 removes semiconductor substrate W from the cassette 701-1 placed on the load port of the loading/unloading section 701, and places it on the substrate placement table 721. Then, the second robot 723 transports the semiconductor substrate W to the seed layer forming unit 727 where a barrier layer and a seed layer are formed. The barrier layer and the seed layer are formed by performing electroless plating. The second robot 723 brings the semiconductor substrate W having the barrier layer and the seed layer formed thereon to the before-plating and after-plating film thickness measuring instrument 712 which measures film thicknesses of the barrier layer and the seed layer. After measurement of the film thicknesses, the semiconductor substrate W is carried into the plated Cu film forming unit 702 where a plated Cu film is formed.

Figure 30:
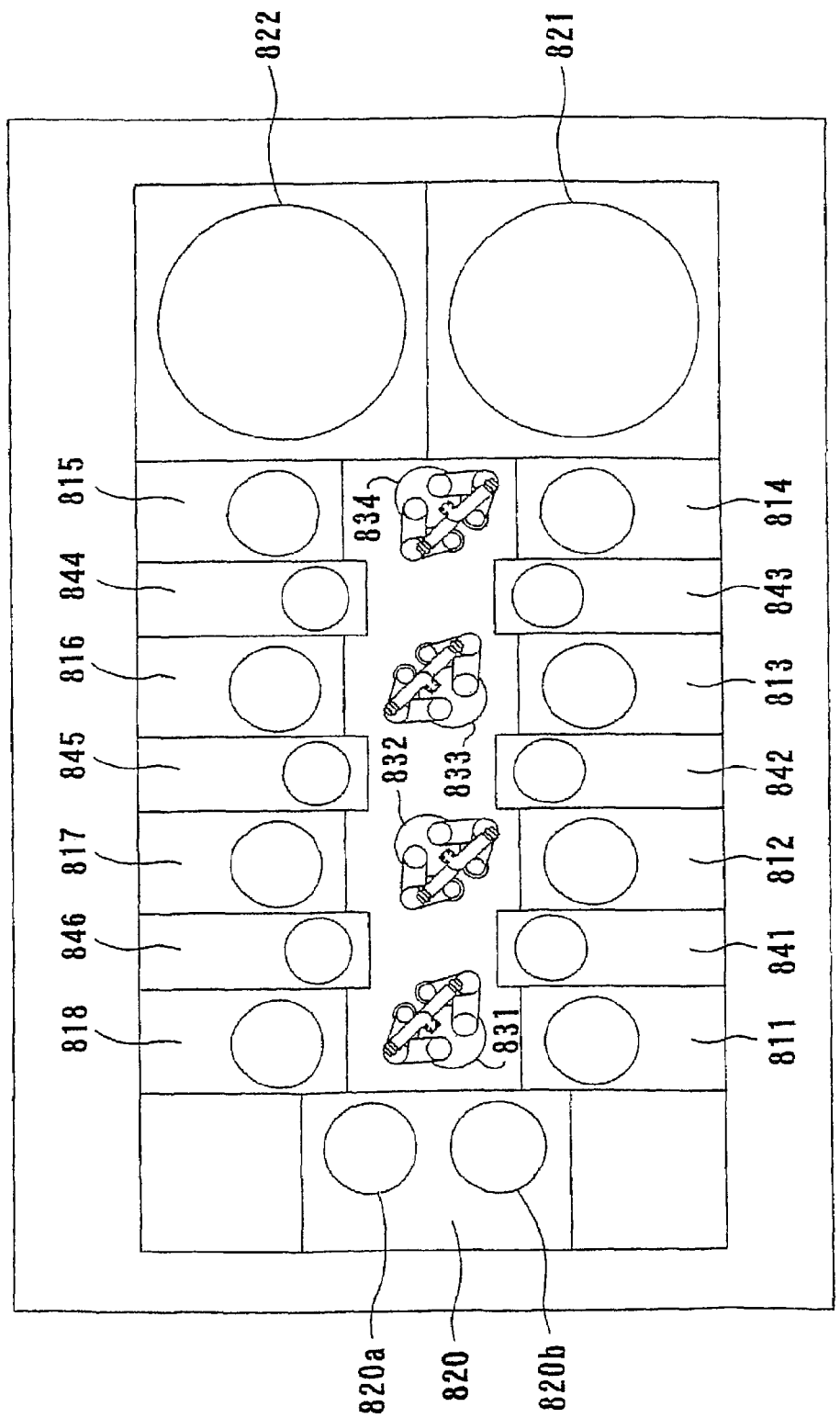
FIG. 30 is a view showing still another plan constitution example of the semiconductor substrate processing apparatus.

FIG. 30 is a view showing a plan layout constitution of another example of the substrate processing apparatus. In this substrate processing apparatus, there are provided a barrier layer forming unit 811, a seed layer forming unit 812, a plated film forming unit 813, an annealing unit 814, a first cleaning unit 815, a bevel and backside cleaning unit 816, a cap plating unit 817, a second cleaning unit 818, a first aligner and film thickness measuring instrument 841, a second aligner and film thickness measuring instrument 842, a first substrate reversing machine 843, a second substrate reversing machine 844, a substrate temporary placement table 845, a third film thickness measuring instrument 846, a loading/unloading section 820, a first polishing apparatus 821, a second polishing apparatus 822, a first robot 831, a second robot 832, a third robot 833, and a fourth robot 834. The film thickness measuring instruments 841, 842, and 846 are units, have the same size as a frontage dimension of other units (plating, cleaning, annealing units, and the like), and are thus interchangeable.

In this example, an electroless Ru plating apparatus can be used as the barrier layer forming unit 811, an electroless Cu plating apparatus as the seed layer forming unit 812, and an electroplating apparatus as the plated film forming unit 813.

Figure 31:
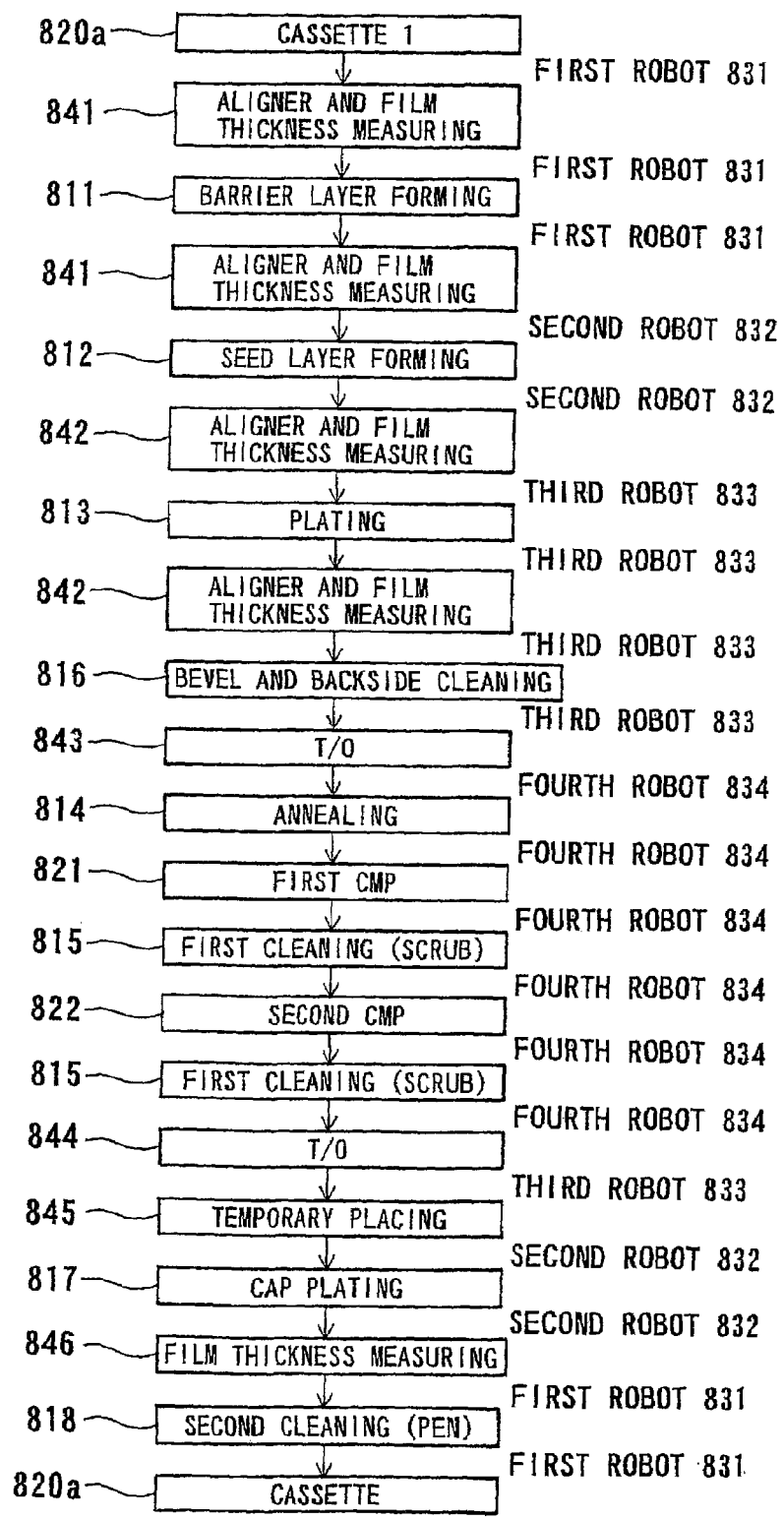
FIG. 31 is a view showing a flow of respective steps in the semiconductor substrate processing apparatus illustrated in FIG. 30.

FIG. 31 is a flow chart showing flow of respective steps in the present substrate processing apparatus. The respective steps in the apparatus will be described according to this flow chart. First, a semiconductor substrate removed by the first robot 831 from a cassette 820a placed on the load and unload unit 820 is placed in the first aligner and film thickness measuring unit 841, in such a state that its surface, to be plated, faces upward. In order to set a reference point for a position at which film thickness measurement is made, notch alignment for film thickness measurement is performed, and then film thickness data on the semiconductor substrate before formation of a Cu film are obtained.

Then, the semiconductor substrate is transported to the barrier layer forming unit 811 by the first robot 831. The barrier layer forming unit 811 is such an apparatus for forming a barrier layer on the semiconductor substrate by performing electroless Ru plating, and the barrier layer forming unit 811 forms an Ru film as a film for preventing Cu from diffusing into an interlayer insulator film (e.g. $SiO_2$) of a semiconductor device. The semiconductor substrate discharged after cleaning and drying steps are performed is transported by the first robot 831 to the first aligner and film thickness measuring unit 841, where a film thickness of the semiconductor substrate, i.e., a film thickness of the barrier layer is measured.

The semiconductor substrate after film thickness measurement is carried into the seed layer forming unit 812 by the second robot 832, and a seed layer is formed on the barrier layer by performing electroless Cu plating. The semiconductor substrate discharged after cleaning and drying steps are performed is transported by the second robot 832 to the second aligner and film thickness measuring instrument 842 for determination of a notch position, before the semiconductor substrate is transported to the plated film forming unit 813, which is an impregnation plating unit, and then notch alignment for Cu plating is performed by the film thickness measuring instrument 842. If necessary, a film thickness of the semiconductor substrate before formation of a Cu film may be measured again in the film thickness measuring instrument 842.

The semiconductor substrate which has completed notch alignment is transported by the third robot 833 to the plated film forming unit 813 where Cu plating is applied to the semiconductor substrate. The semiconductor substrate discharged after cleaning and drying steps are performed is transported by the third robot 833 to the bevel and backside cleaning unit 816 where an unnecessary Cu film (seed layer) at a peripheral portion of the semiconductor substrate is removed. In the bevel and backside cleaning unit 816, a bevel is etched in a preset time, and Cu adhering to the backside of the semiconductor substrate is cleaned with a chemical liquid such as hydrofluoric acid. At this time, before transporting the semiconductor substrate to the bevel and backside cleaning unit 816, film thickness measurement of the semiconductor substrate may be made by the second aligner and film thickness measuring instrument 842 to obtain a thickness value of the Cu film formed by plating, and based on these obtained results, a bevel etching time may be changed arbitrarily to perform etching. A region etched by bevel etching is a region which corresponds to a peripheral edge portion of the substrate and has no circuit formed therein, or a region which is not utilized finally as a chip although a circuit is formed. A bevel portion is included in this region.

The semiconductor substrate discharged after cleaning and drying steps are performed in the bevel and backside cleaning unit 816 is transported by the third robot 833 to the substrate reversing machine 843. After the semiconductor substrate is turned over by the substrate reversing machine 843 to cause a plated surface to be directed downward, the semiconductor substrate is introduced into the annealing unit 814 by the fourth robot 834 for thereby stabilizing an interconnection portion. Before and/or after an annealing treatment, the semiconductor substrate is carried into the second aligner and film thickness measuring unit 842 where a film thickness of a copper film formed on the semiconductor substrate is measured. Then, the semiconductor substrate is carried by the fourth robot 834 into the first polishing apparatus 821 in which the Cu film and the seed layer of the semiconductor substrate are polished.

At this time, desired abrasive grains or the like are used, but fixed abrasive may be used in order to prevent dishing and enhance flatness of a face of the substrate. After completion of primary polishing, the semiconductor substrate is transported by the fourth robot 834 to the first cleaning unit 815 where it is cleaned. This cleaning is scrub-cleaning in which rolls having substantially the same length as a diameter of the semiconductor substrate are placed on the face and the backside of the semiconductor substrate, and the semiconductor substrate and the rolls are rotated, while pure water or deionized water is flowed, thereby performing cleaning of the semiconductor substrate.

After completion of this primary cleaning, the semiconductor substrate is transported by the fourth robot 834 to the second polishing apparatus 822 where the barrier layer on the semiconductor substrate is polished. At this time, desired abrasive grains or the like are used, but fixed abrasive may be used in order to prevent dishing and enhance flatness of the face of the substrate. After completion of this secondary polishing, the semiconductor substrate is transported by the fourth robot 834 again to the first cleaning unit 815 where scrub-cleaning is performed. After completion of this cleaning, the semiconductor substrate is transported by the fourth robot 834 to the second substrate reversing machine 844 where the semiconductor substrate is reversed to cause the plated surface to be directed upward, and then the semiconductor substrate is placed on the substrate temporary placement table 845 by the third robot.

The semiconductor substrate is transported by the second robot 832 from the substrate temporary placement table 845 to the cap plating unit 817 where cap plating is applied onto a Cu surface with an aim of preventing oxidation of Cu due to an atmosphere. The semiconductor substrate to which cap plating has been applied is carried by the second robot 832 from the cover plating unit 817 to the third film thickness measuring instrument 146 where a thickness of the copper film is measured. Thereafter, the semiconductor substrate is carried by the first robot 831 into the second cleaning unit 818 where it is cleaned with pure water or deionized water. The semiconductor substrate after completion of this cleaning is returned into cassette 820a placed on the loading/unloading section 820.

The aligner and film thickness measuring instrument 841 and the aligner and film thickness measuring instrument 842 perform positioning of a notch portion of a substrate and measurement of a film thickness.

The seed layer forming unit 182 may be omitted. In this case, a plated film may be formed on a barrier layer directly in a plated film forming unit 817.

Figure 32:
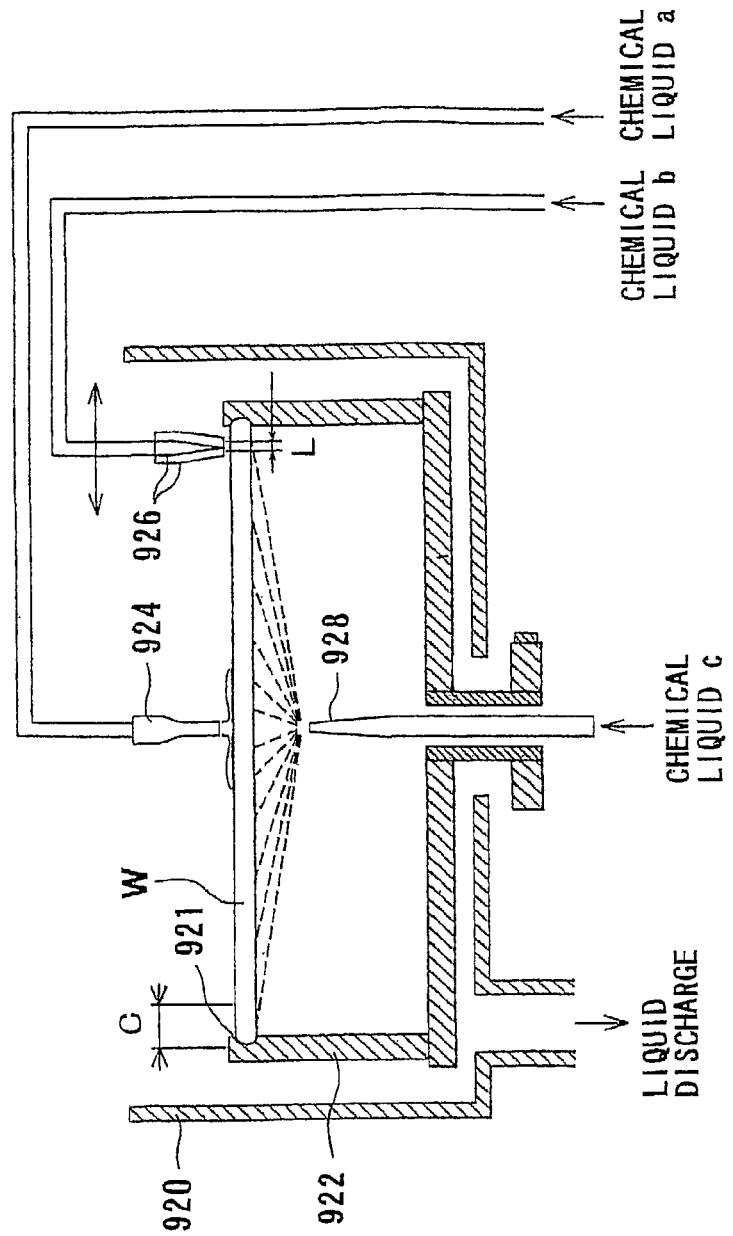
FIG. 32 is a view showing a schematic constitution example of a bevel and backside cleaning unit.

The bevel and backside cleaning unit 816 can perform an edge (bevel) Cu etching and a backside cleaning at the same time, and can suppress growth of a natural oxide film of copper at a circuit formation portion on a surface of the substrate. FIG. 32 shows a schematic view of the bevel and backside cleaning unit 816. As shown in FIG. 32, the bevel and backside cleaning unit 816 has: a substrate holding portion 922 positioned inside a bottomed cylindrical waterproof cover 920 and adapted to rotate a substrate W at a high speed, in such a state that a face of the substrate W faces upwardly, while holding the substrate w horizontally by spin chucks 921 at a plurality of locations along a circumferential direction of a peripheral edge portion of the substrate; a center nozzle 924 placed above a nearly central portion of the face of the substrate W held by the substrate holding portion 922; and an edge nozzle 926 placed above the peripheral edge portion of the substrate W. The center nozzle 924 and the edge nozzle 926 are directed downward. A back nozzle 928 is positioned below a nearly central portion of a backside of the substrate W, and directed upward. The edge nozzle 926 is adapted to be movable in a diametrical direction and a height direction of the substrate W.

A width of movement L of the edge nozzle 926 is set such that the edge nozzle 926 can be arbitrarily positioned in a direction toward a center from an outer peripheral end surface of the substrate, and a set value for L is inputted according to size, usage, or the like of the substrate W. Normally, an edge cut width C is set in the range of 2 mm to 5 mm. In a case where a rotational speed of the substrate is a certain value or higher at which an amount of liquid migration from the backside to the face is not problematic, copper film within the edge cut width C can be removed.

Next, a method of cleaning with this cleaning apparatus will be described. First, semiconductor substrate W is horizontally rotated integrally with the substrate holding portion 922, with the substrate being held horizontally by the spin chucks 921 of the substrate holding portion 922. In this state, an acid solution is supplied from the center nozzle 924 to a central portion of a face of the substrate W. The acid solution may be a non-oxidizing acid, and hydrofluoric acid, hydrochloric acid, sulfuric acid, citric acid, oxalic acid, or the like is used. On the other hand, an oxidizing agent solution is supplied continuously or intermittently from the edge nozzle 926 to a peripheral edge portion of the substrate W. As the oxidizing agent solution, one of an aqueous solution of ozone, an aqueous solution of hydrogen peroxide, an aqueous solution of nitric acid, and an aqueous solution of sodium hypochlorite is used, or a combination of these is used.

In this manner, a copper film, or the like formed on an upper surface and end surface in a region of peripheral edge portion C of the semiconductor substrate W is rapidly oxidized with the oxidizing agent solution, and is simultaneously etched with the acid solution supplied from the center nozzle 924 and spread over an entire face of the substrate, whereby it is dissolved and removed. By mixing the acid solution and the oxidizing agent solution at the peripheral edge portion of the substrate, a steep etching profile can be obtained, in comparison with a mixture of these solutions which in advance of being supplied. At this time, a copper etching rate is determined by concentrations of these solutions. If a natural oxide film of copper is formed in the circuit-formed portion on the face of the substrate, this natural oxide film is immediately removed by the acid solution spreading over the entire face of the substrate according to rotation of the substrate, and does not grow any more. After supply of the acid solution from the center nozzle 924 is stopped, supply of the oxidizing agent solution from the edge nozzle 926 is stopped. As a result, silicon exposed on the surface is oxidized, and deposition of copper can be suppressed.

On the other hand, an oxidizing agent solution and a silicon oxide film etching agent are supplied simultaneously or alternately from the back nozzle 928 to the central portion of the backside of the substrate. Therefore, copper or the like adhering in a metal form to the backside of the semiconductor substrate W can be oxidized with the oxidizing agent solution, together with silicon of the substrate, and can be etched and removed with the silicon oxide film etching agent. This oxidizing agent solution is preferably the same as the oxidizing agent solution supplied to the face, because the types of chemicals are decreased in number. Hydrofluoric acid can be used as the silicon oxide film etching agent, and if hydrofluoric acid is used as the acid solution on the face of the substrate, types of chemicals can be decreased in number. Thus, if supply of the oxidizing agent is stopped first, a hydrophobic surface is obtained. If the etching agent solution is stopped first, a water-saturated surface (a hydrophilic surface) is obtained, and thus the backside surface can be adjusted to a condition which will satisfy requirements of a subsequent process.

In this manner, the acid solution, i.e., etching solution is supplied to the substrate to remove metal ions remaining on the surface of the substrate W. Then, pure water is supplied to replace the etching solution with pure water and remove the etching solution, and then the substrate is dried by performing spin-drying. In this way, removal of the copper film in the edge cut width C at the peripheral edge portion on the face of the semiconductor substrate, and removal of copper contaminants on the backside are performed simultaneously to thus allow this treatment to be completed, for example, within 80 seconds. The etching cut width of the edge can be set arbitrarily (to 2 mm to 5 mm), but a time required for etching does not depend on the cut width.

An annealing treatment performed before a CMP process and after plating has a favorable effect on a subsequent CMP treatment and on electrical characteristics of interconnection. Observation of a surface of broad interconnection (unit of several micrometers) after the CMP treatment without annealing showed many defects such as microvoids, which resulted in an increase in electrical resistance of an entire interconnection. Execution of annealing ameliorated this increase in the electrical resistance. In the absence of annealing, a thin interconnection showed no voids. Thus, a degree of grain growth is presumed to be involved in these phenomena. That is, the following mechanism can be speculated: Grain growth is difficult to occur in a thin interconnection. In a broad interconnection, on the other hand, grain growth proceeds in accordance with an annealing treatment. During a process of grain growth, ultrafine pores in a plated film, which are too small to be seen by an SEM (scanning electron microscope), gather and move upward, thus forming microvoid-like depressions in an upper part of the interconnection. Annealing conditions in the annealing unit 814 are such that hydrogen (2% or less) is added in a gas atmosphere, a temperature is in the range of 300° C. to 400° C., and a time is in the range of 1 to 5 minutes. Under these conditions, the above effects were obtained.

Figure 35:
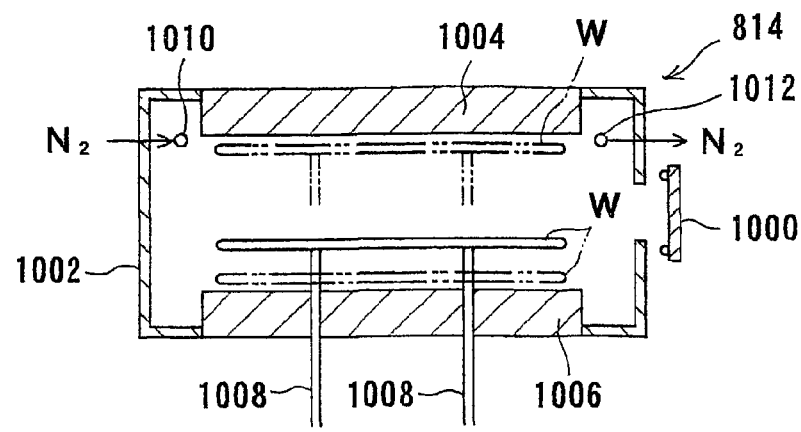
FIG. 35 is a vertical sectional view of an example of an annealing unit.
Figure 36:
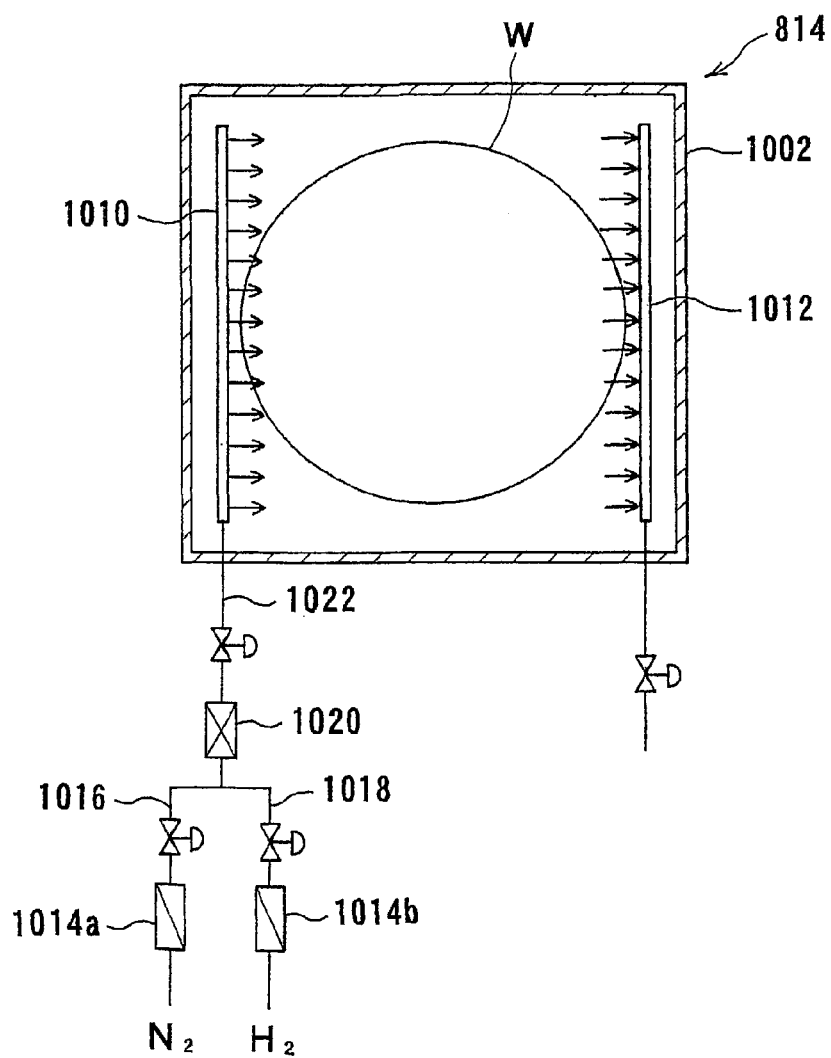
FIG. 36 is a transverse sectional view of the annealing unit.

FIGS. 35 and 36 show the annealing unit 814. The annealing unit 814 comprises a chamber 1002 having a gate 1000 for taking in and removing the semiconductor substrate W, a hot plate 1004 disposed at an upper position in the chamber 1002 for heating the semiconductor substrate W to e.g. 400° C., and a cool plate 1006 disposed at a lower position in the chamber 1002 for cooling the semiconductor substrate W by, for example, flowing a cooling water inside the plate. The annealing unit 814 also has a plurality of vertically movable elevating pins 1008 penetrating the cool plate 1006 and extending upward and downward therethrough for placing and holding the semiconductor substrate w thereon. The annealing unit further includes a gas introduction pipe 1010 for introducing an antioxidant gas between the semiconductor substrate W and the hot plate 1004 during annealing, and a gas discharge pipe 1012 for discharging gas which has been introduced from the gas introduction pipe 1010 and flowed between the semiconductor substrate W and the hot plate 1004. The pipes 1010 and 1012 are disposed on opposite sides of the hot plate 1004.

The gas introduction pipe 1010 is connected to a mixed gas introduction line 1022, which in turn is connected to a mixer 1020 where an $N_2$ gas introduced through a $N_2$ gas introduction line 1016 containing a filter 1014a, and an $H_2$ gas introduced through an $H_2$ gas introduction line 1018 containing a filter 1014b, are mixed to form a mixed gas which flows through the line 1022 into the gas introduction pipe 1010.

In operation, the semiconductor substrate W, which has been carried into the chamber 1002 through the gate 1000, is held on the elevating pins 1008 and the elevating pins 1008 are raised up to a position at which a distance between the semiconductor substrate W held on the lifting pins 1008 and the hot plate 1004 becomes e.g. 0.1–1.0 mm. In this state, the semiconductor substrate W is then heated to e.g. 400° C. through the hot plate 1004 and, at the same time, the antioxidant gas is introduced from the gas introduction pipe 1010 and the gas is allowed to flow between the semiconductor substrate W and the hot plate 1004 while the gas is discharged from the gas discharge pipe 1012, thereby annealing the semiconductor substrate W while preventing its oxidation. This annealing treatment may be completed in about several tens of seconds to 60 seconds. A heating temperature of the substrate may be selected in the range of 100–600° C.

After completion of this annealing, the elevating pins 1008 are lowered to a position at which a distance between the semiconductor substrate W held on the elevating pins 1008 and the cool plate 1006 becomes e.g. 0–0.5 mm. In this state, by introducing a cooling water into the cool plate 1006, the semiconductor substrate W is cooled by the cool plate to a temperature of at most 100° C. in e.g. 10–60 seconds. This cooled semiconductor substrate is sent to a next step.

A mixed gas of $N_2$ gas with several % of $H_2$ gas is used as the above antioxidant gas. However, $N_2$ gas may be used singly.

The annealing unit may be placed in the electroplating apparatus.

Figure 33:
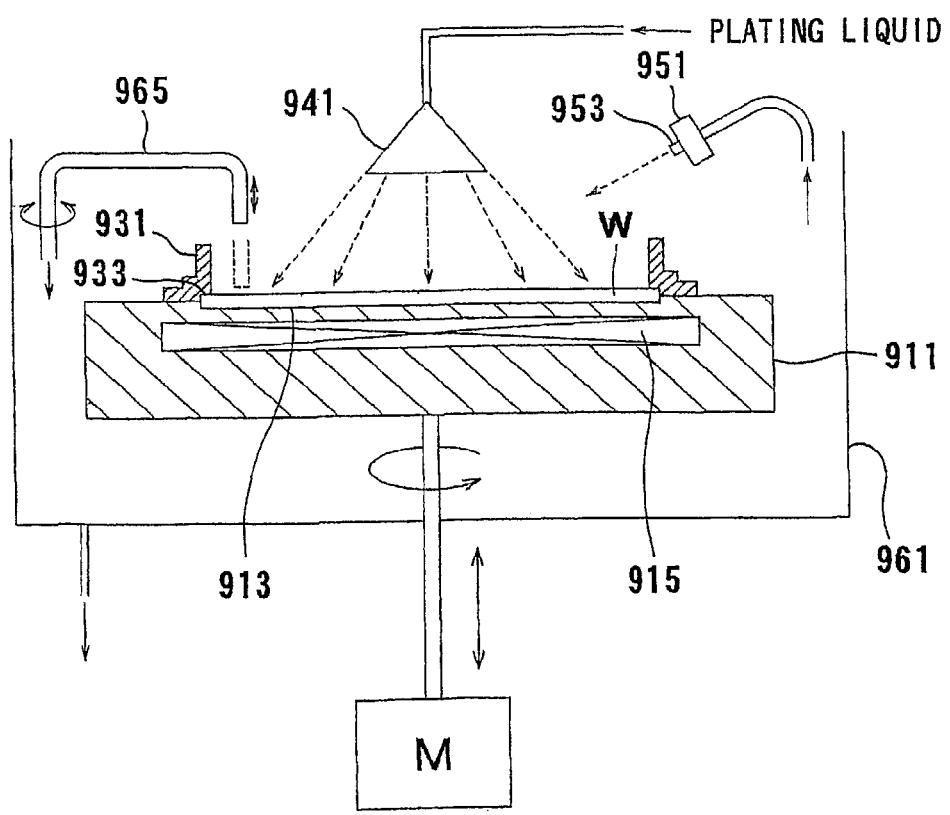
FIG. 33 is a view showing a schematic constitution of an example of an electroless plating apparatus.

FIG. 33 is a schematic constitution drawing of the electroless plating apparatus. As shown in FIG. 33, this electroless plating apparatus comprises a holding device 911 for holding a semiconductor substrate W to be plated on its upper surface, a dam member 931 for contacting a peripheral edge portion of a surface to be plated (upper surface) of the semiconductor substrate W held by the holding device 911 to seal the peripheral edge portion, and a shower head 941 for supplying a plating liquid to the surface, to be plated, of the semiconductor substrate W having the peripheral edge portion sealed with the dam member 931. The electroless plating apparatus further comprises a cleaning liquid supply device 951 disposed near an upper outer periphery of the holding device 911 for supplying a cleaning liquid to the surface, to be plated, of the semiconductor substrate W, a recovery vessel 961 for recovering a cleaning liquid or the like (plating waste liquid) discharged, a plating liquid recovery nozzle 965 for sucking in and recovering plating liquid held on the semiconductor substrate W, and a motor M for rotationally driving the holding device 911. These respective members will be described below.

The holding device 911 has a substrate placement portion 913 on its upper surface for placing and holding the semiconductor substrate W. The substrate placement portion 913 is adapted to place and fix the semiconductor substrate W. Specifically, the substrate placement portion 913 has a vacuum attracting mechanism (not shown) for attracting the semiconductor substrate W to a backside thereof by vacuum suction. A backside heater 915, which is planar and heats a surface, to be plated, of the semiconductor substrate W from underside to keep it warm, is installed on a backside of the substrate placement portion 913. The backside heater 915 is composed of, for example, a rubber heater. The holding device 911 is adapted to be rotated by the motor M and is movable vertically by a raising and lowering device (not shown).

The dam member 931 is tubular, has a seal portion 933 provided in a lower portion thereof for sealing an outer peripheral edge of the semiconductor substrate W, and is installed so as not to move vertically from its illustrated position.

The shower head 941 is of a structure having many nozzles provided at a front end for scattering supplied plating liquid in a shower form and supplying it substantially uniformly to the surface, to be plated, of the semiconductor substrate W. The cleaning liquid supply device 951 has a structure for ejecting a cleaning liquid from a nozzle 953.

The plating liquid recovery nozzle 965 is adapted to be movable upward and downward, and is swingable, and a front end of the plating liquid recovery nozzle 965 is adapted to be lowered inwardly of the dam member 931 located on an upper surface peripheral edge portion of the semiconductor substrate W, and to suck in plating liquid on the semiconductor substrate W.

Next, operation of the electroless plating apparatus will be described. First, the holding device 911 is lowered from its illustrated state to provide a gap of a predetermined dimension between the holding device 911 and the dam member 931, and the semiconductor substrate W is placed on and fixed to the substrate placement portion 913. An 8 inch substrate, for example, is used as the semiconductor substrate W.

Then, the holding device 911 is raised to bring its upper surface into contact with a lower surface of the dam member 931 as illustrated, and the outer periphery of the semiconductor substrate W is sealed with the seal portion 933 of the dam member 931. At this time, the surface of the semiconductor substrate W is in an open state.

Then, the semiconductor substrate W itself is directly heated by the backside heater 915 to render a temperature of the semiconductor substrate W, for example, 70° C. (maintained until termination of plating). Then, plating liquid heated, for example, to 50° C. is ejected from the shower head 941 to pour the plating liquid over substantially an entire surface of the semiconductor substrate W. Since the surface of the semiconductor substrate W is surrounded by the dam member 931, this poured plating liquid is all held on the surface of the semiconductor substrate W. An amount of this supplied plating liquid may be a small amount which will become 1 mm thick (about 30 ml) on the surface of the semiconductor substrate W. A depth of the plating liquid held on the surface to be plated may be at most 10 mm, and may be even 1 mm as in this embodiment. If a small amount of the supplied plating liquid is sufficient, a heating apparatus for heating the plating liquid may be of a small size. In this example, the temperature of the semiconductor substrate W is raised to 70° C., and the temperature of the plating liquid is raised to 50° C. by heating. Thus, the surface, to be plated, of the semiconductor substrate W becomes, for example, 60° C., and hence a temperature optimal for a plating reaction in this example can be achieved.

The semiconductor substrate W is instantaneously rotated by the motor M to perform uniform liquid wetting of the surface to be plated, and then plating of the surface to be plated is performed in such a state that the semiconductor substrate W is in a stationary state. Specifically, the semiconductor substrate W is rotated at at most 100 rpm for only 1 second to uniformly wet the surface, to be plated, of the semiconductor substrate W with the plating liquid. Then, the semiconductor substrate W is kept stationary, and electroless plating is performed for 1 minute. This instantaneous rotating time is at most 10 seconds.

After completion of this plating treatment, a front end of the plating liquid recovery nozzle 965 is lowered to an area near an inside of the dam member 931 on a peripheral edge portion of the semiconductor substrate W to suck in plating liquid. At this time, if the semiconductor substrate W is rotated at a rotational speed of, for example, at most 100 rpm, the plating liquid remaining on the semiconductor substrate W can be gathered in the portion of the dam member 931 on the peripheral edge portion of the semiconductor substrate W under centrifugal force, so that recovery of the plating liquid can be performed with a good efficiency and a high recovery rate. The holding device 911 is lowered to separate the semiconductor substrate W from the dam member 931. The semiconductor substrate W is started to be rotated, and the cleaning liquid (ultrapure water) is jetted at the plated surface of the semiconductor substrate W from the nozzle 953 of the cleaning liquid supply device 951 to cool the plated surface, and simultaneously perform dilution and cleaning, thereby stopping an electroless plating reaction. At this time, the cleaning liquid jetted from the nozzle 953 may be supplied to the dam member 931 to perform cleaning of the dam member 931 at the same time. Plating waste liquid at this time is recovered into the recovery vessel 961 and discarded.

Then, the semiconductor substrate W is rotated at a high speed by the motor M for spin-drying, and then the semiconductor substrate W is removed from the holding device 911.

FIG. 34 is a schematic constitution drawing of another electroless plating apparatus. The electroless plating apparatus of FIG. 34 is different from the electroless plating apparatus of FIG. 33 in that instead of providing the backside heater 915 in the holding device 911, lamp heaters 917 are disposed above the holding device 911, and the lamp heaters 917 and a shower head 941-2 are integrated. For example, a plurality of ring-shaped lamp heaters 917 having different radii are provided concentrically, and many nozzles 943-2 of the shower head 941-2 are open in a ring form from gaps between the lamp heaters 917. The lamp heaters 917 may be composed of a single spiral lamp heater, or may be composed of other lamp heaters of various structures and arrangements.

Even with this constitution, plating liquid can be supplied from each nozzle 943-2 to a surface, to be plated, of a semiconductor substrate W substantially uniformly in a shower form. Further, heating and heat retention of the semiconductor substrate W can be performed by the lamp heaters 917 directly uniformly. The lamp heaters 917 heat not only the semiconductor substrate W and the plating liquid, but also ambient air, thus exhibiting a heat retention effect on the semiconductor substrate W.

Direct heating of the semiconductor substrate W by the lamp heaters 917 requires that the lamp heaters 917 exhibit a relatively large electric power consumption. In place of such lamp heaters 917, lamp heaters 917 exhibiting a relatively small electric power consumption, and the backside heater 915 shown in FIG. 32, may be used in combination to heat the semiconductor substrate W mainly with the backside heater 915 and to perform heat retention of the plating liquid and ambient air mainly by the lamp heaters 917. In the same manner as in the aforementioned embodiment, devices for directly or indirectly cooling the semiconductor substrate W may be provided to perform temperature control.

The cap plating described above is preferably performed by an electroless plating process, but may be performed by an electroplating process.

Although certain preferred embodiments of the present invention have been shown and described in detail, it should be understood that various changes and modifications may be made therein without departing from the scope of the appended claims.

INDUSTRIAL APPLICABILITY

A substrate processing apparatus according to the present invention is suitably used for filling a metal such as copper or the like in interconnection recesses defined in a semiconductor substrate.

The invention claimed is:

1. A substrate processing apparatus for processing a substrate, said substrate processing apparatus comprising:
   a plating unit including
   (i) a plating section having a plating bath for holding a plating liquid therein,
   (ii) a head assembly for holding a substrate in contact with a substrate contact portion and a sealing member, and immersing the substrate in the plating liquid when in said plating bath so as to form a plated film on a surface of the substrate,
   (iii) a cleaning section for cleaning the substrate contact portion, the sealing member, and a peripheral edge of the substrate after the plated film is formed thereon, and
   (iv) a drive mechanism for moving said head assembly between said plating section and said cleaning section so as to transfer the substrate, while held by said head assembly, between said plating section and said cleaning section;
   a cleaning unit for cleaning the substrate after the plated film is formed thereon; and
   a transfer device for transferring the substrate, after the plated film is formed thereon, from said plating unit to said cleaning unit.

2. The substrate processing apparatus according to claim 1, further comprising:
   a cover for covering said plating section and said cleaning section.

3. The substrate processing apparatus according to claim 2, wherein
   said plating section and said cleaning section are separated from each other.

4. The substrate processing apparatus according to claim 3, wherein
   said plating unit includes a processing section in addition to said plating section and said cleaning section.

5. The substrate processing apparatus according to claim 4, further comprising:
   a loading/unloading unit for storing the substrate.

6. The substrate processing apparatus according to claim 5, wherein
   said drive mechanism is disposed outside of said cover.

7. The substrate processing apparatus according to claim 2, wherein
   said plating unit includes a processing section in addition to said plating section and said cleaning section.

8. The substrate processing apparatus according to claim 7, further comprising:
   a loading/unloading unit for storing the substrate.

9. The substrate processing apparatus according to claim 3, further comprising:
   a loading/unloading unit for storing the substrate.

10. The substrate processing apparatus according to claim 2, wherein
    said drive mechanism is disposed outside of said cover.

11. The substrate processing apparatus according to claim 10, wherein
    said plating section and said cleaning section are separated from each other.

12. The substrate processing apparatus according to claim 10, wherein
    said plating unit includes a processing section in addition to said plating section and said cleaning section.

13. The substrate processing apparatus according to claim 10, further comprising:
    a loading/unloading unit for storing the substrate.

14. The substrate processing apparatus according to claim 2, further comprising:
    a loading/unloading unit for storing the substrate.

15. The substrate processing apparatus according to claim 1, wherein
    said plating section and said cleaning section are separated from each other.

16. The substrate processing apparatus according to claim 15, wherein
    said plating unit includes a processing section in addition to said plating section and said cleaning section.

17. The substrate processing apparatus according to claim 15, further comprising:
    a loading/unloading unit for storing the substrate.

18. The substrate processing apparatus according to claim 1, wherein
    said plating unit includes a processing section in addition to said plating section and said cleaning section.

19. The substrate processing apparatus according to claim 18, further comprising:
    a loading/unloading unit for storing the substrate.

20. The substrate processing apparatus according to claim 1, further comprising:
    a loading/unloading unit for storing the substrate.

* * * * *